(12) United States Patent
Yamamoto et al.

(10) Patent No.: US 12,165,999 B2
(45) Date of Patent: Dec. 10, 2024

(54) SEMICONDUCTOR DEVICE AND SEMICONDUCTOR MODULE

(71) Applicant: Nuvoton Technology Corporation Japan, Kyoto (JP)

(72) Inventors: Kouki Yamamoto, Shiga (JP); Shinichi Akiyoshi, Kumamoto (JP); Ryouichi Ajimoto, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/044,746

(22) PCT Filed: Feb. 10, 2022

(86) PCT No.: PCT/JP2022/005414
§ 371 (c)(1),
(2) Date: Mar. 9, 2023

(87) PCT Pub. No.: WO2022/209346
PCT Pub. Date: Oct. 6, 2022

(65) Prior Publication Data
US 2023/0307393 A1    Sep. 28, 2023

Related U.S. Application Data

(60) Provisional application No. 63/167,348, filed on Mar. 29, 2021.

(51) Int. Cl.
*H01L 23/00* (2006.01)
*H01L 25/065* (2023.01)
*H01L 29/78* (2006.01)

(52) U.S. Cl.
CPC ............. *H01L 24/06* (2013.01); *H01L 24/08* (2013.01); *H01L 25/0655* (2013.01);
(Continued)

(58) Field of Classification Search
CPC .............. H01L 27/088; H01L 29/7813; H01L 27/0207; H01L 21/823487; H01L 24/05;
(Continued)

(56) References Cited

U.S. PATENT DOCUMENTS 10,263,296 B2   4/2019   Suzuki et al.
10,340,347 B1   7/2019   Yoshida et al.
(Continued)

FOREIGN PATENT DOCUMENTS

JP    2002-368217 A    12/2002
JP    2004-502293 A     1/2004
(Continued)

OTHER PUBLICATIONS

International Search Report dated Mar. 22, 2022 issued in International Patent Application No. PCT/JP2022/005414, with English translation.
(Continued)

*Primary Examiner* — Samuel A Gebremariam
*Assistant Examiner* — Jonas T Beardsley
(74) *Attorney, Agent, or Firm* — Rimon P.C.

(57) ABSTRACT

A semiconductor device includes: a semiconductor layer; first and second transistors; one or more first source pads and a first gate pad of the first transistor in a first region of the upper surface of the semiconductor layer; and one or more second source pads and a second gate pad of the second transistor in a second region of the upper surface adjacent to the first region in a plan view of the semiconductor layer. In a plan view of the semiconductor layer, a virtual straight line connecting the centers of the first and second gate pads passes through the center of the semiconductor layer and forms a 45 degree angle with each side of the semiconductor layer. An upper surface boundary line between the first and second regions monotonically changes in the directions of
(Continued)

extension of the longer and shorter sides of the semiconductor layer.

22 Claims, 48 Drawing Sheets

(52) U.S. Cl.
CPC .............. *H01L 29/7813* (2013.01); *H01L 2224/06152* (2013.01); *H01L 2224/08225* (2013.01)

(58) Field of Classification Search
CPC ......... H01L 25/0655; H01L 2224/0603; H01L 24/06
See application file for complete search history.

(56) References Cited

U.S. PATENT DOCUMENTS

| | | | |
|---|---|---|---|
| 2001/0045635 A1 | 11/2001 | Kinzer et al. | |
| 2009/0279330 A1* | 11/2009 | Havanur | H01L 24/06 363/56.08 |
| 2014/0125289 A1* | 5/2014 | Tonomura | H01L 27/088 320/134 |
| 2015/0129958 A1 | 5/2015 | Nita et al. | |
| 2017/0194294 A1 | 7/2017 | Yanagida et al. | |
| 2018/0122939 A1 | 5/2018 | Ota et al. | |
| 2019/0229194 A1* | 7/2019 | Yoshida | H01L 24/16 |
| 2019/0296148 A1 | 9/2019 | Tanaka | |
| 2020/0365729 A1 | 11/2020 | Okawa et al. | |

FOREIGN PATENT DOCUMENTS

| | | |
|---|---|---|
| JP | 2019-129308 A | 8/2019 |
| JP | 2019-169492 A | 10/2019 |
| WO | 01/059842 A1 | 8/2001 |
| WO | 2020/129786 A1 | 6/2020 |

OTHER PUBLICATIONS

International Preliminary Report on Patentability Chapter II (IPRP2) dated Sep. 20, 2022 issued in International Patent Application No. PCT/JP2022/005414, with English translation.
Non-final Office Action issued in corresponding U.S. Appl. No. 18/477,224, dated Dec. 7, 2023.

* cited by examiner

FIG. 8

| Pad layout | | Comparative Example 1 | Comparative Example 2 | Comparative Example 3 | Semiconductor device 1 | Result |
|---|---|---|---|---|---|---|
| Wiring lead-out in y-axis direction | | ○ | × | ○ | ○ | Reduced mounting substrate resistance (maximized main current path width) |
| Ease of gate wiring design (when two are mounted in parallel) | Single-sided mounting | ○ | ○ | ○ | ○ | Reduced mounting substrate resistance (optimized substrate wiring) |
| | Double-sided mounting (shared vias) | × | ○ | × | ○ | |
| Wiring lead-out in x-axis direction (narrowing of width of mounting substrate) | | ○ | ○ | × | ○ | Reduced semiconductor device resistance (increased size) |
| Substrate bending strength in x-axis direction | | — | — | — | ○ | Improved handleability (increased bending strength when mounting) |

FIG. 9

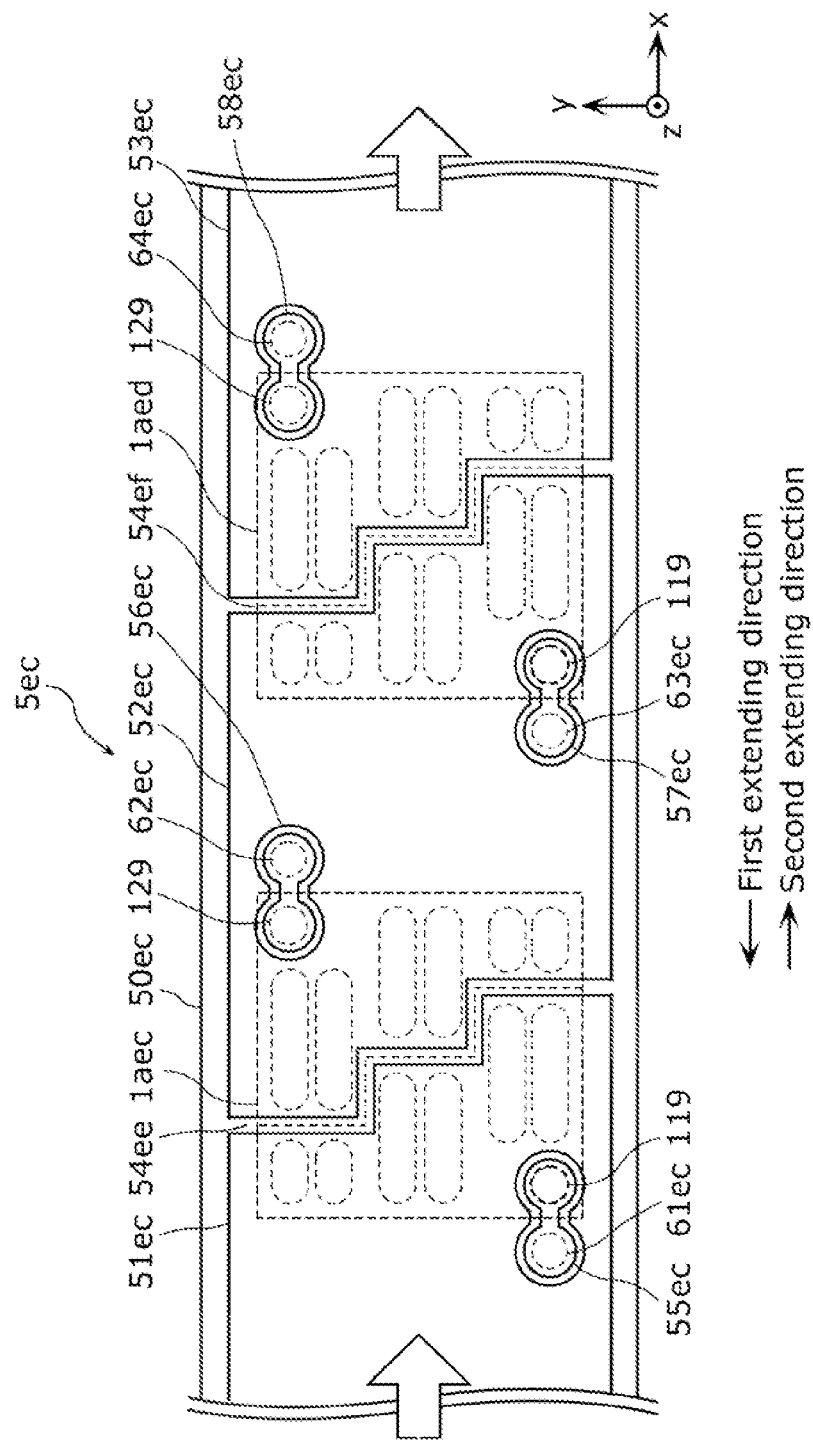

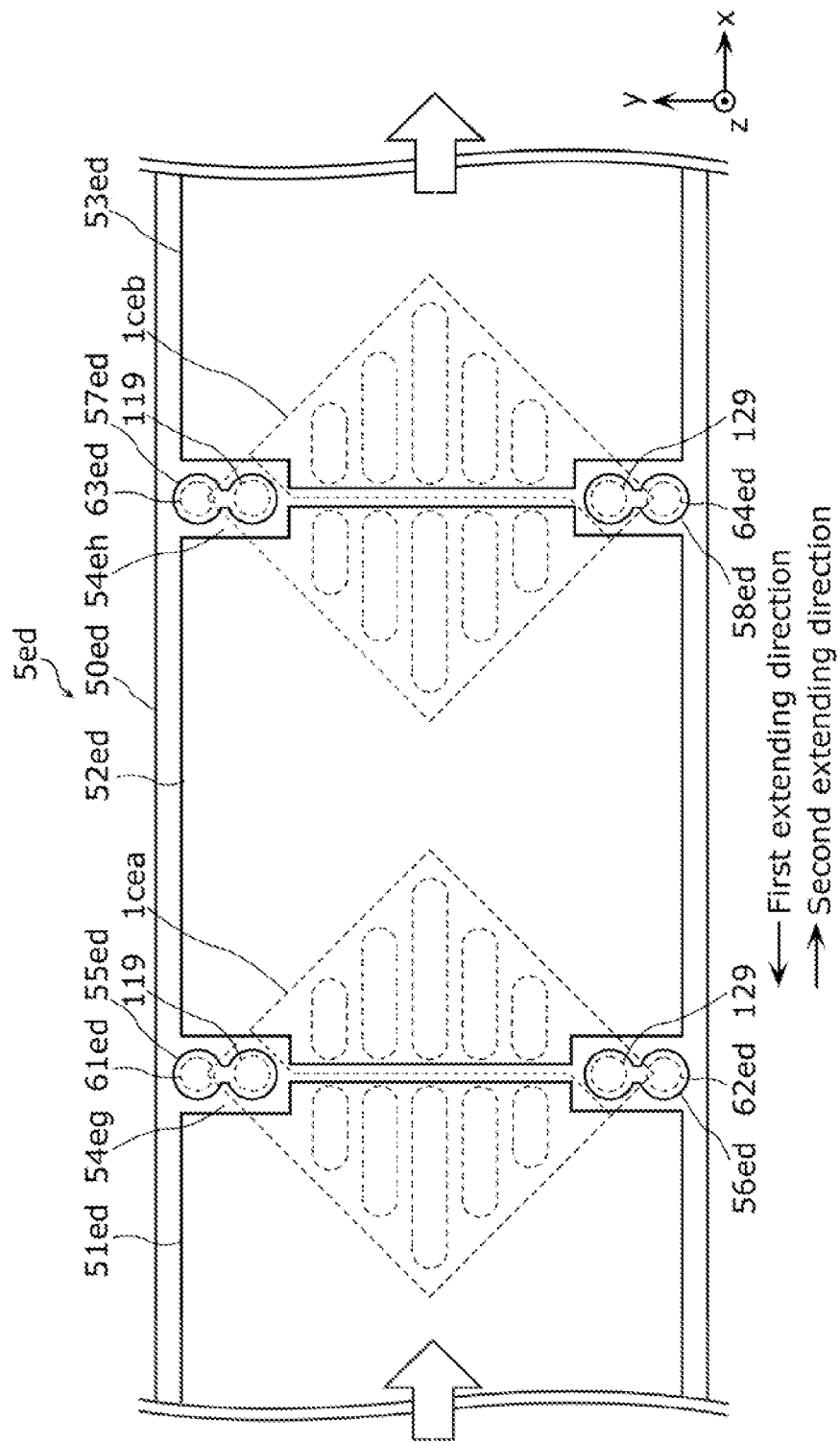

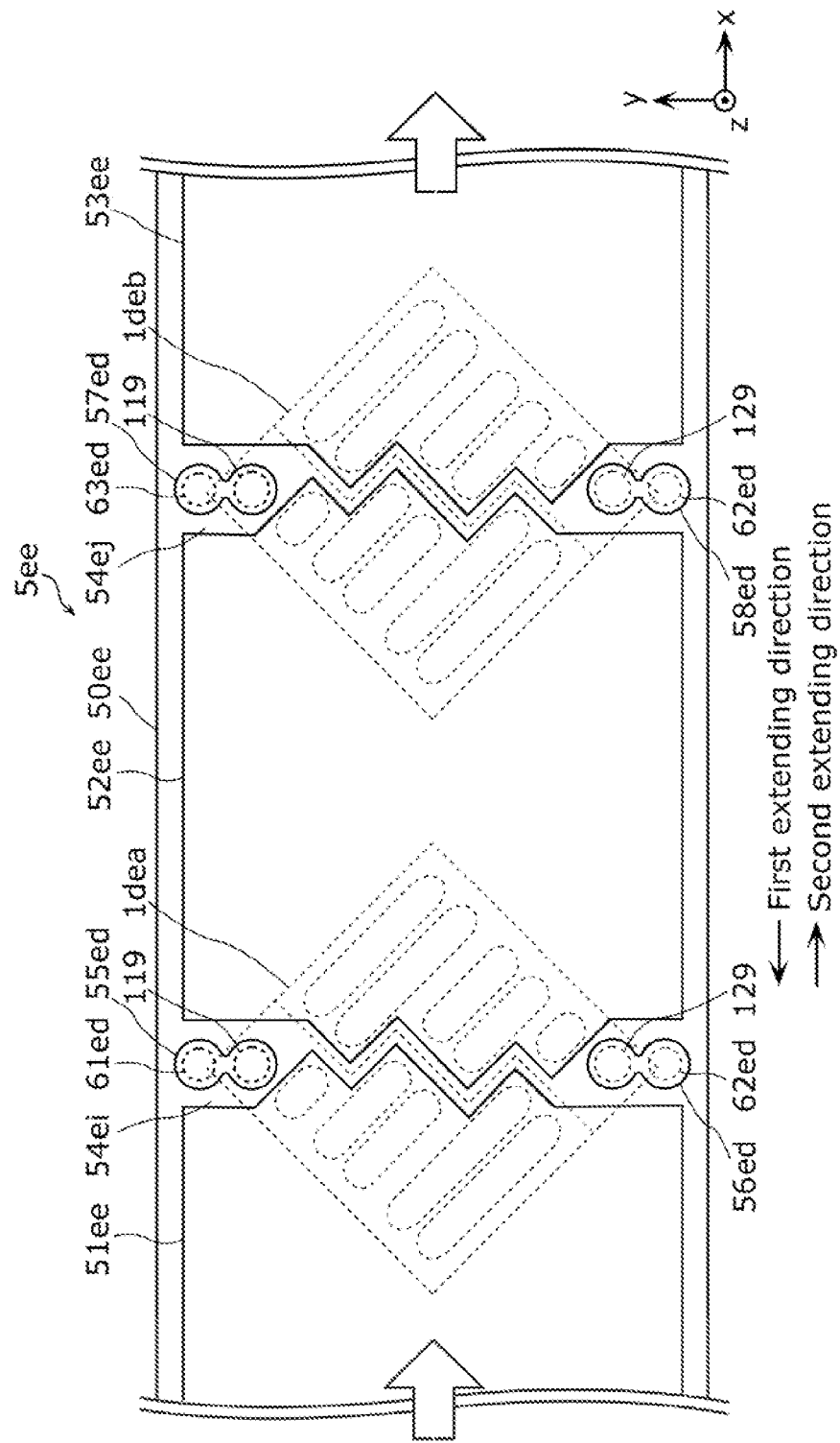

|  | Case 1 | Case 2 |
|---|---|---|
| X [mm] | 3.0 | 4.0 |
| Y [mm] | 3.0 | 4.0 |
| T [mm] | 0.1 | 0.1 |
| $\theta$ [°] | 25.8 | 26.0 |

SEMICONDUCTOR DEVICE AND SEMICONDUCTOR MODULE

CROSS-REFERENCE OF RELATED APPLICATIONS

This application is the U.S. National Phase under 35 U.S.C. § 371 of International Patent Application No. PCT/JP2022/005414, filed on Feb. 10, 2022, which in turn claims the benefit of U.S. Provisional Patent Application No. 63/167,348, filed on Mar. 29, 2021, the entire disclosures of which Applications are incorporated by reference herein.

TECHNICAL FIELD

The present disclosure relates to semiconductor devices and semiconductor modules using the same.

BACKGROUND ART

Conventionally, a semiconductor device that is mounted on a mounting substrate and switches a current path on the mounting substrate between conducting and non-conducting states is known (see, for example, Patent Literature (PTL) 1).

CITATION LIST

Patent Literature

[PTL 1] Japanese Unexamined Patent Application Publication No. 2019-129308

SUMMARY OF INVENTION

Technical Problem

Generally, on a mounting substrate, the current path through which the main current flows is designed to allow the current to flow efficiently (for example, to reduce conduction resistance and/or to effectively dissipate the heat generated by the conduction current). It is therefore desirable for a semiconductor device that is mounted on the mounting substrate and switches the current path through which the main current flows between conducting and non-conducting states to have a feature that allows current to flow efficiently in the current path on the mounting substrate. This is more necessary the higher the main current is.

The present disclosure therefore has an object to provide a semiconductor device having a feature that allows current to flow efficiently in the current path on the mounting substrate on which it is mounted, and a semiconductor module having a feature that allows current to flow efficiently in the current path on the mounting substrate.

Solution to Problem

A semiconductor device according to one aspect of the present disclosure is a semiconductor device of chip-size package type that is face-down mountable, and includes: a semiconductor layer; a metal layer in contact with a rear surface of the semiconductor layer; a first vertical MOS transistor in a first internal region inside the semiconductor layer; a second vertical MOS transistor in a second internal region inside the semiconductor layer, the second internal region being adjacent to the first internal region in a plan view of the semiconductor layer; one or more first source pads and a first gate pad in a first upper surface region of an upper surface of the semiconductor layer, the one or more first source pads being connected to a source electrode of the first vertical MOS transistor, the first gate pad being connected to a gate electrode of the first vertical MOS transistor; and one or more second source pads and a second gate pad in a second upper surface region of the upper surface of the semiconductor layer, the one or more second source pads being connected to a source electrode of the second vertical MOS transistor, the second gate pad being connected to a gate electrode of the second vertical MOS transistor, the second upper surface region being adjacent to the first upper surface region in a plan view of the semiconductor layer. In a plan view of the semiconductor layer, the first internal region and the second internal region divide the semiconductor layer into two equal parts in terms of surface area. In a plan view of the semiconductor layer, the first upper surface region and the second upper surface region divide the semiconductor layer into two equal parts in terms of surface area. The semiconductor layer includes a semiconductor substrate. The semiconductor substrate functions as a common drain region for the first vertical MOS transistor and the second vertical MOS transistor. The semiconductor layer has a rectangular plan view shape. In a plan view of the semiconductor layer: a first virtual straight line connecting a center of the first gate pad and a center of the second gate pad passes through a center of the semiconductor layer and forms a 45 degree angle with each side of the semiconductor layer; a length of an upper surface boundary line is greater than a length of a longer side of the semiconductor layer, the upper surface boundary line being a boundary line between the first upper surface region and the second upper surface region; and the upper surface boundary line monotonically changes in a longer side direction in which the longer side extends and a shorter side direction in which a shorter side of the semiconductor layer extends.

A semiconductor device according to one aspect of the present disclosure is a semiconductor device of chip-size package type that is face-down mountable, and includes: a semiconductor layer; a metal layer in contact with a rear surface of the semiconductor layer; a first vertical MOS transistor in a first internal region inside the semiconductor layer; a second vertical MOS transistor in a second internal region inside the semiconductor layer, the second internal region being adjacent to the first internal region in a plan view of the semiconductor layer; one or more first source pads and a first gate pad in a first upper surface region of an upper surface of the semiconductor layer, the one or more first source pads being connected to a source electrode of the first vertical MOS transistor, the first gate pad being connected to a gate electrode of the first vertical MOS transistor; and one or more second source pads and a second gate pad in a second upper surface region of the upper surface of the semiconductor layer, the one or more second source pads being connected to a source electrode of the second vertical MOS transistor, the second gate pad being connected to a gate electrode of the second vertical MOS transistor, the second upper surface region being adjacent to the first upper surface region in a plan view of the semiconductor layer. In a plan view of the semiconductor layer, the first internal region and the second internal region divide the semiconductor layer into two equal parts in terms of surface area. In a plan view of the semiconductor layer, the first upper surface region and the second upper surface region divide the semiconductor layer into two equal parts in terms of surface area. The semiconductor layer includes a semiconductor substrate. The semiconductor substrate functions as a common drain region for the first vertical MOS transistor and the second vertical MOS transistor. The semiconductor layer has a rectangular plan view shape. In a plan view of the semiconductor layer, an internal boundary line monotonically changes in a longer side direction in which a longer side of the semiconductor layer extends and a shorter side direction in which a shorter side of the semiconductor layer extends, the internal boundary line being a boundary line between the first internal region and the second internal region. The internal boundary line has two terminal ends, a first terminal end and a second terminal end, and an angle between a virtual straight line connecting the first terminal end and the second terminal end and a side of the semiconductor layer at which neither the first terminal end nor the second terminal end terminates is greater than or equal to 16 degrees.

A semiconductor module according to one aspect of the present disclosure includes: a first semiconductor device that is the semiconductor device described above; and a mounting substrate on which the first semiconductor device is face-down mounted. The mounting substrate includes a first via that passes through a first conductor electrically connected to the first gate pad of the first semiconductor device, and a second via that passes through a second conductor electrically connected to the second gate pad of the first semiconductor device.

A semiconductor module according to one aspect of the present disclosure includes: a first semiconductor device that is the semiconductor device described above; a second semiconductor device that is the semiconductor device described above; and a mounting substrate on a first surface of which the first semiconductor device and the second semiconductor device are face-down mounted. In a plan view of the mounting substrate: the mounting substrate is elongated in a lengthwise direction and has a constant width at least at a location where the semiconductor devices are mounted; the second semiconductor device is face-down mounted on the first surface in a position shifted from a position of the first semiconductor device parallel to an extending direction of the lengthwise direction, and in a same orientation as the first semiconductor device; and the mounting substrate includes, on the first surface, first metal wiring, second metal wiring, and third metal wiring aligned in stated order in the extending direction of the lengthwise direction, the first metal wiring bonding all of the one or more first source pads of the first semiconductor device, the second metal wiring bonding all of the one or more second source pads of the first semiconductor device and all of the one or more first source pads of the second semiconductor device, the third metal wiring bonding all of the one or more second source pads of the second semiconductor device.

A semiconductor module according to one aspect of the present disclosure includes: a first semiconductor device that is the semiconductor device described above; a second semiconductor device that is the semiconductor device described above; and a mounting substrate on a first surface of which the first semiconductor device and the second semiconductor device are face-down mounted. In a plan view of the mounting substrate: the second semiconductor device is face-down mounted on the first surface in a position shifted from a position of the first semiconductor device approximately parallel to a direction in which the virtual straight line extends, and in a same orientation as the first semiconductor device; and the mounting substrate is elongated in a lengthwise direction and has a constant width at least at a location where the semiconductor devices are mounted, and includes first metal wiring and second metal wiring aligned in an extending direction of the lengthwise direction on the first surface, the first metal wiring bonding all of the one or more first source pads of the first semiconductor device and all of the one or more first source pads of the second semiconductor device, the second metal wiring bonding all of the one or more second source pads of the first semiconductor device and all of the one or more second source pads of the second semiconductor device.

Advantageous Effects of Invention

The semiconductor device according to one aspect of the present disclosure makes it possible to provide a semiconductor device having a feature that allows current to flow efficiently in the current path on the mounting substrate on which it is mounted. The semiconductor module according to one aspect of the present disclosure makes it possible to provide a semiconductor module having a feature that allows current to flow efficiently in the current path on the mounting substrate.

BRIEF DESCRIPTION OF DRAWINGS

FIG. 8 is a table illustrating comparison results of the semiconductor device according to Embodiment 1 and conventional semiconductor devices according to comparative examples.

FIG. 9 is a table illustrating comparison results of the semiconductor device according to Embodiment 1 and conventional semiconductor devices according to comparative examples.

FIG. 30C is a plan view illustrating one example of the structure of the semiconductor module according to Embodiment 5.

FIG. 30D is a plan view illustrating one example of the structure of the semiconductor module according to Embodiment 5.

FIG. 30E is a plan view illustrating one example of the structure of the semiconductor module according to Embodiment 5.

Figure 1:
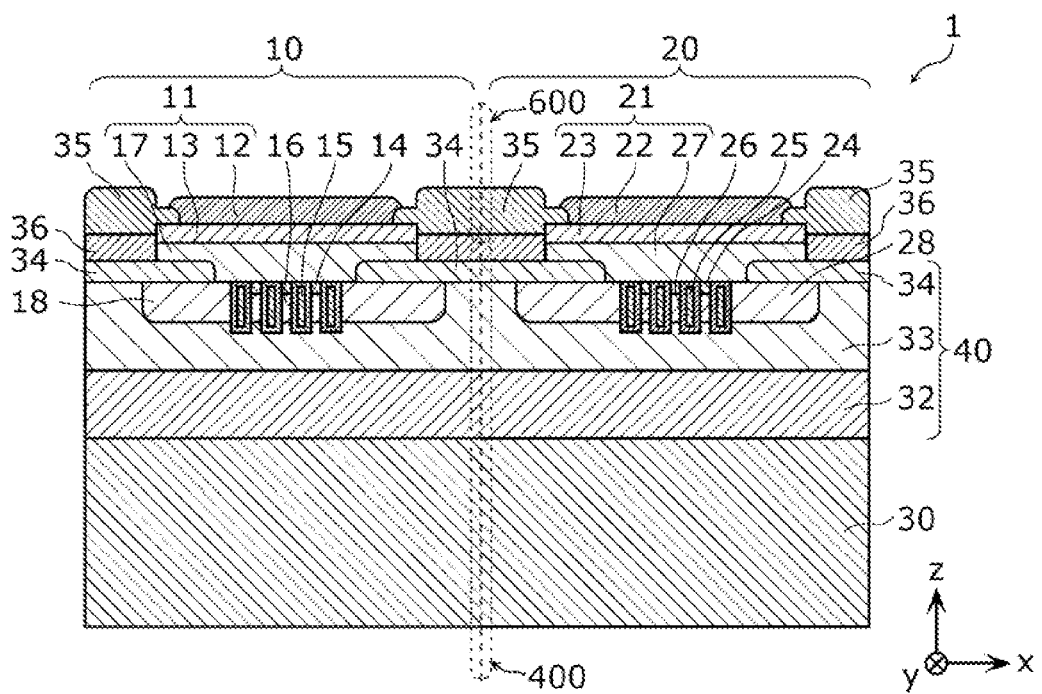
FIG. 1 is a cross-sectional view illustrating one example of the structure of a semiconductor device according to Embodiment 1.

DESCRIPTION OF EMBODIMENTS (Circumstances Leading to One Aspect of the Present Disclosure)

In recent years, for example, in mobile devices such as smartphones, shortening charging time has become a competitive axis, and thus high-current charging of rechargeable batteries is desired.

The inventors have found that in order to realize high-current charging of rechargeable batteries, the semiconductor device that switches the current path of the high current that flows during high-current charging between conducting and non-conducting states must have a feature that allows the current to flow efficiently in the current path, i.e., to inhibit heat generated by the flow of current as much as possible.

Based on this knowledge, the inventors conducted a series of experiments and examinations. As a result, the inventors arrived at the semiconductor device and the like according to the following present disclosure.

A semiconductor device according to one aspect of the present disclosure is a semiconductor device of chip-size package type that is face-down mountable, and includes: a semiconductor layer; a metal layer in contact with a rear surface of the semiconductor layer; a first vertical MOS transistor in a first internal region inside the semiconductor layer; a second vertical MOS transistor in a second internal region inside the semiconductor layer, the second internal region being adjacent to the first internal region in a plan view of the semiconductor layer; one or more first source pads and a first gate pad in a first upper surface region of an upper surface of the semiconductor layer, the one or more first source pads being connected to a source electrode of the first vertical MOS transistor, the first gate pad being connected to a gate electrode of the first vertical MOS transistor; and one or more second source pads and a second gate pad in a second upper surface region of the upper surface of the semiconductor layer, the one or more second source pads being connected to a source electrode of the second vertical MOS transistor, the second gate pad being connected to a gate electrode of the second vertical MOS transistor, the second upper surface region being adjacent to the first upper surface region in a plan view of the semiconductor layer. In a plan view of the semiconductor layer, the first internal region and the second internal region divide the semiconductor layer into two equal parts in terms of surface area. In a plan view of the semiconductor layer, the first upper surface region and the second upper surface region divide the semiconductor layer into two equal parts in terms of surface area. The semiconductor layer includes a semiconductor substrate. The semiconductor substrate functions as a common drain region for the first vertical MOS transistor and the second vertical MOS transistor. The semiconductor layer has a rectangular plan view shape. In a plan view of the semiconductor layer: a first virtual straight line connecting a center of the first gate pad and a center of the second gate pad passes through a center of the semiconductor layer and forms a 45 degree angle with each side of the semiconductor layer; a length of an upper surface boundary line is greater than a length of a longer side of the semiconductor layer, the upper surface boundary line being a boundary line between the first upper surface region and the second upper surface region; and the upper surface boundary line monotonically changes in a longer side direction in which the longer side extends and a shorter side direction in which a shorter side of the semiconductor layer extends.

With semiconductor device configured as described above, when two semiconductor devices of the same type configured as described above are face-down mounted on the mounting substrate, one on the front surface and the other on the rear surface, and are driven on and off at the same time, it is possible to align the position of the first gate pad of one semiconductor device with the position of the first gate pad of the other semiconductor device and align the position of the second gate pad of one semiconductor device with the position of the second gate pad of the other semiconductor device by mounting the two semiconductor devices such that in a plan view of the mounting substrate, the centers of the two semiconductor devices overlap and one semiconductor device is rotated 90 degrees relative to the other semiconductor device around an axis of rotation passing through the centers of semiconductor devices and extending perpendicular to the plane of the mounting substrate.

With this, since, on the mounting substrate on which these two semiconductor devices of the same type are mounted, one on the front surface and the other on the rear surface, common wiring can be used for controlling both the electric potential of the first gate pad of one semiconductor device and the electric potential of the first gate pad of the other semiconductor device and common wiring can be used for controlling both the electric potential of the second gate pad of one semiconductor device and the electric potential of the second gate pad of the other semiconductor device, the wiring (vias) that conventionally had to be provided individually can be reduced. Furthermore, the common wiring (vias) can be drawn out to the edges of the mounting substrate so as not to obstruct the flow of the main current.

This makes it possible to secure a wide current path for the main current on the mounting substrate, and thus design a current path for the main current on the mounting substrate that reduces conduction resistance.

Thus, the semiconductor device configured as described above makes it possible to provide a semiconductor device having a feature that allows simplification of the wiring of the mounting substrate, which tends to be complex, and thus increases the ease of substrate design, and also allows current to flow efficiently in the current path on the mounting substrate on which it is mounted.

The semiconductor layer may have a square plan view shape.

In a plan view of the semiconductor layer, the first gate pad may be arranged such that no part of any of the one or more first source pads is disposed between the first gate pad and a first side of the semiconductor layer or the first gate pad and a second side of the semiconductor layer, the first side and the second side being nearest neighboring sides among four sides of the semiconductor layer, and in a plan view of the semiconductor layer, the second gate pad may be arranged such that no part of any of the one or more second source pads is disposed between the second gate pad and a third side of the semiconductor layer or the second gate pad and a fourth side of the semiconductor layer, the third side and the fourth side being nearest neighboring sides among the four sides of the semiconductor layer.

In a plan view of the semiconductor layer, an angle between the first virtual straight line and a second virtual straight line may be greater than 45 degrees and less than or equal to 90 degrees, the second virtual straight line connecting a first intersection and a second intersection, the first intersection being an intersection of the upper surface boundary line and the first side or the second side, the second intersection being an intersection of the upper surface boundary line and the third side or the fourth side.

The angle may be greater than or equal to 60 degrees and less than or equal to 90 degrees.

In a plan view of the semiconductor layer, an angle between the first virtual straight line and a second virtual straight line may be greater than or equal to 0 degrees and less than 45 degrees, the second virtual straight line connecting a first intersection and a second intersection, the first intersection being an intersection of the upper surface boundary line and the first side or the second side, the second intersection being an intersection of the upper surface boundary line and the third side or the fourth side.

The angle may be greater than or equal to 0 degrees and less than 22 degrees.

In a plan view of the semiconductor layer: when, among four sides of the semiconductor layer, a first side is defined as a side nearest the first gate pad and intersecting the upper surface boundary line, a second side is defined as a side nearest the first gate pad and not intersecting the upper surface boundary line, a third side is defined as a side nearest the second gate pad and intersecting the upper surface boundary line, a fourth side is defined as a side nearest the second gate pad and not intersecting the upper surface boundary line, a first vertex is defined as a vertex of the first side and the fourth side, a second vertex is defined as a vertex of the second side and the third side, a first intersection is defined as an intersection of the upper surface boundary line and the first side, and a second intersection is defined as an intersection of the upper surface boundary line and the third side; a distance between the first vertex and the first intersection may be greater than or equal to 1/N of a length of a side of the semiconductor layer and greater than a maximum diameter of the second gate pad, and a distance between the second vertex and the second intersection may be greater than or equal to 1/N of the length of a side of the semiconductor layer and greater than a maximum diameter of the first gate pad, where N is an integer greater than or equal to three; and the upper surface boundary line may consist of alternately connected N−1 line segments parallel to the second side and N−2 line segments parallel to the first side.

N may be three, four, or five.

The one or more first source pads may comprise a plurality of first source pads, in a plan view of the semiconductor layer, the one or more first source pads may each be a rectangle or an oval whose lengthwise direction is parallel to the first side, and may be arranged in a striped pattern parallel to the first side, the one or more second source pads may comprise a plurality of second source pads, and in a plan view of the semiconductor layer, the one or more second source pads may each be a rectangle or an oval whose lengthwise direction is parallel to the first side, and may be arranged in a striped pattern parallel to the first side.

The one or more first source pads may be composed of one first source pad disposed over approximately an entire surface of the first upper surface region excluding a region of the first gate pad, and the one or more second source pads may be composed of one second source pad disposed over approximately an entire surface of the second upper surface region excluding a region of the second gate pad.

The one or more first source pads may comprise a plurality of first source pads, each of the one or more first source pads may be shaped such that each side opposing another one of the plurality of first source pads is orthogonal or parallel to the upper surface boundary line, the one or more second source pads may comprise a plurality of second source pads, and each of the one or more second source pads may be shaped such that each side opposing another one of the plurality of second source pads is orthogonal or parallel to the upper surface boundary line.

A semiconductor device according to one aspect of the present disclosure is a semiconductor device of chip-size package type that is face-down mountable, and includes: a semiconductor layer; a metal layer in contact with a rear surface of the semiconductor layer; a first vertical MOS transistor in a first internal region inside the semiconductor layer; a second vertical MOS transistor in a second internal region inside the semiconductor layer, the second internal region being adjacent to the first internal region in a plan view of the semiconductor layer; one or more first source pads and a first gate pad in a first upper surface region of an upper surface of the semiconductor layer, the one or more first source pads being connected to a source electrode of the first vertical MOS transistor, the first gate pad being connected to a gate electrode of the first vertical MOS transistor; and one or more second source pads and a second gate pad in a second upper surface region of the upper surface of the semiconductor layer, the one or more second source pads being connected to a source electrode of the second vertical MOS transistor, the second gate pad being connected to a gate electrode of the second vertical MOS transistor, the second upper surface region being adjacent to the first upper surface region in a plan view of the semiconductor layer. In a plan view of the semiconductor layer, the first internal region and the second internal region divide the semiconductor layer into two equal parts in terms of surface area. In a plan view of the semiconductor layer, the first upper surface region and the second upper surface region divide the semiconductor layer into two equal parts in terms of surface area. The semiconductor layer includes a semiconductor substrate. The semiconductor substrate functions as a common drain region for the first vertical MOS transistor and the second vertical MOS transistor. The semiconductor layer has a rectangular plan view shape. In a plan view of the semiconductor layer, an internal boundary line monotonically changes in a longer side direction in which a longer side of the semiconductor layer extends and a shorter side direction in which a shorter side of the semiconductor layer extends, the internal boundary line being a boundary line between the first internal region and the second internal region. The internal boundary line has two terminal ends, a first terminal end and a second terminal end, and an angle between a virtual straight line connecting the first terminal end and the second terminal end and a side of the semiconductor layer at which neither the first terminal end nor the second terminal end terminates is greater than or equal to 16 degrees.

According to the semiconductor device configured as described above, the length of the internal boundary line in a plan view of the semiconductor layer is longer than the internal boundary line of a conventional semiconductor device which extends in a straight line orthogonal or parallel to the longer side direction of the semiconductor layer. Therefore, the current-carrying cross-sectional area of the current that flows horizontally through the metal layer is larger when the current flows from the first source pad to the second source pad or from the second source pad to the first source pad.

With this, when the current flows from the first source pad to the second source pad or from the second source pad to the first source pad, the resistance value of the semiconductor device can be reduced more than conventional techniques.

Thus, the semiconductor device configured as described above makes it possible to provide a semiconductor device having a feature that allows current to flow efficiently in the current path on the mounting substrate on which it is mounted.

In a plan view of the semiconductor layer: the first terminal end of the internal boundary line may terminate at a first longer side among two longer sides of the semiconductor layer; and the second terminal end of the internal boundary line may terminate at a second longer side among the two longer sides of the semiconductor layer.

The angle may be greater than or equal to 26 degrees.

In a plan view of the semiconductor layer: the first terminal end of the internal boundary line may terminate at a first shorter side among two shorter sides of the semiconductor layer; and the second terminal end of the internal boundary line may terminate at a second shorter side among the two shorter sides of the semiconductor layer.

The angle may be greater than or equal to 26 degrees.

In a plan view of the semiconductor layer: the semiconductor layer may have a square shape; a distance between the first terminal end of the internal boundary line and a first vertex may be greater than or equal to 1/N of a length of a side of the semiconductor layer, and a distance between the second terminal end of the internal boundary line and a second vertex may be greater than or equal to 1/N of the length of a side of the semiconductor layer, where N is an integer greater than or equal to three, the first vertex being a vertex of the semiconductor layer that is nearest the first terminal end, the second vertex being a vertex of the semiconductor layer that is nearest the second terminal end; and the internal boundary line may consist of alternately connected N−1 line segments orthogonal to a side of the semiconductor layer at which the first terminal end terminates and N−2 line segments parallel to the side of the semiconductor layer at which the first terminal end terminates.

In a plan view of the semiconductor layer, an upper surface boundary line and the internal boundary line may coincide, the upper surface boundary line being a boundary line between the first upper surface region and the second upper surface region.

A semiconductor module according to one aspect of the present disclosure includes: a first semiconductor device that is the semiconductor device described above; and a mounting substrate on which the first semiconductor device is face-down mounted. The mounting substrate includes a first via that passes through a first conductor electrically connected to the first gate pad of the first semiconductor device, and a second via that passes through a second conductor electrically connected to the second gate pad of the first semiconductor device.

According to the semiconductor module configured as described above, the wiring on the mounting substrate that controls the electric potential of the first gate pad and the wiring on the mounting substrate that controls the electric potential of the second gate pad can be disposed in an area other than the surface on which the semiconductor device is face-down mounted. In particular, this wiring can be disposed closer to the edges of the mounting substrate.

This makes it possible to secure a wider than conventional current path for the main current on the mounting substrate, and thus design a current path for the main current on the mounting substrate that reduces conduction resistance.

Thus, the semiconductor module configured as described above makes it possible to provide a semiconductor module having a feature that allows current to flow efficiently in the current path on the mounting substrate.

In a plan view of the mounting substrate, a center of the first via and a center of the second via may be located on the first virtual straight line of the first semiconductor device.

The first semiconductor device may be the semiconductor device described above, and in a plan view of the mounting substrate: a center of the first via may be positioned at any of the following: (1) on the first virtual straight line; (2) outside the first semiconductor device beyond the second side in a direction in which the first side extends and between the first side and a center of the first gate pad, in a direction in which the second side extends; and (3) outside the first semiconductor device beyond the first side in the direction in which the second side extends and between the second side and the center of the first gate pad, in the direction in which the first side extends; and a center of the second via may be positioned at any of the following: (1) on the first virtual straight line; (2) outside the first semiconductor device beyond the fourth side in a direction in which the third side extends and between the third side and a center of the second gate pad, in a direction in which the fourth side extends; and (3) outside the first semiconductor device beyond the third side in the direction in which the fourth side extends and between the fourth side and the center of the second gate pad, in the direction in which the third side extends.

The first semiconductor device may be the semiconductor device described above, and in a plan view of the mounting substrate: the mounting substrate may be elongated in a lengthwise direction and have a constant width at least at a location where the semiconductor device is mounted, and may include first metal wiring and second metal wiring aligned in an extending direction of the lengthwise direction on a first surface of the mounting substrate, the first metal wiring bonding all of the one or more first source pads of the first semiconductor device, the second metal wiring bonding all of the one or more second source pads of the first semiconductor device; and the first semiconductor device may be mounted on the first surface in an orientation in which an angle between the second virtual straight line and the extending direction of the lengthwise direction is greater than or equal to 15 degrees and less than or equal to 75 degrees.

The semiconductor module may further include a second semiconductor device that is the semiconductor device described above. In a plan view of the mounting substrate: the first semiconductor device may be face-down mounted on the first surface in an orientation in which the first gate pad of the first semiconductor device is positioned on a first extending direction side among extending directions of the lengthwise direction; the second semiconductor device may be face-down mounted on the first surface in a position shifted from a position of the first semiconductor device parallel to a second extending direction among extending directions of the lengthwise direction, and in an orientation in which the second virtual straight line of the first semiconductor device and the second virtual straight line of the second semiconductor device are parallel and the first gate pad of the second semiconductor device is positioned on the first extending direction side, the second extending direction being opposite the first extending direction; the mounting substrate may further include third metal wiring aligned in the second extending direction relative to the second metal wiring on the first surface, the third metal wiring bonding all of the one or more second source pads of the second semiconductor device; and the second metal wiring may further bond all of the one or more first source pads of the second semiconductor device.

The semiconductor module may further include a second semiconductor device that is the semiconductor device described above. In a plan view of the mounting substrate: the first semiconductor device may be face-down mounted on the first surface in an orientation in which the first gate pad of the first semiconductor device is positioned on a first extending direction side among extending directions of the lengthwise direction; the second semiconductor device may be face-down mounted on the first surface in a position shifted from a position of the first semiconductor device parallel to a direction orthogonal to an extending direction of the lengthwise direction, and in an orientation in which the second virtual straight line of the first semiconductor device and the second virtual straight line of the second semiconductor device are at a right angle and the first gate pad of the second semiconductor device is positioned on the first extending direction side; the first metal wiring may further bond all of the one or more first source pads of the second semiconductor device; the second metal wiring may further bond all of the one or more second source pads of the second semiconductor device; and the second gate pad of the second semiconductor device may be electrically connected to the second conductor.

The semiconductor module may further include a second semiconductor device that is the semiconductor device described above. In a plan view of the mounting substrate: the first semiconductor device may be face-down mounted on the first surface in an orientation in which the first gate pad of the first semiconductor device is positioned on a first extending direction side among extending directions of the lengthwise direction; the second semiconductor device may be face-down mounted on the first surface in a position shifted from a position of the first semiconductor device approximately parallel to a direction in which the second virtual straight line of the first semiconductor device extends, and in an orientation in which the second virtual straight line of the first semiconductor device and the second virtual straight line of the second semiconductor device are coincident or parallel and the first gate pad of the second semiconductor device is positioned on the first extending direction side; the first metal wiring may further bond all of the one or more first source pads of the second semiconductor device; and the second metal wiring may further bond all of the one or more second source pads of the second semiconductor device.

The semiconductor module may further include a second semiconductor device that is the semiconductor device described above. In a plan view of the mounting substrate: the first semiconductor device may be face-down mounted on the first surface in an orientation in which the first gate pad of the first semiconductor device is positioned on a first extending direction side among extending directions of the lengthwise direction; the second semiconductor device may be face-down mounted on a second surface of the mounting substrate opposite the first surface in an orientation in which in a plan view of the semiconductor substrate, the first gate pad of the second semiconductor device is positioned on the first extending direction side, at a position at which the first upper surface region of the first semiconductor device and the first upper surface region of the second semiconductor device overlap more than 50% and the second upper surface region of the first semiconductor device and the second upper surface region of the second semiconductor device overlap more than 50%; the first gate pad of the second semiconductor device may be electrically connected to the first conductor; and the second gate pad of the second semiconductor device may be electrically connected to the second conductor.

The first semiconductor device may be the semiconductor device described above, and in a plan view of the mounting substrate: the mounting substrate may be elongated in a lengthwise direction and have a constant width at least at a location where the semiconductor device is mounted, and may include first metal wiring and second metal wiring aligned in an extending direction of the lengthwise direction on a first surface of the mounting substrate, the first metal wiring bonding all of the one or more first source pads of the first semiconductor device, the second metal wiring bonding all of the one or more second source pads of the first semiconductor device; and the first semiconductor device may be face-down mounted on the mounting substrate in an orientation in which an angle between each side of the first semiconductor device and an extending direction of the lengthwise direction is 45 degrees.

The semiconductor module may further include a second semiconductor device that is the semiconductor device described above. In a plan view of the mounting substrate: the first semiconductor device may be face-down mounted on the first surface in an orientation in which the first gate pad of the first semiconductor device is positioned on a first extending direction side among extending directions of the lengthwise direction; the second semiconductor device may be face-down mounted on the first surface in a position shifted from a position of the first semiconductor device parallel to a direction orthogonal to an extending direction of the lengthwise direction, and in an orientation in which the second virtual straight line of the first semiconductor device and the second virtual straight line of the second semiconductor device are parallel; the first metal wiring may further bond all of the one or more first source pads of the second semiconductor device; the second metal wiring may further bond all of the one or more second source pads of the second semiconductor device; the semiconductor substrate may further include a third via that passes through a third conductor electrically connected to the first gate pad of the second semiconductor device, and a fourth via that passes through a fourth conductor electrically connected to the second gate pad of the second semiconductor device; and the first via, the second via, the third via, and the fourth via may be positioned between the first metal wiring and the second metal wiring in an extending direction of the lengthwise direction of the mounting substrate.

A semiconductor module according to one aspect of the present disclosure includes: a first semiconductor device that is the semiconductor device described above; a second semiconductor device that is the semiconductor device described above; and a mounting substrate on a first surface of which the first semiconductor device and the second semiconductor device are face-down mounted. In a plan view of the mounting substrate: the mounting substrate is elongated in a lengthwise direction and has a constant width at least at a location where the semiconductor devices are mounted; the second semiconductor device is face-down mounted on the first surface in a position shifted from a position of the first semiconductor device parallel to an extending direction of the lengthwise direction, and in a same orientation as the first semiconductor device; and the mounting substrate includes, on the first surface, first metal wiring, second metal wiring, and third metal wiring aligned in stated order in the extending direction of the lengthwise direction, the first metal wiring bonding all of the one or more first source pads of the first semiconductor device, the second metal wiring bonding all of the one or more second source pads of the first semiconductor device and all of the one or more first source pads of the second semiconductor device, the third metal wiring bonding all of the one or more second source pads of the second semiconductor device.

According to the semiconductor module configured as described above, the current path of the current that flows from the first metal wiring through the second metal wiring to the third metal wiring can be made linear.

This makes it possible to design a current path for the main current on the mounting substrate that reduces conduction resistance.

Thus, the semiconductor module configured as described above makes it possible to provide a semiconductor module having a feature that allows current to flow efficiently in the current path on the mounting substrate.

A semiconductor module according to one aspect of the present disclosure includes: a first semiconductor device that is the semiconductor device described above; a second semiconductor device that is the semiconductor device described above; and a mounting substrate on a first surface of which the first semiconductor device and the second semiconductor device are face-down mounted. In a plan view of the mounting substrate: the second semiconductor device is face-down mounted on the first surface in a position shifted from a position of the first semiconductor device approximately parallel to a direction in which the virtual straight line extends, and in a same orientation as the first semiconductor device; and the mounting substrate is elongated in a lengthwise direction and has a constant width at least at a location where the semiconductor devices are mounted, and includes first metal wiring and second metal wiring aligned in an extending direction of the lengthwise direction on the first surface, the first metal wiring bonding all of the one or more first source pads of the first semiconductor device and all of the one or more first source pads of the second semiconductor device, the second metal wiring bonding all of the one or more second source pads of the first semiconductor device and all of the one or more second source pads of the second semiconductor device.

According to the semiconductor module configured as described above, the first semiconductor device and the second semiconductor device are disposed in an inclined positional relationship with respect to each side of the first semiconductor device and each side of the second semiconductor device.

This reduces the effect of the heat generated by the first semiconductor device on the second semiconductor device and the effect of the heat generated by the second semiconductor device on the first semiconductor device.

The heat generated by the conduction current is thus dissipated effectively.

Thus, the semiconductor module configured as described above makes it possible to provide a semiconductor module having a feature that allows current to flow efficiently in the current path on the mounting substrate.

Hereinafter, a specific example of the semiconductor device according to one aspect of the present disclosure will be described with reference to the drawings. Each of the following embodiments shows a specific example of the present disclosure. The numerical values, shapes, elements, the arrangement and connection of the elements, the steps, and the order of the steps, etc., indicated in the following embodiments are mere examples, and therefore do not intend to limit the present disclosure. The figures are schematic diagrams and are not necessarily precise illustrations. Elements that are essentially the same share like reference signs in the figures, and duplicate description is omitted or simplified.

Embodiment 1

[1-1. Semiconductor Device Structure]

Hereinafter, the structure of the semiconductor device according to Embodiment 1 will be described. The semiconductor device according to Embodiment 1 is a face-down mountable chip-size package (CSP) semiconductor device in which two vertical metal oxide semiconductor (MOS) transistors are formed. These two vertical MOS transistors are power transistors, i.e., trench metal oxide semiconductor field effect transistors (MOSFETs).

Figure 2:
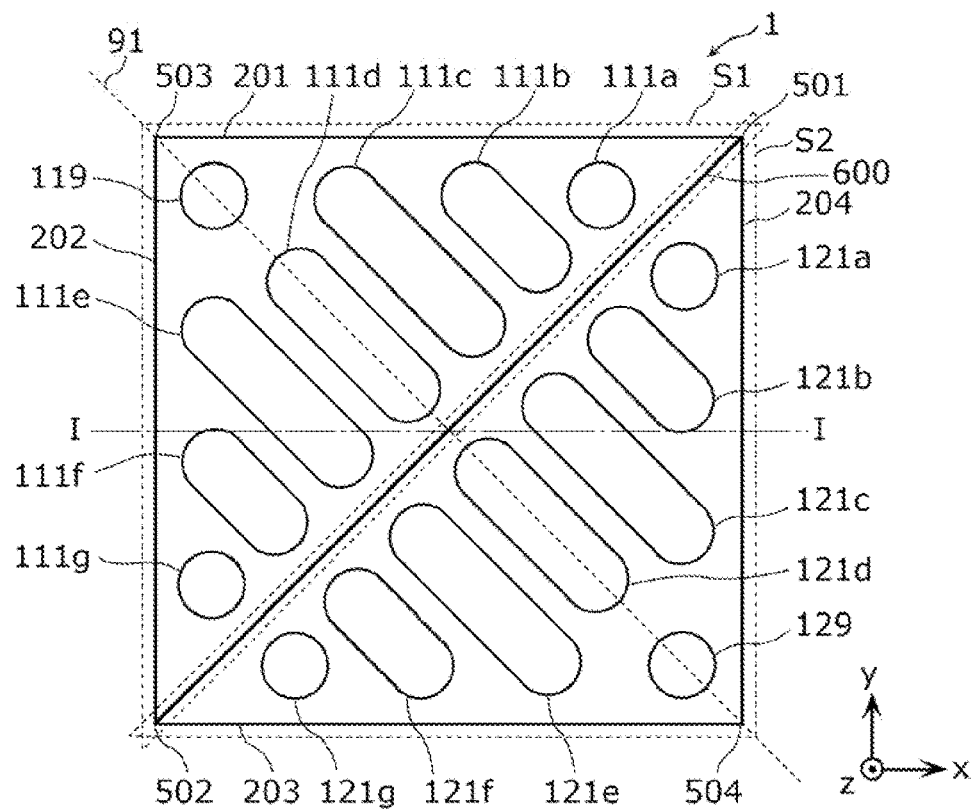
FIG. 2 is a plan view illustrating one example of the structure of the semiconductor device according to Embodiment 1.
Figure 3:
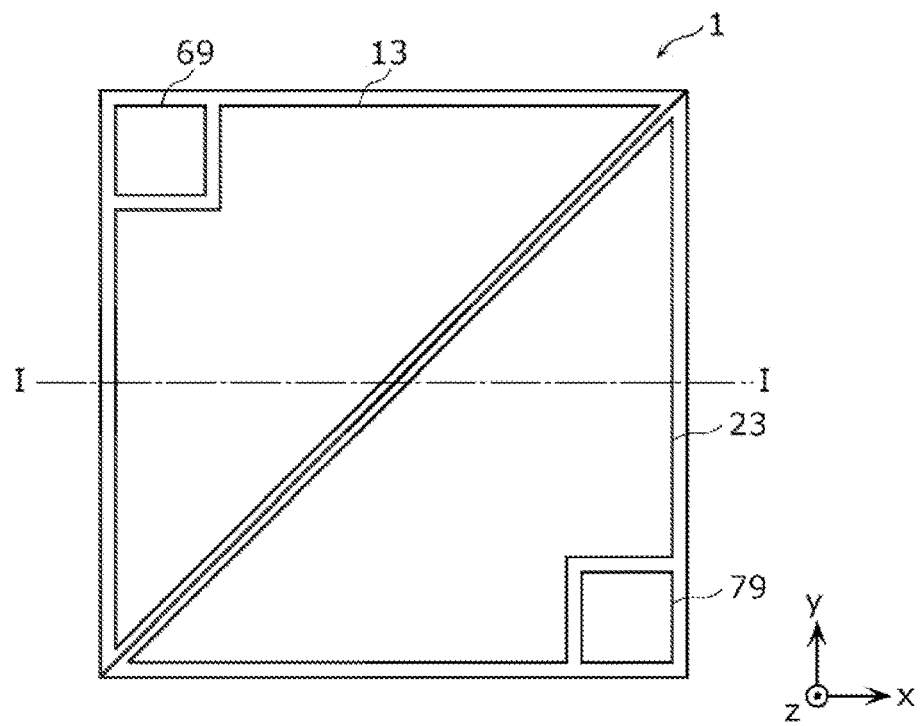
FIG. 3 is a plan view illustrating one example of the structure of the semiconductor device according to Embodiment 1.
Figure 4:
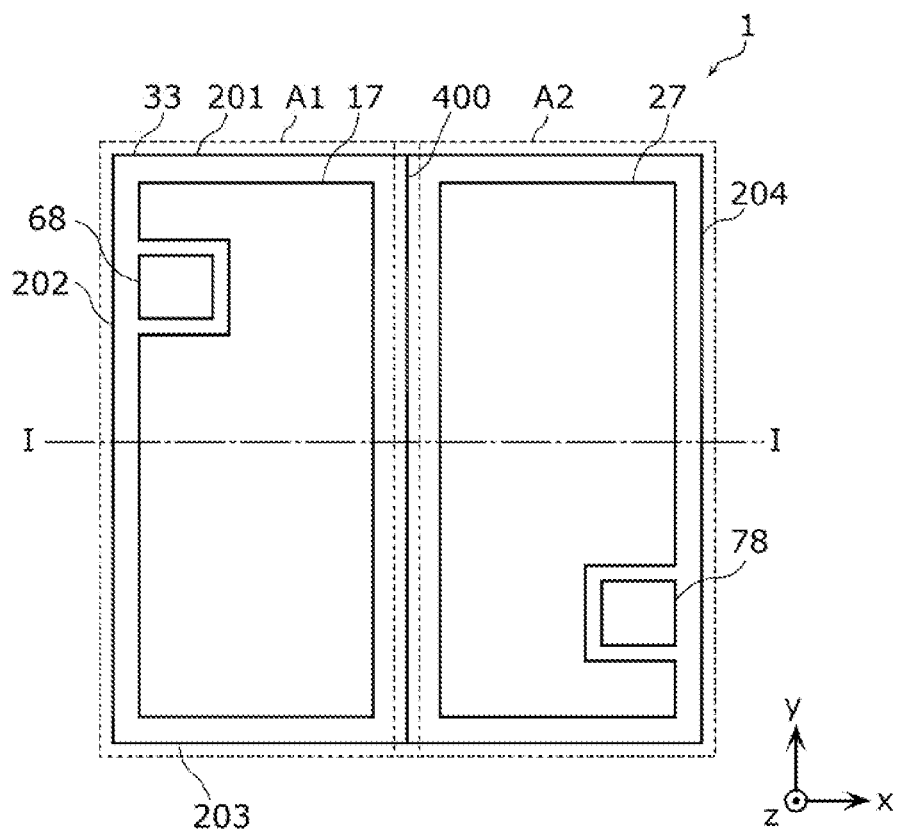
FIG. 4 is a plan view illustrating one example of the structure of the semiconductor device according to Embodiment 1.

FIG. 1 is a cross-sectional view illustrating one example of the structure of semiconductor device 1 according to Embodiment 1. FIG. 2 is a plan view illustrating one example of the structure of semiconductor device 1. FIG. 1 illustrates a cross section taken at line I-I illustrated in FIG. 2, FIG. 3, and FIG. 4. FIG. 3 is a plan view illustrating one example of the structure of semiconductor device 1. In FIG. 3, illustration of the structures between the upper surface of semiconductor device 1 and portions 13 and 23 (to be described later) is omitted so as to expose portions 13 and 23 for illustrative purposes. FIG. 4 is a plan view illustrating one example of the structure of semiconductor device 1. In FIG. 4, illustration of the structures between the upper surface of semiconductor device 1 and portions 17, 68, 27, and 78 (to be described later) is omitted so as to expose portions 17, 68, 27, and 78 for illustrative purposes.

As illustrated in FIG. 1 and FIG. 4, semiconductor device 1 includes semiconductor layer 40, metal layer 30, protective layer 35, first vertical MOS transistor 10 (hereinafter also referred to as transistor 10) formed in first internal region A1 inside semiconductor layer 40, and second vertical MOS transistor 20 (hereinafter also referred to as transistor 20) formed in second internal region A2 inside semiconductor layer 40.

As illustrated in FIG. 4, first internal region A1 and second internal region A2 are adjacent to each other in a plan view of semiconductor layer 40 and divide semiconductor layer 40 into two equal parts in terms of surface area. In the present specification, in the region inside the semiconductor layer, first internal region A1 is defined by the boundaries of the components of first vertical MOS transistor 10, and second internal region A2 is defined by the boundaries of the components of second vertical MOS transistor 20.

As illustrated in FIG. 1 through FIG. 4, semiconductor device 1 and semiconductor layer 40 are rectangular in a plan view of semiconductor layer 40.

Hereinafter, semiconductor device 1 and semiconductor layer 40 are described as square in a plan view of semiconductor layer 40. However, as described below, semiconductor device 1 and semiconductor layer 40 need only be rectangular and need not necessarily be limited to being square.

Hereinafter, internal boundary line 400, which is the boundary line between first internal region A1 and second internal region A2 in a plan view of semiconductor layer 40, is described as a line segment connecting the midpoint of first side 201 of semiconductor layer 40 and the midpoint of third side 203 of semiconductor layer 40 opposing first side 201. Stated differently, first internal region A1 and second internal region A2 are described as dividing semiconductor layer 40 into two equal parts in terms of surface area along a straight line connecting the midpoint of first side 201 and the midpoint of third side 203. However, first internal region A1 and second internal region A2 need only be adjacent to each other in a plan view of semiconductor layer 40 and divide semiconductor layer 40 into two equal parts in terms of surface area, and need not necessarily be limited to dividing semiconductor layer 40 into two equal parts in terms of surface area along a straight line connecting the midpoint of first side 201 and the midpoint of third side 203. Internal boundary line 400 may coincide with upper surface boundary line 600 (to be described later) in a plan view of semiconductor layer 40.

Semiconductor layer 40 is formed by stacking semiconductor substrate 32, low-concentration impurity layer 33, and oxide film 34.

Semiconductor substrate 32 is disposed on the lower surface side of semiconductor layer 40 and comprises silicon containing impurities of a first conductivity type.

Low-concentration impurity layer 33 is disposed on the upper surface side of semiconductor layer 40, is formed in contact with semiconductor substrate 32, and contains impurities of the first conductivity type at a concentration lower than the concentration of impurities of the first conductivity type in semiconductor substrate 32. For example, low-concentration impurity layer 33 may be formed on semiconductor substrate 32 via epitaxial growth.

Oxide film 34 is disposed on the upper surface of semiconductor layer 40 and is formed in contact with low-concentration impurity layer 33.

Insulating film 36 insulates portion 17 of first source electrode 11 (to be described later) and portion 23 of second source electrode 21 (to be described later) from each other, and insulates portion 27 of second source electrode 21 and portion 13 of first source electrode 11 from each other. In a plan view of semiconductor layer 40, insulating film 36 is formed in the entire region where portion 17 of first source electrode 11 and portion 23 of second source electrode 21 overlap each other and in the entire region where portion 27 of second source electrode 21 and portion 13 of first source electrode 11 overlap each other, sandwiched between portions 17 and 23 and between portions 27 and 13. Note that since the cross-sectional view illustrated in FIG. 1 is taken at a location where portions 17 and 23 do not overlap in a plan view of semiconductor layer 40, insulating film 36 is not illustrated as being sandwiched between portions 17 and 23 and between portions 27 and 13.

Protective layer 35 is formed on the upper surface of semiconductor layer 40 and covers at least part of the upper surface of semiconductor layer 40.

Metal layer 30 is formed in contact with the lower surface of semiconductor substrate 32 and comprises silver, copper, nickel, or an alloy thereof. Metal layer 30 may contain trace amounts of non-metallic elements introduced as impurities in the manufacturing process of metal material. Metal layer 30 may be formed, for example, in contact with the entire lower surface of semiconductor substrate 32.

As illustrated in FIG. 1 and FIG. 2, semiconductor device 1 includes, in first upper surface region S1 of the upper surface of semiconductor layer 40, one or more (seven in this example) first source pads 111 (first source pads 111a, 111b, 111c, 111d, 111e, 111f, and 111g in this example), and first gate pad 119, which are bonded to the mounting substrate via a bonding material during the face-down mounting. Semiconductor device 1 also includes, in second upper surface region S2 of the upper surface of semiconductor layer 40, one or more (seven in this example) second source pads 121 (second source pads 121a, 121b, 121c, 121d, 121e, 121f, and 121g in this example), and second gate pad 129, which are bonded to the mounting substrate via a bonding material during the face-down mounting.

Each first source pad 111 and each second source pad 121 is rectangular, oval, or circular in a plan view of semiconductor layer 40. First gate pad 119 and second gate pad 129 are circular in a plan view of semiconductor layer 40. Note that in the present specification, shapes of the ends of the rectangle and oval are not limited to angled (corresponding to rectangular) or semicircular (corresponding to oval), and may also be polygonal.

As illustrated in FIG. 2, first upper surface region S1 and second upper surface region S2 are adjacent to each other in a plan view of semiconductor layer 40 and divide semiconductor layer 40 into two equal parts in terms of surface area. In the present specification, in the upper surface region, first upper surface region S1 is defined by the boundaries of the components of first vertical MOS transistor 10, and second upper surface region S2 is defined by the boundaries of the components of second vertical MOS transistor 20.

As illustrated in FIG. 2, in a plan view of semiconductor layer 40, upper surface boundary line 600, which is the boundary line between first upper surface region S1 and second upper surface region S2, is a line segment connecting first vertex 501, which is the vertex of first side 201 and fourth side 204 of semiconductor layer 40, and second vertex 502, which is the vertex of second side 202 and third side 203 of semiconductor layer 40. In other words, in a plan view of semiconductor layer 40, first upper surface region S1 and second upper surface region S2 divide semiconductor layer 40 into two equal parts in terms of surface area along the line segment connecting first vertex 501 and second vertex 502. Internal boundary line 400 and upper surface boundary line 600 may or may not coincide in a plan view of semiconductor layer 40.

As illustrated in FIG. 2, in a plan view of semiconductor layer 40, first gate pad 119 and second gate pad 129 are positioned such that first virtual straight line 91 connecting the center of first gate pad 119 and the center of second gate pad 129 passes through the center of semiconductor layer 40 and forms a 45 degree angle with each side of semiconductor layer 40. Moreover, as illustrated in FIG. 2, in a plan view of semiconductor layer 40, first gate pad 119 is arranged such that no part of any first source pad 111 is disposed between first gate pad 119 and first side 201 or first gate pad 119 and second side 202, and second gate pad 129 is arranged such that no part of any second source pad 121 is disposed between second gate pad 129 and third side 203 or second gate pad 129 and fourth side 204.

In the present specification, the term "angle" refers to the smaller of the angles (including 90 degrees) formed by two straight lines.

Here, the center of a gate pad in a plan view of the semiconductor layer refers to the center of gravity in the shape of the gate pad in a plan view of the semiconductor layer. For example, if the gate pad is circular, the center of the gate pad is the center of the circle. For example, if the gate pad is rectangular, the center of the gate pad is the intersection of the two diagonals of the rectangle. For example, if the gate pad is oval, the center of the gate pad is the intersection of two line segments bisecting the oval lengthwise and widthwise.

Here, the center of the semiconductor layer in a plan view of the semiconductor layer refers to the center of gravity in the shape of the semiconductor layer in a plan view of the semiconductor layer. For example, if the semiconductor layer is rectangular, the center of the semiconductor layer is the intersection of the two diagonals of the rectangle.

Since semiconductor device 1 and semiconductor layer 40 are described here as being square in a plan view of semiconductor layer 40, first virtual straight line 91 is a straight line connecting third vertex 503 and fourth vertex 504 in a plan view of semiconductor layer 40, as illustrated in FIG. 2.

Note that the number of the one or more first source pads 111 and the number of the one or more second source pads 121 are not necessarily limited to seven as illustrated in FIG. 2, and may be a number greater than or equal to one, other than seven.

As illustrated in FIG. 1 through FIG. 4, first body region 18 containing impurities of a second conductivity type different from the first conductivity type is formed in first internal region A1 of low-concentration impurity layer 33. First source region 14 containing impurities of the first conductivity type, first gate conductor 15, and first gate insulating film 16 are formed in first body region 18.

First source electrode 11 includes portion 17 formed partly in a region within semiconductor layer 40, and portions 12 and 13 formed in an upper surface region above semiconductor layer 40. Portion 12 is connected to first source region 14 and first body region 18 via portions 13 and 17.

Portion 12 of first source electrode 11 is a layer that is bonded to solder during reflow in the face-down mounting process. In one non-limiting example, portion 12 may comprise a metal material including one or more of nickel, titanium, tungsten, and palladium. The upper surface of portion 12 may be plated with, for example, gold.

Portion 13 of first source electrode 11 is a layer connecting portions 12 and 17. In one non-limiting example, portion 13 may comprise a metal material including one or more of aluminum, copper, gold, and silver.

Portion 17 of first source electrode 11 is a layer connecting portion 13 and semiconductor layer 40. In one non-limiting example, portion 17 may comprise a metal material including one or more of aluminum, copper, gold, and silver.

The first gate electrode includes portion 68 formed partly in semiconductor layer 40, and portions A (not illustrated in the drawings) and 69 formed in the upper surface region. Portion A is connected to first gate conductor 15 via portions 69 and 68.

Portion A of the first gate electrode is a layer that is bonded to solder during reflow in the face-down mounting process. In one non-limiting example, portion A may comprise a metal material including one or more of nickel, titanium, tungsten, and palladium. The upper surface of portion A may be plated with, for example, gold.

Portion 69 of the first gate electrode is a layer connecting portions A and 68. In one non-limiting example, portion 69 may comprise a metal material including one or more of aluminum, copper, gold, and silver.

Portion 68 of the first gate electrode is a layer connecting portion 69 and first gate conductor 15. In one non-limiting example, portion 68 may comprise a metal material including one or more of aluminum, copper, gold, and silver, and may be polysilicon.

Second body region 28 containing impurities of the second conductivity type is formed in second internal region A2 of low-concentration impurity layer 33. Second source region 24 containing impurities of the first conductivity type, second gate conductor 25, and second gate insulating film 26 are formed in second body region 28.

Second source electrode 21 includes portion 27 formed partly in a region within semiconductor layer 40, and portions 22 and 23 formed in the upper surface region. Portion 22 is connected to second source region 24 and second body region 28 via portions 23 and 27.

Portion 22 of second source electrode 21 is a layer that is bonded to solder during reflow in the face-down mounting process. In one non-limiting example, portion 22 may comprise a metal material including one or more of nickel, titanium, tungsten, and palladium. The upper surface of portion 22 may be plated with, for example, gold.

Portion 23 of second source electrode 21 is a layer connecting portions 22 and 27. In one non-limiting example, portion 23 may comprise a metal material including one or more of aluminum, copper, gold, and silver.

Portion 27 of second source electrode 21 is a layer connecting portion 23 and semiconductor layer 40. In one non-limiting example, portion 27 may comprise a metal material including one or more of aluminum, copper, gold, and silver.

The second gate electrode includes portion 78 formed partly in semiconductor layer 40, and portions B (not illustrated in the drawings) and 79 formed in the upper surface region. Portion B is connected to second gate conductor 25 via portions 79 and 78.

Portion B of the second gate electrode is a layer that is bonded to solder during reflow in the face-down mounting process. In one non-limiting example, portion B may comprise a metal material including one or more of nickel, titanium, tungsten, and palladium. The upper surface of portion B may be plated with, for example, gold.

Portion 79 of the second gate electrode is a layer connecting portions B and 78. In one non-limiting example, portion 79 may comprise a metal material including one or more of aluminum, copper, gold, and silver.

Portion 78 of the second gate electrode is a layer connecting portion 79 and second gate conductor 25. In one non-limiting example, portion 78 may comprise a metal material including one or more of aluminum, copper, gold, and silver, and may be polysilicon.

With the configurations of transistor 10 and transistor 20 described above, low-concentration impurity layer 33 and semiconductor substrate 32 function as a common drain region serving as both the first drain region of transistor 10 and the second drain region of transistor 20.

As illustrated in FIG. 1, first body region 18 is covered with oxide film 34 having an opening, and portion 13 of first source electrode 11, which is connected to first source region 14 via the opening in oxide film 34, is provided. Oxide film 34 and portion 13 of first source electrode 11 are covered with protective layer 35 having an opening, and portion 12, which is connected to portion 13 of first source electrode 11 via the opening in protective layer 35, is provided.

Second body region 28 is covered with oxide film 34 having an opening, and portion 23 of second source electrode 21, which is connected to second source region 24 via the opening in oxide film 34, is provided. Oxide film 34 and portion 23 of second source electrode 21 are covered with protective layer 35 having an opening, and portion 22, which is connected to portion 23 of second source electrode 21 via the opening in protective layer 35, is provided.

Accordingly, each of the one or more first source pads 111 refers to a region where first source electrode 11 is partially exposed on the upper surface of semiconductor device 1, and each of the one or more second source pads 121 refers to a region where second source electrode 21 is partially exposed on the upper surface of semiconductor device 1. These regions are also referred to as terminals. Similarly, first gate pad 119 and second gate pad 129 refer to regions where the first gate electrode and the second gate electrode, respectively, are partially exposed on the upper surface of semiconductor device 1, and are also referred to as terminals. In the present specification, source pads and gate pads are collectively referred to as electrode pads.

Upper surface boundary line 600 may be regarded as a virtual line tracing the center position of the gap between portion 13 of first source electrode 11 in first upper surface region S1 and portion 23 of second source electrode 21 in second upper surface region S2, may be regarded as an equi-potential ring (EQR), which is a metal line that is sometimes provided in the center position and does not have the function of conducting current, and may be regarded as the gap itself, albeit with a finite width. Even when upper surface boundary line 600 is regarded as the gap itself, it can be recognized by the naked eye or under low magnification as a line in appearance.

Similarly, internal boundary line 400 may be regarded as a virtual line tracing the center position of the gap between portion 17 of first source electrode 11 in first internal region A1 and portion 27 of second source electrode 21 in second internal region A2, may be regarded as an EQR, which is sometimes provided in the center position, and may be regarded as the gap itself, albeit with a finite width. Even when internal boundary line 400 is regarded as the gap itself, it can be recognized by the naked eye or under low magnification as a line in appearance.

[1-2. Semiconductor Device Operation]

In semiconductor device 1, for example, the first conductivity type may be n-type and the second conductivity type may be p-type, first source region 14, second source region 24, semiconductor substrate 32, and low-concentration impurity layer 33 may be n-type semiconductors, and first body region 18 and second body region 28 may be p-type semiconductors.

Alternatively, in semiconductor device 1, for example, the first conductivity type may be p-type and the second conductivity type may be n-type, first source region 14, second source region 24, semiconductor substrate 32, and low-concentration impurity layer 33 may be p-type semiconductors, and first body region 18 and second body region 28 may be n-type semiconductors.

In the following description, the conduction operation of semiconductor device 1 will be explained assuming that transistor 10 and transistor 20 are n-channel transistors where the first conductivity type is n-type and the second conductivity type is p-type.

In semiconductor device 1, when a high voltage is applied to first source electrode 11, a low voltage is applied to second source electrode 21, and a voltage greater than or equal to a threshold is applied to the second gate electrode (second gate conductor 25) with the voltage of second source electrode 21 serving as a reference, a conducting channel is formed in the vicinity of second gate insulating film 26 in second body region 28. As a result, a main current flows along a path from first source electrode 11 to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 and to second source electrode 21, thereby placing semiconductor device 1 in a conducting state. Note that the interface between first body region 18 and low-concentration impurity layer 33 in this main current path includes a P-N junction and serves as a body diode. Since the main current flows mainly horizontally through metal layer 30, increasing the thickness of metal layer 30 expands the cross-sectional area of the main current path, whereby the on-resistance of semiconductor device 1 can be reduced.

Similarly, in semiconductor device 1, when a high voltage is applied to second source electrode 21, a low voltage is applied to first source electrode 11, and a voltage greater than or equal to a threshold is applied to the first gate electrode (first gate conductor 15) with the voltage of first source electrode 11 serving as a reference, a conducting channel is formed in the vicinity of first gate insulating film 16 in first body region 18. As a result, a main current flows along a path from second source electrode 21 to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 and to first source electrode 11, thereby placing semiconductor device 1 in a conducting state. Note that the interface between second body region 28 and low-concentration impurity layer 33 in this main current path includes a P-N junction and serves as a body diode.

[1-3. Semiconductor Module Structure]

Hereinafter, the structure of the semiconductor module according to Embodiment 1 will be described.

Figure 5:
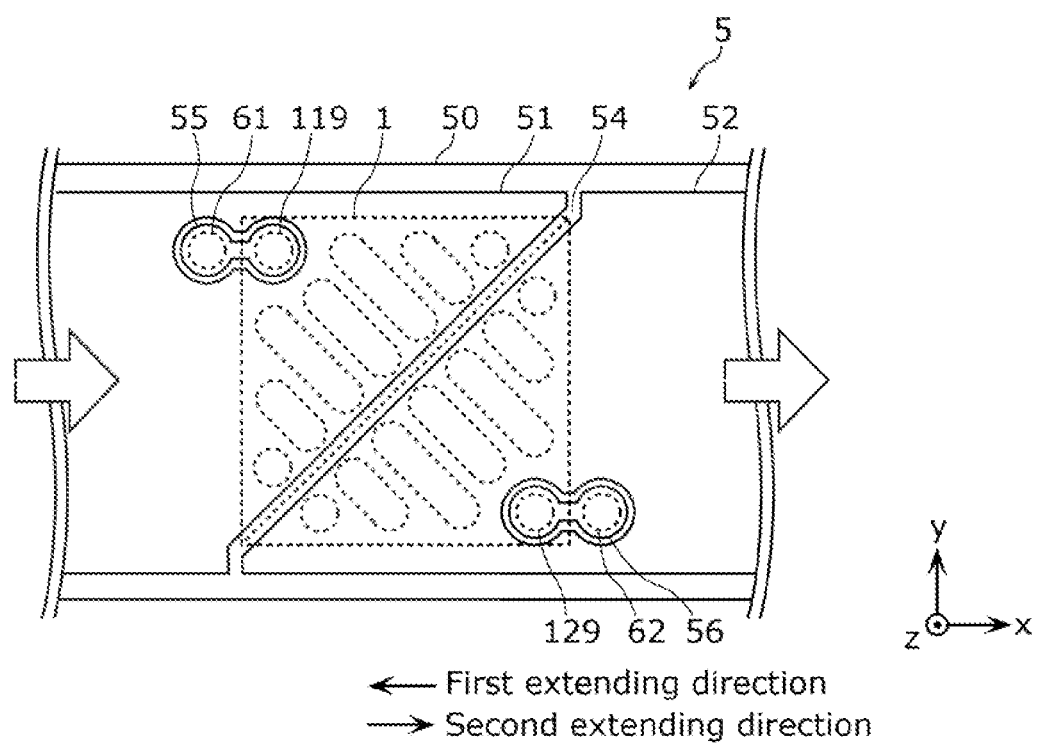
FIG. 5 is a plan view illustrating one example of the structure of a semiconductor module according to Embodiment 1.

FIG. 5 is a plan view illustrating one example of the structure of semiconductor module 5 according to Embodiment 1.

As illustrated in FIG. 5, semiconductor module 5 includes semiconductor device 1 described above and mounting substrate 50. Semiconductor device 1 is face-down mounted on the front surface of mounting substrate 50. Mounting substrate 50 is elongated in the lengthwise direction and has a constant width at least at the location where semiconductor device 1 is mounted. In FIG. 5, semiconductor device 1 is drawn with dashed lines as if it were transparent so that the structure of the upper surface of semiconductor device 1 and the structure of the front surface of mounting substrate 50, which cannot actually be seen, can be illustrated clearly.

As illustrated in FIG. 5, while the front surface of mounting substrate 50 is facing in the positive z-axis direction, semiconductor device 1 is mounted on mounting substrate 50 with the upper surface of semiconductor device 1 facing in the negative z-axis direction.

Figure 6:
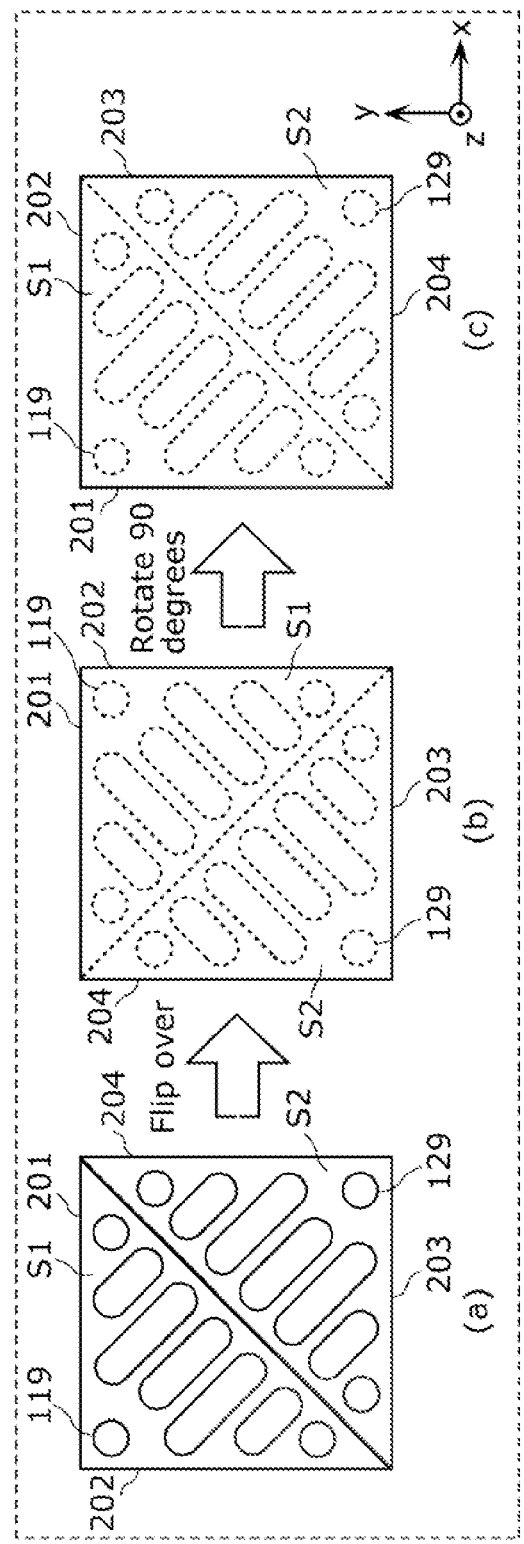
FIG. 6 is a schematic diagram illustrating how the semiconductor device according to Embodiment 1 is face-down mounted on the front surface of the mounting substrate according to Embodiment 1.

FIG. 6 is a schematic diagram illustrating how semiconductor device 1 is face-down mounted on the front surface of mounting substrate 50. Although one example of face-down mounting is described here with reference to FIG. 6, the description here is merely one example; even with a method other than the mounting example described with reference to FIG. 6, semiconductor device 1 can be face-down mounted by mounting semiconductor device 1 with its upper surface facing in the negative z-axis direction while the front surface of mounting substrate 50 is facing in the positive z-axis direction.

As illustrated in FIG. 6, semiconductor device 1 in the orientation illustrated in FIG. 2, i.e., with its upper surface facing the positive z-axis direction as illustrated in (a) in FIG. 6, is flipped over with respect to the z-axis as illustrated in (b) in FIG. 6, further rotated 90 degrees to the left around the z-axis as the axis of rotation as illustrated in (c) in FIG. 6, and then mounted to the front surface of mounting substrate 50.

Here, semiconductor device 1 is face-down mounted on the front surface of mounting substrate 50 in an orientation such that second side 202 and fourth side 204 are parallel to the extending directions of the lengthwise direction of mounting substrate 50 (the positive and negative x-axis directions in FIG. 6), and first gate pad 119 is located on the first extending direction (the negative x-axis direction in FIG. 6) side among the extending directions of the lengthwise direction of mounting substrate 50.

Next, the description of semiconductor module 5 will continue, returning again to FIG. 5.

As illustrated in FIG. 5, in a plan view of mounting substrate 50, mounting substrate 50 is elongated in the lengthwise direction and has a constant width at least at the location where semiconductor device 1 is mounted. Mounting substrate 50 includes first via 61 and second via 62. First via 61 passes through a first conductor (here, metal wiring 55 (to be described later) electrically connected to first gate pad 119, or a conductor electrically connected to metal wiring 55) electrically connected to first gate pad 119. Second via 62 passes through a second conductor (here, metal wiring 56 (to be described later) electrically connected to second gate pad 129, or a conductor electrically connected to metal wiring 56) electrically connected to second gate pad 129.

Mounting substrate 50 further includes, on the front surface thereof, first metal wiring 51, second metal wiring 52, metal wiring 55, and metal wiring 56.

First metal wiring 51 and second metal wiring 52 are disposed aligned in the extending directions of the lengthwise direction of mounting substrate 50 (the positive and negative x-axis directions in FIG. 5), with clearance (separation) 54 therebetween.

First metal wiring 51 is bonded to all of the one or more first source pads 111. For example, first metal wiring 51 is bonded to all of the one or more first source pads 111 with a conductive bonding material such as solder.

Second metal wiring 52 is bonded to all of the one or more second source pads 121. For example, second metal wiring 52 is bonded to all of the one or more second source pads 121 with a conductive bonding material such as solder.

Accordingly, as illustrated in FIG. 5, semiconductor device 1 will be face-down mounted in a position bridging first metal wiring 51 and second metal wiring 52 across clearance 54.

Metal wiring 55 is bonded to first gate pad 119. For example, metal wiring 55 is bonded to first gate pad 119 with a conductive bonding material such as solder.

Metal wiring 56 is bonded to second gate pad 129. For example, metal wiring 56 is bonded to second gate pad 129 with a conductive bonding material such as solder.

Applying a voltage greater than or equal to a threshold voltage to second gate pad 129 via the second conductor passing through second via 62 places second transistor 20 in a conducting state. Accordingly, when the voltage on the first metal wiring 51 side is higher than the voltage on the second metal wiring 52 side, applying a voltage greater than or equal to the threshold voltage to second gate pad 129 causes the main current to flow from the first metal wiring 51 side to the second metal wiring 52 side, as shown by the arrows in FIG. 5. Here, the main current is the current that flows through the power lines of mounting substrate 50 including semiconductor device 1.

Applying a voltage greater than or equal to a threshold voltage to first gate pad 119 via the first conductor passing through first via 61 places first transistor 10 in a conducting state. Accordingly, when the voltage on the second metal wiring 52 side is higher than the voltage on the first metal wiring 51 side, applying a voltage greater than or equal to the threshold voltage to first gate pad 119 causes the main current to flow from second metal wiring 52 side to the first metal wiring 51 side, i.e., in the opposite direction of the arrows in FIG. 5.

Figure 7:
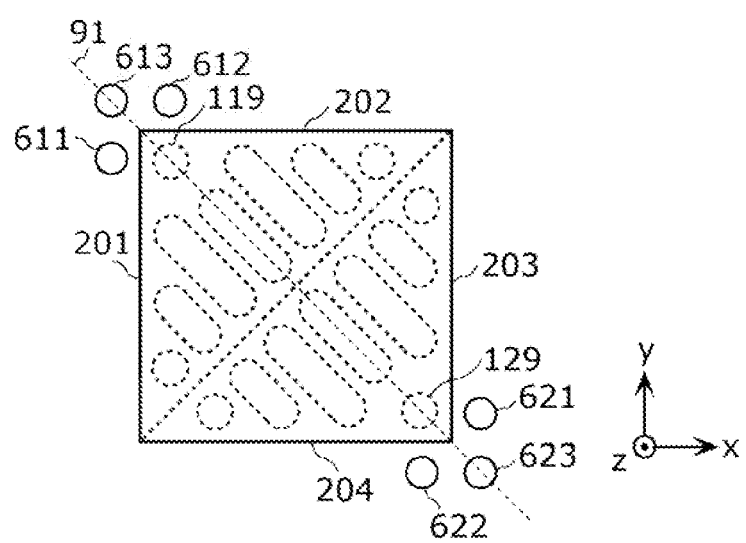
FIG. 7 is a plan view illustrating one example of a variation of the positions at which a first via and a second via according to Embodiment 1 are arranged.

FIG. 7 is a plan view illustrating one example of a variation of the positions at which first via 61 and second via 62 are arranged.

As illustrated in FIG. 7, in a plan view of mounting substrate 50, the center of first via 61 is preferably positioned at any of the following: (1) on first virtual straight line 91 (for example, at the center of first via 613 in FIG. 7); (2) outside first semiconductor device 1 beyond second side 202 in the direction in which first side 201 extends (in the y-axis direction in FIG. 7) and between first side 201 and the center of first gate pad 119, in the direction in which second side 202 extends (in the x-axis direction in FIG. 7) (for example, at the center of first via 612 in FIG. 7); and (3) outside first semiconductor device 1 beyond first side 201 in the direction in which second side 202 extends and between second side 202 and the center of first gate pad 119, in the direction in which first side 201 extends (for example, at the center of first via 611 in FIG. 7).

Disposing the center of first via 61 in such a position allows the length of metal wiring 55 to be made relatively short. Furthermore, when gate pads are aligned in double-sided mounting, wiring (vias) can be shared between the front and rear sides, which simplifies substrate wiring. The position of (1) is highly versatile as it can be used regardless of whether semiconductor device 1 is square or rectangular in a plan view of semiconductor layer 40. The position of (2) allows for a reduction in conduction resistance since the via does not obstruct the main current that flows through the mounting substrate and the semiconductor device. The position of (3) allows for a small-form semiconductor module 5 since the width of mounting substrate 40 does not need to be increased.

Here, the center of the via in a plan view of the mounting substrate refers to the center of gravity in the shape of the via in a plan view of the mounting substrate. For example, if the via is circular, the center of the via is the center of the circle.

As illustrated in FIG. 7, in a plan view of mounting substrate 50, the center of second via 62 is preferably positioned at any of the following: (1) on first virtual straight line 91 (for example, at the center of second via 623 in FIG. 7); (2) outside first semiconductor device 1 beyond fourth side 204 in the direction in which third side 203 extends (in the y-axis direction in FIG. 7) and between third side 203 and the center of second gate pad 129, in the direction in which fourth side 204 extends (in the x-axis direction in FIG. 7) (for example, at the center of second via 622 in FIG. 7); and (3) outside first semiconductor device 1 beyond third side 203 in the direction in which fourth side 204 extends and between fourth side 204 and the center of second gate pad 129, in the direction in which third side 203 extends (for example, at the center of second via 621 in FIG. 7).

Disposing the center of second via 62 in such a position allows the length of metal wiring 56 to be made relatively short. Furthermore, when gate pads are aligned in double-sided mounting, wiring (vias) can be shared between the front and rear sides, which simplifies substrate wiring. The position of (1) is highly versatile as it can be used regardless of whether semiconductor device 1 is square or rectangular in a plan view of semiconductor layer 40. The position of (2) allows for a reduction in conduction resistance since the via does not obstruct the main current that flows through the mounting substrate and the semiconductor device. The position of (3) allows for a small-form semiconductor module 5 since the width of mounting substrate 40 does not need to be increased.

Here, the center of the via in a plan view of the mounting substrate refers to the center of gravity in the shape of the via in a plan view of the mounting substrate. For example, if the via is circular, the center of the via is the center of the circle.

[1-4. Observations]

With semiconductor device 1 configured as described above, when two semiconductor devices 1 of the same type are face-down mounted on the mounting substrate, one on the front surface and the other on the rear surface, and are driven on and off at the same time, it is possible to align the position of first gate pad 119 of one semiconductor device 1 with the position of first gate pad 119 of the other semiconductor device 1 and align the position of second gate pad 129 of one semiconductor device 1 with the position of second gate pad 129 of the other semiconductor device 1 by mounting the two semiconductor devices 1 such that in a plan view of the mounting substrate, the centers of the two semiconductor devices 1 overlap and one semiconductor device 1 is rotated 90 degrees relative to the other semiconductor device 1 around an axis of rotation passing through the centers of semiconductor devices 1 and extending perpendicular to the plane of the mounting substrate, i.e., by mounting one semiconductor device 1 in the orientation illustrated in (c) in FIG. 6 and the other semiconductor device 1 in the orientation illustrated in (a) in FIG. 6.

With this configuration, since, on the mounting substrate on which these two semiconductor devices 1 of the same type are mounted, one of the front surface and the other on the rear surface, common wiring can be used for controlling both the electric potential of first gate pad 119 of one semiconductor device 1 and the electric potential of first gate pad 119 of the other semiconductor device 1 and common wiring can be used for controlling both the electric potential of second gate pad 129 of one semiconductor device 1 and the electric potential of second gate pad 129 of the other semiconductor device 1, half the wiring (vias) can be used compared to when individual wiring is used.

This makes it possible to secure a wide current path for the main current on the mounting substrate, and thus design a current path for the main current on the mounting substrate that reduces conduction resistance.

Thus, semiconductor device 1 configured as described above makes it possible to provide a semiconductor device having a feature that allows current to flow efficiently in the current path on the mounting substrate on which it is mounted.

As shown in (a) and (c) in FIG. 6, when two semiconductor devices 1 of the same type are mounted on the mounting substrate, one on the front surface and the other on the rear surface, it is possible to completely overlap first upper surface regions S1 of the two semiconductor devices 1 and completely overlap second upper surface regions S2 of the two semiconductor devices 1 on the front and rear sides of the mounting substrate in a plan view of the mounting substrate by mounting the two semiconductor devices 1 such that in a plan view of the mounting substrate, the centers of the two semiconductor devices 1 overlap and one semiconductor device 1 is rotated 90 degrees relative to the other semiconductor device 1 around an axis of rotation passing through the centers of semiconductor devices 1 and extending perpendicular to the plane of the mounting substrate.

This makes it possible to maximally widen the conduction cross-sectional area of the current path on the mounting substrate on which these two semiconductor devices 1 are mounted, which has the advantageous effect of reducing conduction resistance. The more overlap between first upper surface regions S1 and between second upper surface regions S2, the more effective it is for the reduction of conduction resistance since common vias related to the source can also be used, although they are not illustrated in the drawings.

Note that the center of semiconductor device 1 is the intersection of the diagonals of semiconductor device 1 in a plan view of semiconductor layer 40.

FIG. 8 is a table illustrating comparison results of semiconductor device 1 and conventional semiconductor devices according to comparative examples when the semiconductor devices are mounted on a mounting substrate. Here, the narrowness of the width of the mounting substrate, the conduction resistance including wiring of the mounting substrate, the commonality of vias, the ease of gate wiring design, and the bending strength of the mounting substrate were compared.

Comparative Example 1 is of a conventional semiconductor device in which the boundary between the region in which one or more first source pads are disposed and the region in which one or more second source pads are disposed is orthogonal to the orientation of the first side of the semiconductor device and the third side opposite the first side, and the first gate pad and the second gate pad are disposed at the corners of the semiconductor device. Comparative Example 2 is of a conventional semiconductor device in which the boundary between the region in which one or more first source pads are disposed and the region in which one or more second source pads are disposed is orthogonal to the orientation of the first side of the semiconductor device and the third side opposite the first side, and the first gate pad and the second gate pad are disposed at the vertical center of the semiconductor device. Comparative Example 3 is of a conventional semiconductor device in which the boundary between the region in which one or more first source pads are disposed and the region in which one or more second source pads are disposed is orthogonal to the orientation of the first side of the semiconductor device and the third side opposite the first side, and the first gate pad and the second gate pad are disposed at the horizontal center of the semiconductor device.

As illustrated in FIG. 8, semiconductor device 1 is superior in performance over each of Comparative Example 1, Comparative Example 2, and Comparative Example 3 in regard to at least one of wiring lead-out in the y-axis direction, ease of gate wiring design, and wiring lead-out in the x-axis direction, when the semiconductor devices are mounted on a mounting substrate.

Although like the present disclosure, Comparative Example 2 also simplifies wiring through double-sided mounting, in the present disclosure, the wiring (vias) shared between the front and rear sides can be brought to the edges of the mounting substrate so as not to interfere with the main current (i.e., the present disclosure has superior performance in regard to wiring lead-out in the y-axis direction in FIG. 8).

Figure 9:
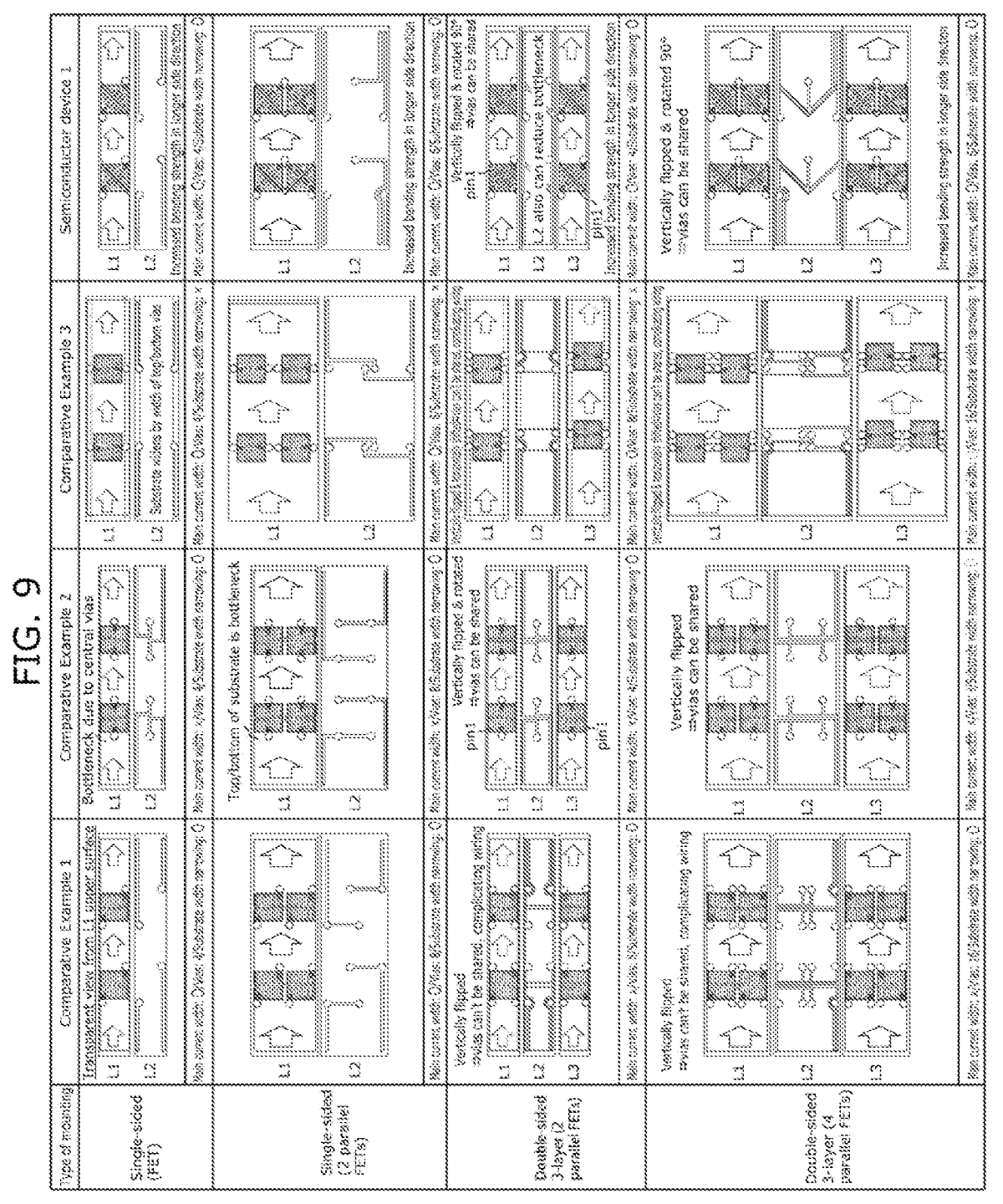

FIG. 9 is a table illustrating comparison results of semiconductor device 1, Comparative Example 1, Comparative Example 2, and Comparative Example 3 when the semiconductor devices are mounted on mounting substrates of various configurations. Here, the width of the flow of the main current, the positions of vias, the number of vias, and the narrowing of the width of the mounting substrate were compared. L1, L2, and L3 in FIG. 9 illustrate the wiring of each layer in a plan view from the front surface side, with the illustration of obstructive elements omitted for illustrative purposes.

As illustrated in FIG. 9, semiconductor device 1 is superior in performance over Comparative Example 1, Comparative Example 2, and Comparative Example 3 in terms of the width of the flow of the main current, the number of vias, the positions of the vias, and the narrowing of the width of the mounting substrate, especially in high-current charging, even when mounted on mounting substrates of various configurations.

Semiconductor device 1 is also superior with respect to the bending strength of the mounting substrate since the clearance of the mounting substrate is inclined with respect to the lengthwise direction.

Note that although the one or more first source pads 111 and the one or more second source pads 121 are exemplified as being arranged as illustrated in FIG. 2 in Embodiment 1, so long as the one or more first source pads 111 are disposed in first upper surface region S1 and the one or more second source pads 121 are disposed in second upper surface region S2, the one or more first source pads 111 and the one or more second source pads 121 need not necessarily be arranged as illustrated in FIG. 2.

FIG. 10A, FIG. 10B, FIG. 10C, and FIG. 10D are plan views illustrating other arrangement examples of the one or more first source pads 111 and the one or more second source pads 121.

Figure 10A:
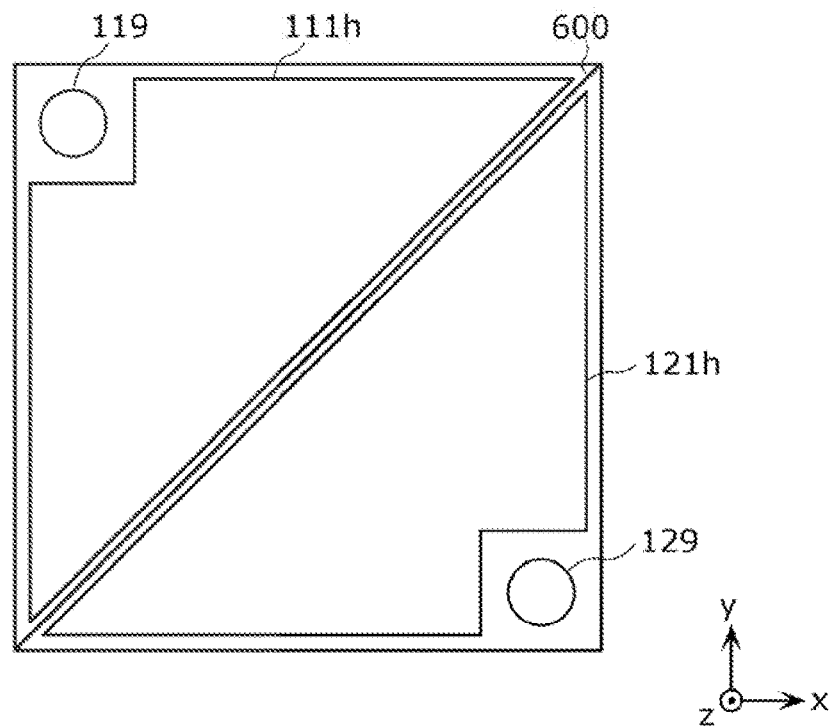
FIG. 10A is a plan view illustrating another arrangement example of first and second source pads according to Embodiment 1.
Figure 10B:
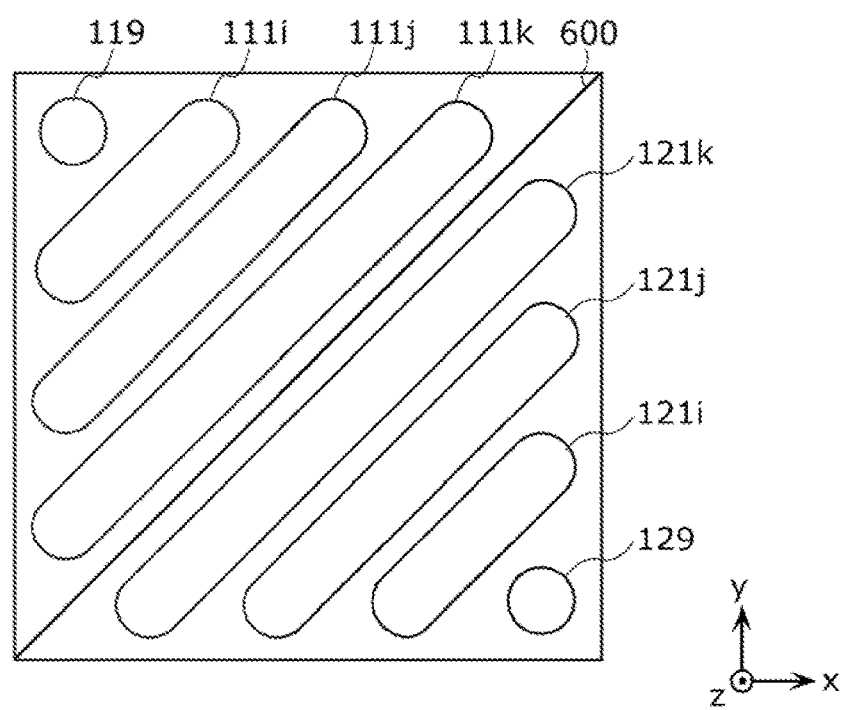
FIG. 10B is a plan view illustrating another arrangement example of the first and second source pads according to Embodiment 1.
Figure 10C:
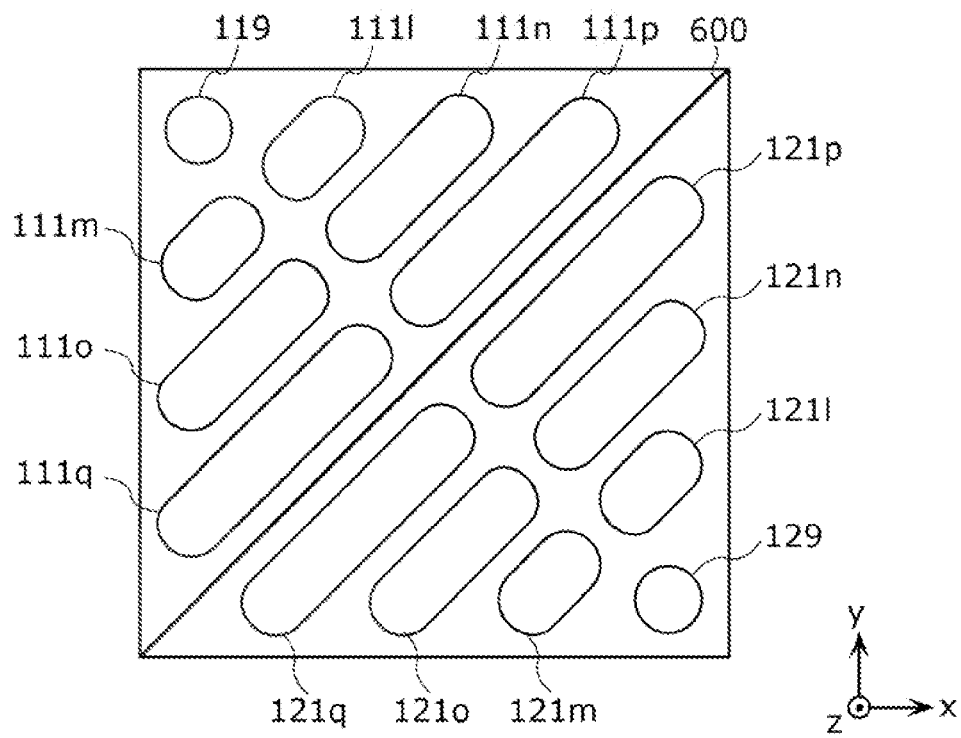
FIG. 10C is a plan view illustrating another arrangement example of the first and second source pads according to Embodiment 1.
Figure 10D:
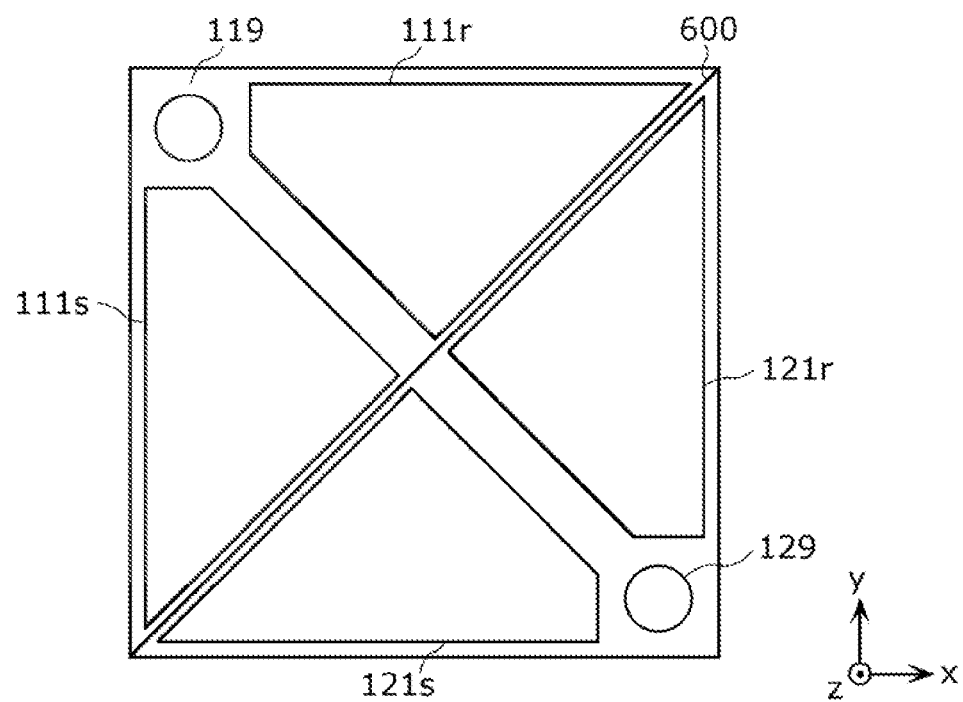
FIG. 10D is a plan view illustrating another arrangement example of the first and second source pads according to Embodiment 1.

As illustrated in FIG. 10A, a single first source pad 111h may be disposed over approximately the entire surface of first upper surface region S1 excluding the region of first gate pad 119 and a single second source pad 121h may be disposed over approximately the entire surface of second upper surface region S2 excluding the region of second gate pad 129. As illustrated in FIG. 10B, a plurality of first source pads 111i through 111k may be disposed in first upper surface region S1, parallel to upper surface boundary line 600, and a plurality of second source pads 121i through 121k may be disposed in second upper surface region S2, parallel to upper surface boundary line 600. As illustrated in FIG. 10C, a plurality of first source pads 111l through 111q may be disposed in first upper surface region S1, in two sections, parallel to upper surface boundary line 600, and a plurality of second source pads 121l through 121q may be disposed in second upper surface region S2, in two sections, parallel to upper surface boundary line 600. As illustrated in FIG. 10D, two first source pads 111r and 111s may be disposed over approximately the entire surface of first upper surface region S1 excluding the region of first gate pad 119, in two sections such that opposing sides thereof are orthogonal to upper surface boundary line 600, and two second source pads 121r and 121s may be disposed over approximately the entire surface of second upper surface region S2 excluding the region of second gate pad 129, in two sections such that opposing sides thereof are orthogonal to upper surface boundary line 600.

Note that although semiconductor device 1 and semiconductor layer 40 are described as square in a plan view of semiconductor layer 40 in Embodiment 1, semiconductor device 1 and semiconductor layer 40 need not necessarily be limited to being square. So long as in a plan view of semiconductor layer 40, first gate pad 119 and second gate pad 129 are positioned such that first virtual straight line 91 connecting the center of first gate pad 119 and the center of second gate pad 129 passes through the center of semiconductor layer 40 and forms a 45 degree angle with each side of semiconductor layer 40, semiconductor device 1 and semiconductor layer 40 may be a rectangle excluding a square.

Figure 11:
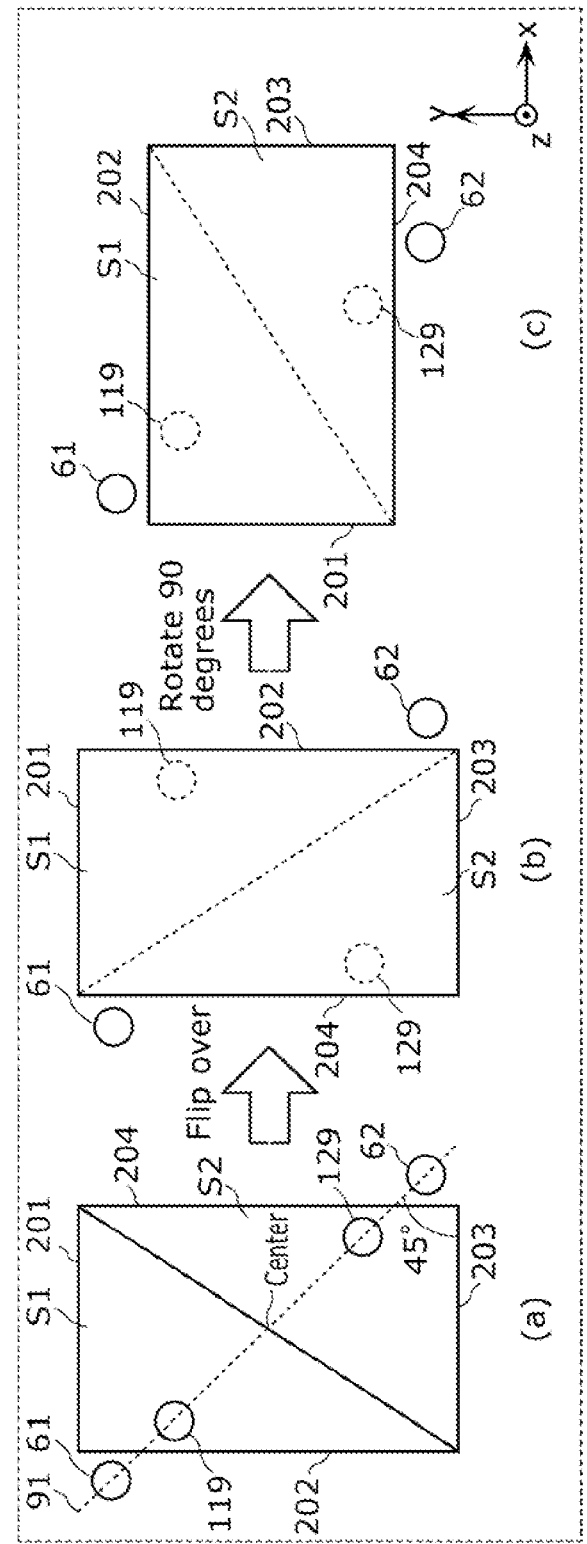
FIG. 11 is a schematic diagram illustrating how the semiconductor device according to Embodiment 1 is face-down mounted on the front surface of the mounting substrate according to Embodiment 1.

FIG. 11 is a schematic diagram illustrating how semiconductor device 1 described above that is a rectangle excluding a square (hereinafter also referred to as a rectangular semiconductor device) is face-down mounted on the front surface of mounting substrate 50. Although one example of face-down mounting is described here with reference to FIG. 11, the description here is merely one example; even with a method other than the mounting example described with reference to FIG. 11, semiconductor device 1 can be face-down mounted by mounting semiconductor device 1 with its upper surface facing in the negative z-axis direction while the front surface of mounting substrate 50 is facing in the positive z-axis direction.

As illustrated in FIG. 11, the rectangular semiconductor device oriented with its upper surface facing the positive z-axis direction as illustrated in (a) in FIG. 11 is flipped over with respect to the z-axis as illustrated in (b) in FIG. 11, further rotated 90 degrees to the left around the z-axis as the axis of rotation as illustrated in (c) in FIG. 11, and then mounted to the front surface of mounting substrate 50.

Accordingly, with the rectangular semiconductor device, when two rectangular semiconductor devices of the same type are mounted on the mounting substrate, one on the front surface and the other on the rear surface, it is possible to align the position of first gate pad 119 of one rectangular semiconductor device with the position of first gate pad 119 of the other rectangular semiconductor device and align the position of second gate pad 129 of one rectangular semiconductor device with the position of second gate pad 129 of the other rectangular semiconductor device, by mounting the two rectangular semiconductor devices such that in a plan view of the mounting substrate, the centers of the two rectangular semiconductor devices overlap and one rectangular semiconductor device is rotated 90 degrees relative to the other rectangular semiconductor device around an axis of rotation passing through the centers of the rectangular semiconductor devices and extending perpendicular to the plane of the mounting substrate, i.e., by mounting one rectangular semiconductor device in the orientation illustrated in (c) in FIG. 11 and the other rectangular semiconductor device in the orientation illustrated in (a) in FIG. 11.

With this configuration, on the mounting substrate on which these two rectangular semiconductor devices are mounted, the wiring for controlling both the electric potential of first gate pad 119 of one rectangular semiconductor device and the electric potential of first gate pad 119 of the other rectangular semiconductor device and the wiring for controlling both the electric potential of second gate pad 129 of one rectangular semiconductor device and the electric potential of second gate pad 129 of the other rectangular semiconductor device can be configured in a relatively simple manner.

In this configuration, in a plan view of mounting substrate 50, the center of first via 61 and the center of second via 62 are preferably positioned on first virtual straight line 91. This allows the length of metal wiring 55 and the length of metal wiring 56 to be relatively short.

Embodiment 2

[2-1. Semiconductor Device Structure]

Hereinafter, the semiconductor device according to Embodiment 2 will be described. The semiconductor device according to Embodiment 2 is semiconductor device 1 according to Embodiment 1 with some configuration changes. Accordingly, detailed description of aspects of the semiconductor device according to Embodiment 2 that are the same as semiconductor device 1 will be omitted as they have already been described above. Moreover, elements that are the same as in semiconductor device 1 have the same reference signs. Hereinafter, description will focus on the points of differences from semiconductor device 1.

Figure 12:
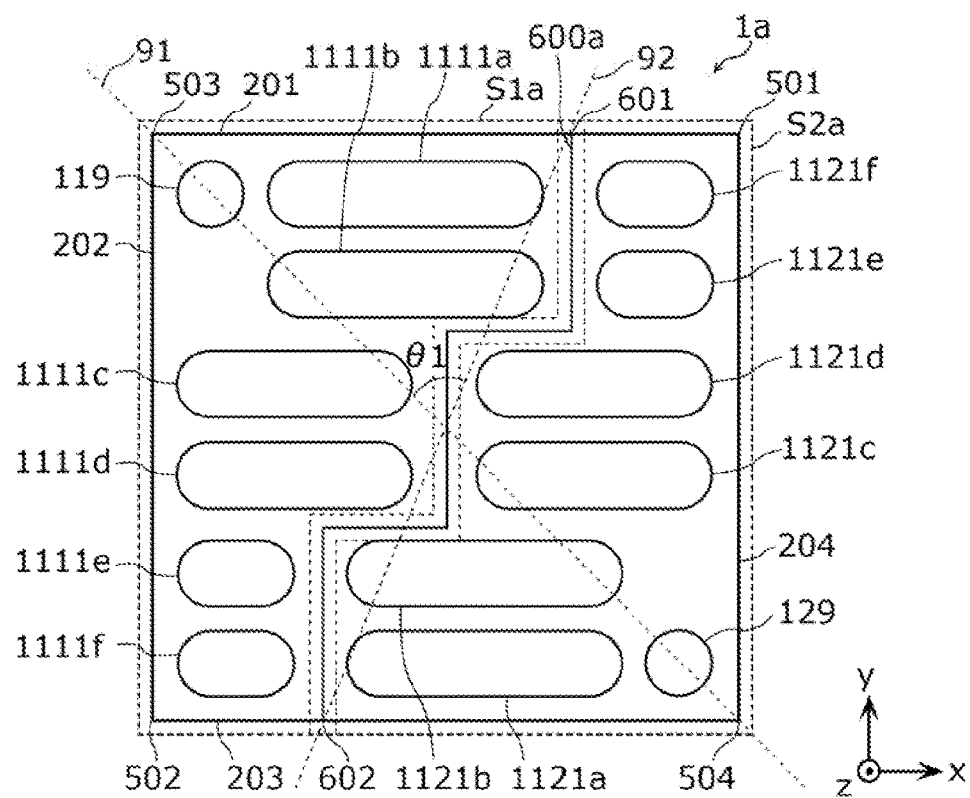
FIG. 12 is a plan view illustrating one example of the structure of a semiconductor device according to Embodiment 2.
Figure 13:
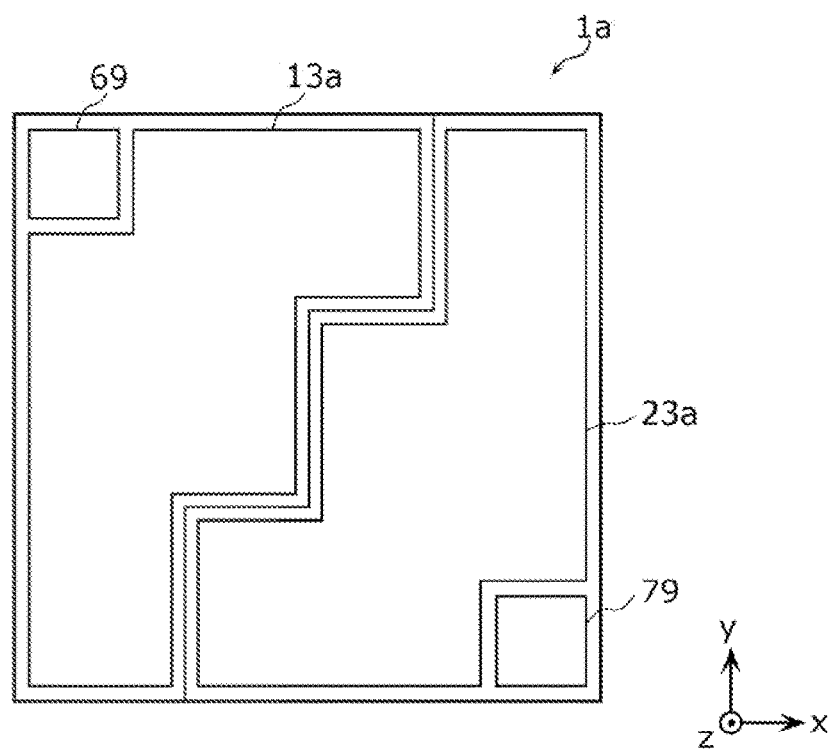
FIG. 13 is a plan view illustrating one example of the structure of the semiconductor device according to Embodiment 2.

FIG. 12 is a plan view illustrating one example of the structure of semiconductor device 1*a* according to Embodiment 2. FIG. 13 is a plan view illustrating one example of the structure of semiconductor device 1*a*. In FIG. 13, illustration of the structures between the upper surface of semiconductor device 1*a* and portions 13*a* and 23*a* (to be described later) is omitted so as to expose portions 13*a* and 23*a* for illustrative purposes.

As illustrated in FIG. 12 and FIG. 13, semiconductor device 1*a* is semiconductor device 1 according to Embodiment 1 except that first upper surface region S1 has been changed to first upper surface region S1*a*, second upper surface region S2 has been changed to second upper surface region S2*a*, upper surface boundary line 600 has been changed to upper surface boundary line 600*a*, the one or more first source pads 111 have been changed to one or more first source pads 1111 (first source pads 1111*a*, 1111*b*, 1111*c*, 1111*d*, 1111*e*, and 1111*f* in this example), the one or more second source pads 121 have been changed to one or more second source pads 1121 (second source pads 1121*a*, 1121*b*, 1121*c*, 1121*d*, 1121*e*, and 1121*f* in this example), portion 13 has been changed to portion 13*a*, and portion 23 has been changed to portion 23*a*.

As illustrated in FIG. 12, in a plan view of semiconductor layer 40, upper surface boundary line 600*a*, which is the boundary line between first upper surface region S1*a* and second upper surface region S2*a*, consists of alternately connected N−1 (N is an integer greater than or equal to three; in this example, N is four) line segments parallel to second side 202 and N−2 line segments parallel to first side 201, and monotonically changes in the direction in which second side 202 extends and the direction in which first side 201 extends.

In the present specification, "monotonically change" means being a monotonically increasing function in a broad sense or a monotonically decreasing function in a broad sense. In other words, a monotonically increasing function in a broad sense means a function f(x) such that $f(x_1) \le f(x_2)$ when $x_1 < x_2$, and a monotonically decreasing function in a broad sense means a function f(x) such that $f(x_1) \ge f(x_2)$ when $x_1 < x_2$.

Considering the main purpose of the present invention (aligning gate pads and increasing overlap between first upper surface regions S1*a* and between second upper surface regions S2*a* in double-sided mounting applications), the pad layout and upper surface boundary line 600*a* in the upper surface region desirably have point symmetry about the center of semiconductor device 1*a* as the central point of symmetry. If upper surface boundary line 600*c* is step-shaped, it is not possible to have strict point symmetry, but it is useful in the present invention to reduce the degree of deviation as much as possible. A boundary shape in which the center of semiconductor device 1*a* intersects a corner of a step does not establish this symmetry. To improve point symmetry accuracy in the step-shaped upper surface boundary line 600*a*, the center of the portion (line segment) passing through the center of semiconductor device 1*a* must coincide with the center of semiconductor device 1*a*, and furthermore, in both directions in which the line segment extends, there must be an equal number of portions (line segments) from the center. In other words, the line segment is desirably step-shaped, consisting of an odd number of line segments in the direction in which the line segment that passes through the center of semiconductor device 1*a* extends, and an even number of line segments in the direction perpendicular thereto. Accordingly, a step-shaped boundary line consisting of N−1 and N−2 line segments and passing through the center of semiconductor device 1*a* in the direction in which the odd number of line segments extend is preferred.

The distance between first vertex 501 and first intersection 601, which is the intersection of upper surface boundary line 600*a* and first side 201, is greater than or equal to 1/N of the length of first side 201 and greater than the maximum diameter of second gate pad 129.

The distance between second vertex 502 and second intersection 602, which is the intersection of upper surface boundary line 600*a* and third side 203, is greater than or equal to 1/N of the length of third side 203 and greater than the maximum diameter of first gate pad 119.

As illustrated in FIG. 12, first upper surface region S1*a* and second upper surface region S2*a* are adjacent to each other in a plan view of semiconductor layer 40 and divide semiconductor layer 40 into two equal parts in terms of surface area.

In a plan view of semiconductor layer 40, angle θ1 between second virtual straight line 92, which connects first intersection 601 and second intersection 602, and first virtual straight line 91 is greater than 45 degrees and less than or equal to 90 degrees.

As illustrated in FIG. 12, the one or more first source pads 1111 are provided in plurality, and in a plan view of semiconductor layer 40, the plurality of first source pads 1111 are each a rectangle or an oval whose lengthwise direction is parallel to first side 201, and are arranged in a striped pattern parallel to first side 201. The one or more second source pads 1121 are provided in plurality, and in a plan view of semiconductor layer 40, the plurality of second source pads 1121 are each a rectangle or an oval whose lengthwise direction is parallel to third side 203, and are arranged in a striped pattern parallel to third side 203.

Moreover, in accordance with the change in the shape of first upper surface region S1*a* from the shape of first upper surface region S1 according to Embodiment 1 and the change in the shape of second upper surface region S2*a* from the shape of second upper surface region S2 according to Embodiment 1, the shape of portion 13*a* has been changed from the shape of portion 13 according to Embodiment 1, and the shape of portion 23*a* has been changed from the shape of portion 23 according to Embodiment 1, as illustrated in FIG. 13.

[2-2. Semiconductor Module Structure]

Hereinafter, the semiconductor module according to Embodiment 2 will be described. The semiconductor module according to Embodiment 2 is semiconductor module 5 according to Embodiment 1 with some configuration changes. Accordingly, detailed description of aspects of the semiconductor module according to Embodiment 2 that are the same as semiconductor module 5 will be omitted as they have already been described above. Moreover, elements that are the same as in semiconductor module 5 have the same reference signs. Hereinafter, description will focus on the points of differences from semiconductor module 5.

Figure 14:
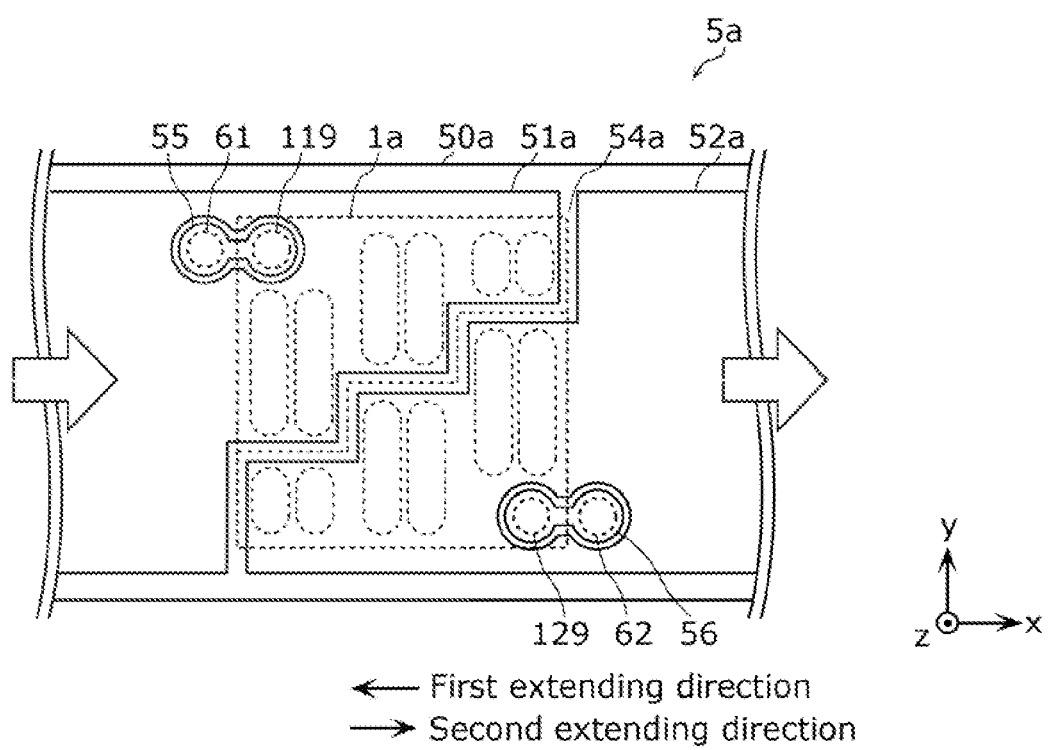
FIG. 14 is a plan view illustrating one example of the structure of a semiconductor module according to Embodiment 2.

FIG. 14 is a plan view illustrating one example of the structure of semiconductor module 5a according to Embodiment 2.

As illustrated in FIG. 14, semiconductor module 5a is semiconductor module 5 according to Embodiment 1 except that semiconductor device 1 has been changed to semiconductor device 1a and mounting substrate 50 has been changed to mounting substrate 50a. In FIG. 14, semiconductor device 1a is drawn with dashed lines as if it were transparent so that the structure of the upper surface of semiconductor device 1a and the structure of the front surface of mounting substrate 50a, which cannot actually be seen, can be illustrated clearly.

Mounting substrate 50a is mounting substrate 50 except that first metal wiring 51 has been changed to first metal wiring 51a and second metal wiring 52 has been changed to second metal wiring 52a.

Figure 15:
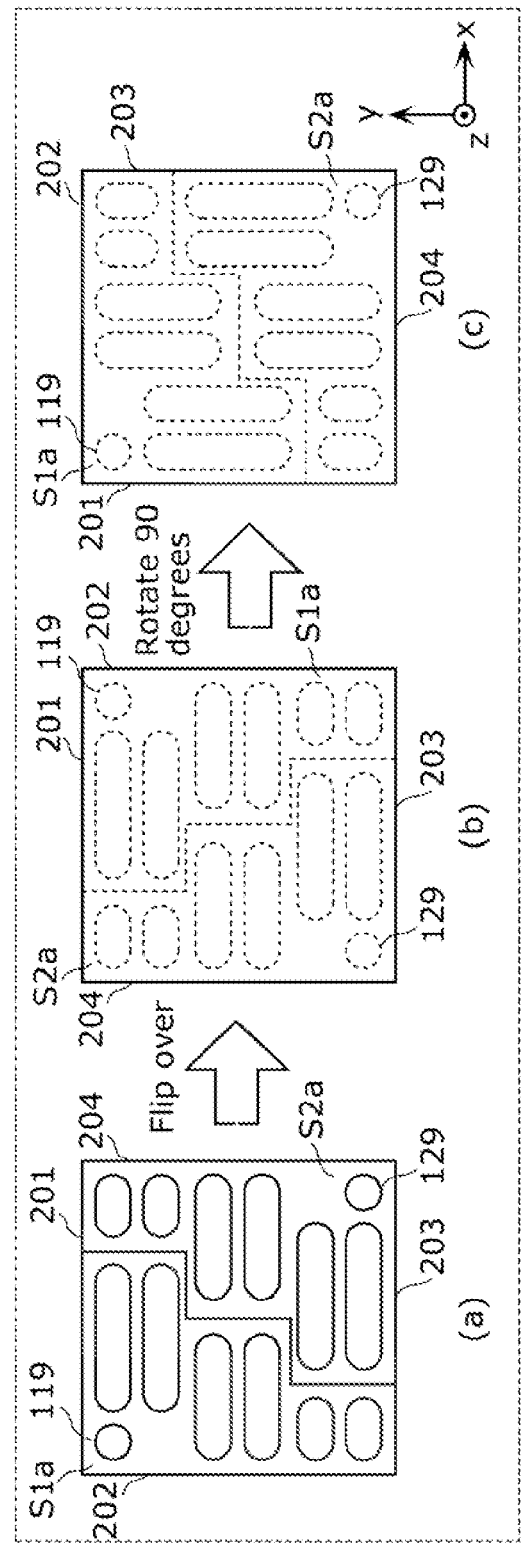
FIG. 15 is a schematic diagram illustrating how the semiconductor device according to Embodiment 2 is face-down mounted on the front surface of the mounting substrate according to Embodiment 2.

FIG. 15 is a schematic diagram illustrating how semiconductor device 1a is face-down mounted on the front surface of mounting substrate 50a. With the upper surface of semiconductor device 1a facing the positive z-axis direction as illustrated in (a) in FIG. 15, semiconductor device 1a is flipped over with respect to the z-axis as illustrated in (b) in FIG. 15, and further rotated 90 degrees to the left around the z-axis as the axis of rotation as illustrated in (c) in FIG. 15, and then mounted to the front surface of mounting substrate 50a.

Here, semiconductor device 1a is face-down mounted on the front surface of mounting substrate 50a in an orientation such that second side 202 and fourth side 204 are parallel to the extending directions of the lengthwise direction of mounting substrate 50a (the positive and negative x-axis directions in FIG. 15), and first gate pad 119 is located on the first extending direction (the negative x-axis direction in FIG. 15) side among the extending directions of the lengthwise direction of mounting substrate 50a.

Next, the description of semiconductor module 5a will continue, returning again to FIG. 14.

As illustrated in FIG. 14, first metal wiring 51a and second metal wiring 52a are disposed aligned in the extending directions of the lengthwise direction of mounting substrate 50a (the positive and negative x-axis directions in FIG. 14) with clearance 54a therebetween.

First metal wiring 51a is bonded to all of the plurality of first source pads 1111. For example, first metal wiring 51a is bonded to all of the plurality of first source pads 1111 with a conductive bonding material such as solder.

Second metal wiring 52a is bonded to all of the plurality of second source pads 1121. For example, second metal wiring 52a is bonded to all of the plurality of second source pads 1121 with a conductive bonding material such as solder.

Accordingly, as illustrated in FIG. 14, semiconductor device 1a will be face-down mounted in a position bridging first metal wiring 51a and second metal wiring 52a across clearance 54a.

Figure 16:
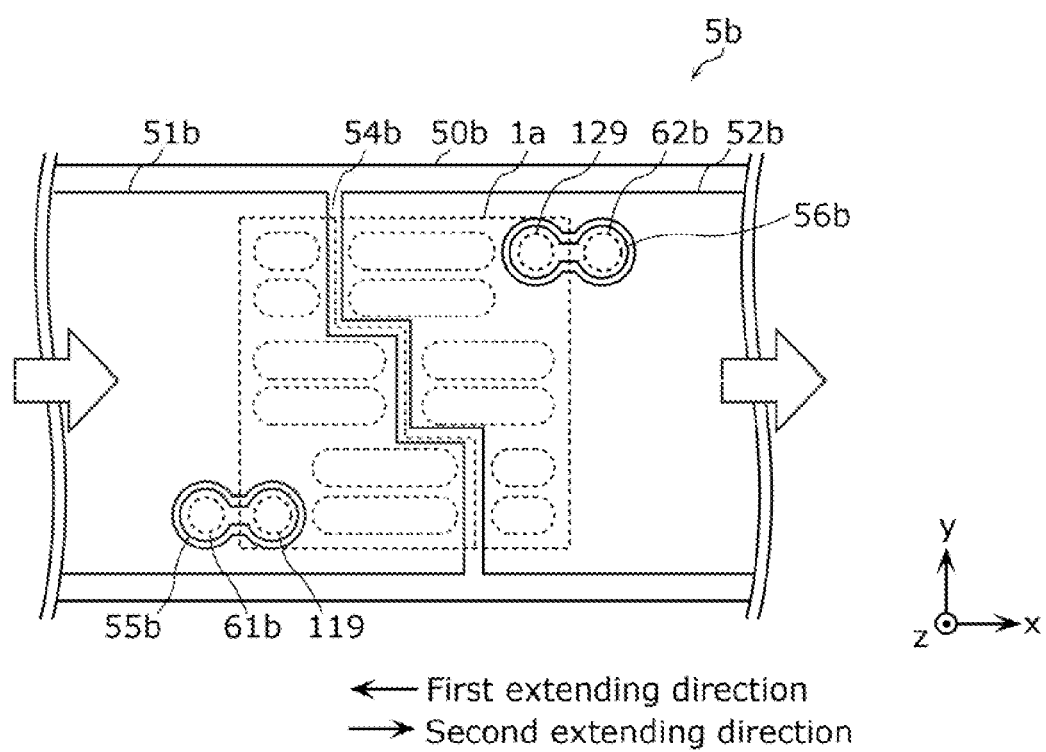
FIG. 16 is a plan view illustrating one example of the structure of the semiconductor module according to Embodiment 2.

FIG. 16 is a plan view illustrating one example of the structure of semiconductor module 5b according to Embodiment 2.

As illustrated in FIG. 16, semiconductor module 5b is semiconductor module 5 according to Embodiment 1 except that semiconductor device 1 has been changed to semiconductor device 1a and mounting substrate 50 has been changed to mounting substrate 50b. In FIG. 16, semiconductor device 1a is drawn with dashed lines as if it were transparent so that the structure of the upper surface of semiconductor device 1a and the structure of the front surface of mounting substrate 50b, which cannot actually be seen, can be illustrated clearly.

Mounting substrate 50b is mounting substrate 50 except that first metal wiring 51 has been changed to first metal wiring 51b, second metal wiring 52 has been changed to second metal wiring 52b, first via 61 has been changed to first via 61b, second via 62 has been changed to second via 62b, metal wiring 55 has been changed to metal wiring 55b, and metal wiring 56 has been changed to metal wiring 56b.

Figure 17:
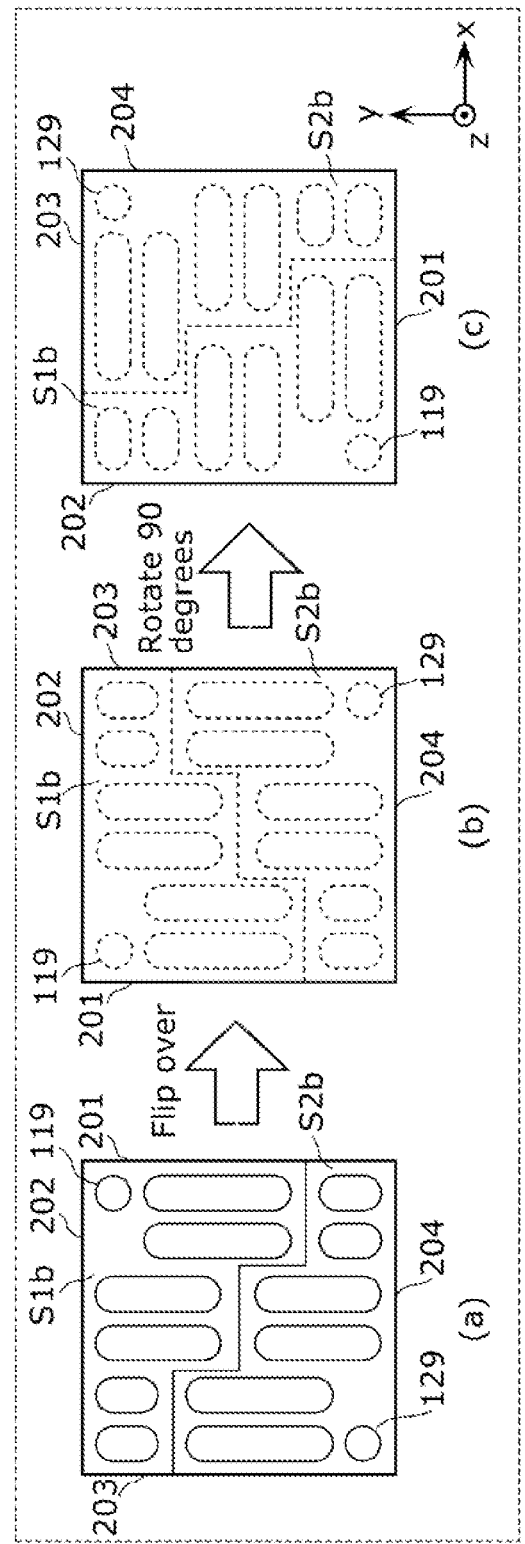
FIG. 17 is a schematic diagram illustrating how the semiconductor device according to Embodiment 2 is face-down mounted on the front surface of the mounting substrate according to Embodiment 2.

FIG. 17 is a schematic diagram illustrating how semiconductor device 1a is face-down mounted on the front surface of mounting substrate 50b. As illustrated in FIG. 17, with the upper surface of semiconductor device 1a facing the positive z-axis direction as illustrated in (a) in FIG. 17, semiconductor device 1a is flipped over with respect to the z-axis as illustrated in (b) in FIG. 17, and further rotated 90 degrees to the left around the z-axis as the axis of rotation as illustrated in (c) in FIG. 17, and then mounted to the front surface of mounting substrate 50b.

Here, semiconductor device 1a is face-down mounted on the front surface of mounting substrate 50b in an orientation such that first side 201 and third side 203 are parallel to the extending directions of the lengthwise direction of mounting substrate 50b (the positive and negative x-axis directions in FIG. 17), and first gate pad 119 is located on the first extending direction (the negative x-axis direction in FIG. 17) side among the extending directions of the lengthwise direction of mounting substrate 50b.

Next, the description of semiconductor module 5b will continue, returning again to FIG. 16.

As illustrated in FIG. 16, mounting substrate 50b includes first via 61b and second via 62b. First via 61b passes through a first conductor (here, metal wiring 55b (to be described later) electrically connected to first gate pad 119, or a conductor electrically connected to metal wiring 55b) electrically connected to first gate pad 119. Second via 62b passes through a second conductor (here, metal wiring 56b (to be described later) electrically connected to second gate pad 129, or a conductor electrically connected to metal wiring 56b) electrically connected to second gate pad 129.

As illustrated in FIG. 16, first metal wiring 51b and second metal wiring 52b are disposed aligned in the extending directions of the lengthwise direction of mounting substrate 50b (the positive and negative x-axis directions in FIG. 16) with clearance 54b therebetween.

First metal wiring 51b is bonded to all of the plurality of first source pads 1111. For example, first metal wiring 51b is bonded to all of the plurality of first source pads 1111 with a conductive bonding material such as solder.

Second metal wiring 52b is bonded to all of the plurality of second source pads 1121. For example, second metal wiring 52b is bonded to all of the plurality of second source pads 1121 with a conductive bonding material such as solder.

Metal wiring 55b is bonded to first gate pad 119. For example, metal wiring 55b is bonded to first gate pad 119 with a conductive bonding material such as solder.

Metal wiring 56b is bonded to second gate pad 129. For example, metal wiring 56b is bonded to second gate pad 129 with a conductive bonding material such as solder.

Accordingly, as illustrated in FIG. 16, semiconductor device 1a will be face-down mounted in a position bridging first metal wiring 51b and second metal wiring 52b across clearance 54b.

[2-3. Observations]

With semiconductor device 1a configured as described above, when two semiconductor devices 1a of the same type are face-down mounted on the mounting substrate, one on the front surface and the other on the rear surface, and are driven on and off at the same time, it is possible to align the position of first gate pad 119 of one semiconductor device 1a with the position of first gate pad 119 of the other semiconductor device 1a and align the position of second gate pad 129 of one semiconductor device 1a with the position of second gate pad 129 of the other semiconductor device 1a by mounting the two semiconductor devices 1a such that in a plan view of the mounting substrate, the centers of the two semiconductor devices 1a overlap and one semiconductor device 1a is rotated 90 degrees relative to the other semiconductor device 1a around an axis of rotation passing through the centers of semiconductor devices 1a and extending perpendicular to the plane of the mounting substrate, i.e., by mounting one semiconductor device 1a in the orientation illustrated in (c) in FIG. 15 and the other semiconductor device 1a in the orientation illustrated in (a) in FIG. 15, or by mounting one semiconductor device 1a in the orientation illustrated in (c) in FIG. 17 and the other semiconductor device 1a in the orientation illustrated in (a) in FIG. 17.

With this configuration, since, on the mounting substrate on which these two semiconductor devices 1a are mounted, common wiring can be used for controlling both the electric potential of first gate pad 119 of one semiconductor device 1a and the electric potential of first gate pad 119 of the other semiconductor device 1a and common wiring can be used for controlling both the electric potential of second gate pad 129 of one semiconductor device 1a and the electric potential of second gate pad 129 of the other semiconductor device 1a, half the wiring (vias) can be used compared to when individual wiring is used.

This makes it possible to secure a wide current path for the main current on the mounting substrate, and thus design a current path for the main current on the mounting substrate that reduces conduction resistance.

In addition, common wiring can be used for controlling the electric potential of both first gate pads 119 and common wiring can be used for controlling the electric potential of both second gate pads 129, reducing the wiring (vias) that conventionally had to be provided individually. The wiring of mounting substrates 50a and 50b, which tends to be complex, can therefore be simplified, which increases the ease of substrate design.

This makes it possible to design a current path for the main current on the mounting substrate that reduces conduction resistance.

Thus, semiconductor device 1a configured as described above makes it possible to provide a semiconductor device having a feature that allows current to flow efficiently in the current path on the mounting substrate on which it is mounted.

As shown in (a) and (c) in FIG. 15 as well as in (a) and (c) in FIG. 17, when two semiconductor devices 1a are mounted on the mounting substrate, one on the front surface and the other on the rear surface, it is possible to overlap first upper surface regions S1a of the two semiconductor devices 1a and overlap second upper surface regions S2a of the two semiconductor devices 1a in a plan view of the mounting substrate by mounting the two semiconductor devices 1a such that in a plan view of the mounting substrate, the centers of the two semiconductor devices 1a overlap and one semiconductor device 1a is rotated 90 degrees relative to the other semiconductor device 1a around an axis of rotation passing through the centers of semiconductor devices 1a and extending perpendicular to the plane of the mounting substrate.

This allows for a relatively wide conduction cross-sectional area of the current path on the mounting substrate on which these two semiconductor devices 1a are mounted.

Figure 18:
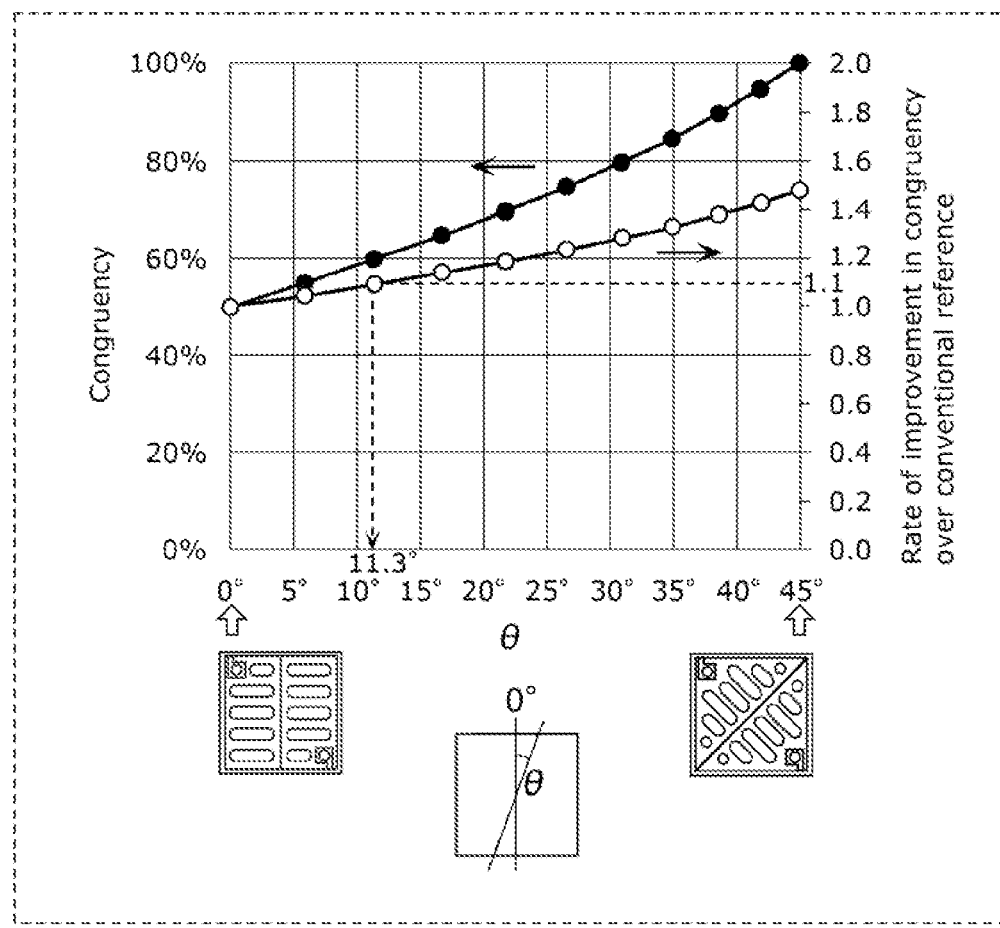
FIG. 18 is a graph illustrating the relationship between congruency and the rate of improvement in congruency over a conventional reference according to Embodiment 2.

FIG. 18 is a graph illustrating the relationship between (1) congruency, which is the degree of overlap in surface area between first upper surface region S1a of one semiconductor device 1a and first upper surface region S1a of the other semiconductor device 1a (i.e., the degree of overlap in surface area between second upper surface region S2a of one semiconductor device 1a and second upper surface region S2a of the other semiconductor device 1a) in a plan view of semiconductor layer 40 (hereinafter also referred to simply as congruency), and (2) the rate of improvement in congruency over a conventional reference, where the conventional reference is Comparative Example 1 illustrated in FIG. 8.

In FIG. 18, the horizontal axis is angle $\theta$ when second virtual straight line 92 of semiconductor device 1a is inclined from the position of the upper surface boundary line in the conventional reference of Comparative Example 1 in FIG. 8, the left vertical axis is congruency, and the right vertical axis is the rate of improvement in congruency over the conventional reference.

In FIG. 18, there is 50% congruency even with how the upper surface boundary lines are disposed ($\theta=0°$) in the conventional reference (Comparative Example 1 in FIG. 8). As $\theta$ increases, the congruency gradually increases from 50% to a maximum of 100% at $\theta=45°$. Here, the rate of improvement in congruency over the conventional reference is based on a reference angle of $\theta=0°$ (1.0), so at $\theta=45°$, the rate of improvement is naturally 2.0. Note that the rate of improvement in congruency over the conventional reference is preferably at least 1.1. The upper surface boundary line is therefore desirably inclined from the reference angle so that angle $\theta$ is at least 11.3 degrees, as illustrated in FIG. 18. Taking margins into consideration, the upper surface boundary line is even more desirably inclined from the reference angle so that $\theta$ is at least 15 degrees. Relating $\theta$ to $\theta1$, $\theta1=45$ degrees+$\theta$. It is therefore desirable for $\theta1$ to be at least 60 degrees, and preferable for $\theta1$ to be between 60 and 90 degrees, inclusive.

When semiconductor device 1a with angle $\theta1$ between 60 and 90 degrees, inclusive, is used for mounting on semiconductor module 5a, the angle between second virtual straight line 92 and the extending directions of the lengthwise direction of mounting substrate 50a (the positive and negative x-axis directions in FIG. 15) is between 45 and 75 degrees, inclusive. When semiconductor device 1a with angle $\theta1$ between 60 and 90 degrees, inclusive, is used for mounting on semiconductor module 5b, the angle between second virtual straight line 92 and the extending directions of the lengthwise direction of mounting substrate 50b (the positive and negative x-axis directions in FIG. 15) is between 15 and 45 degrees, inclusive. Thus, when semiconductor device 1a with angle $\theta1$ between 60 and 90 degrees, inclusive, which is the preferred angle, is used for semiconductor module 5a or semiconductor module 5b, the angle between second virtual straight line 92 and the extending directions of the lengthwise direction of mounting substrate 50a or mounting substrate 50b is between 15 and 75 degrees, inclusive.

Note that although the one or more first source pads 1111 and the one or more second source pads 1121 are exemplified as being arranged as illustrated in FIG. 12 in Embodiment 2, so long as the one or more first source pads 1111 are disposed in first upper surface region S1a and the one or more second source pads 1121 are disposed in second upper surface region S2a, the one or more first source pads 1111 and the one or more second source pads 1121 need not necessarily be arranged as illustrated in FIG. 12.

Figure 19A:
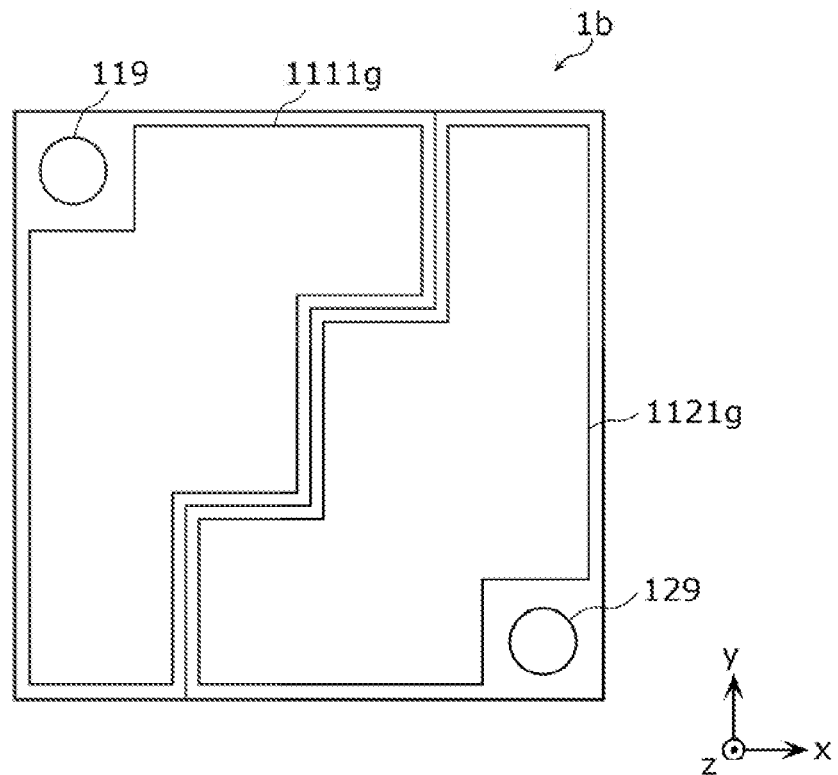
FIG. 19A is a plan view illustrating another arrangement example of first and second source pads according to Embodiment 2.
Figure 19B:
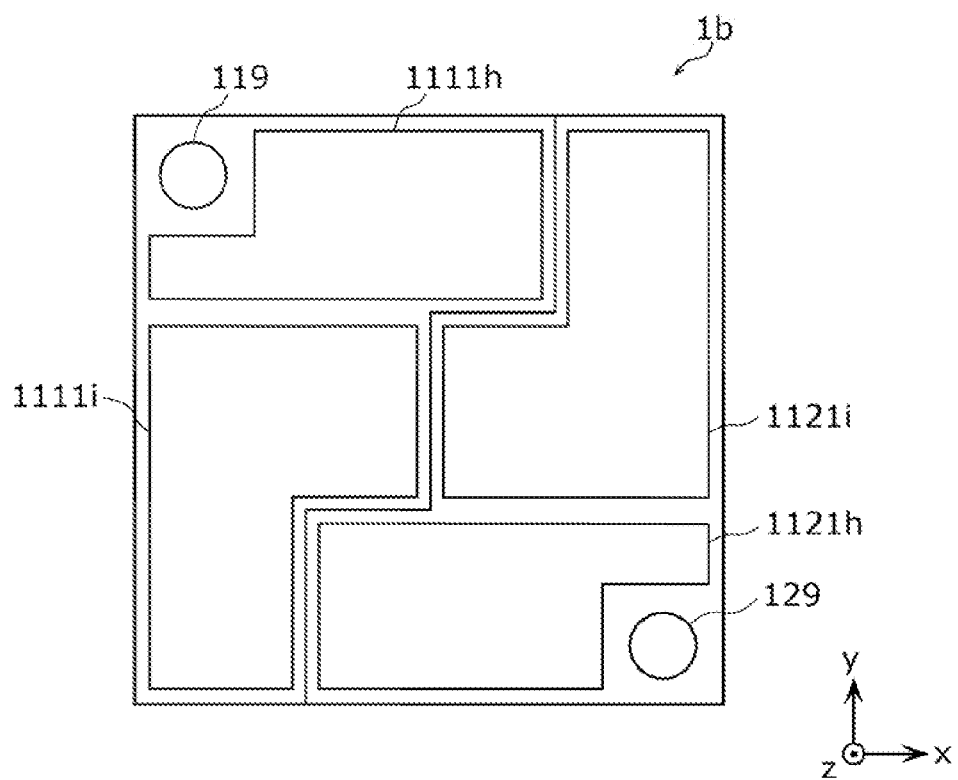
FIG. 19B is a plan view illustrating another arrangement example of the first and second source pads according to Embodiment 2.

FIG. 19A and FIG. 19B are plan views illustrating other arrangement examples of the one or more first source pads 1111 and the one or more second source pads 1121.

As illustrated in FIG. 19A, a single first source pad 1111g may be disposed over approximately the entire surface of first upper surface region S1a excluding the region of first gate pad 119 and a single second source pad 1121g may be disposed over approximately the entire surface of second upper surface region S2a excluding the region of second gate pad 129. As illustrated in FIG. 19B, two first source pads 1111h and 1111i may be disposed over approximately the entire surface of first upper surface region S1a excluding the region of first gate pad 119, in two sections such that opposing sides thereof are parallel to each other, and two second source pads 1121h and 1121i may be disposed over approximately the entire surface of second upper surface region S2a excluding the region of second gate pad 129, in two sections such that opposing sides thereof are parallel to each other.

Embodiment 3

[3-1. Semiconductor Device Structure]

Hereinafter, the semiconductor device according to Embodiment 3 will be described. The semiconductor device according to Embodiment 3 is semiconductor device 1 according to Embodiment 1 with some configuration changes. Accordingly, detailed description of aspects of the semiconductor device according to Embodiment 3 that are the same as semiconductor device 1 will be omitted as they have already been described above. Moreover, elements that are the same as in semiconductor device 1 have the same reference signs. Hereinafter, description will focus on the points of differences from semiconductor device 1.

Figure 20:
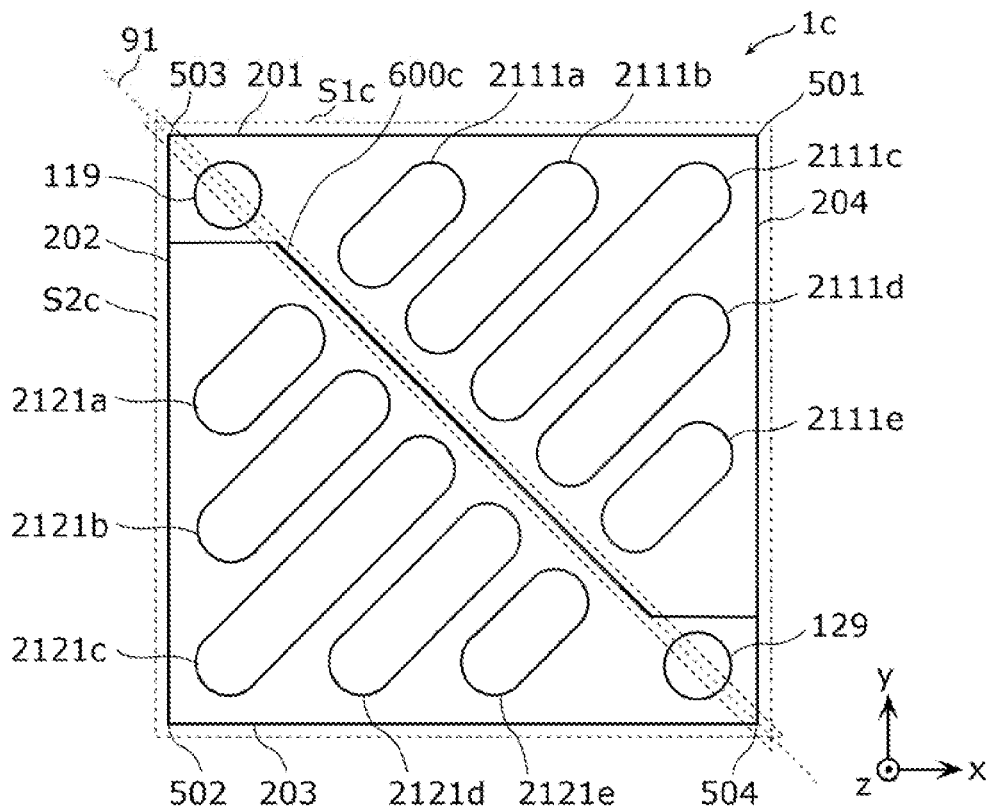
FIG. 20 is a plan view illustrating one example of the structure of a semiconductor device according to Embodiment 3.
Figure 21:
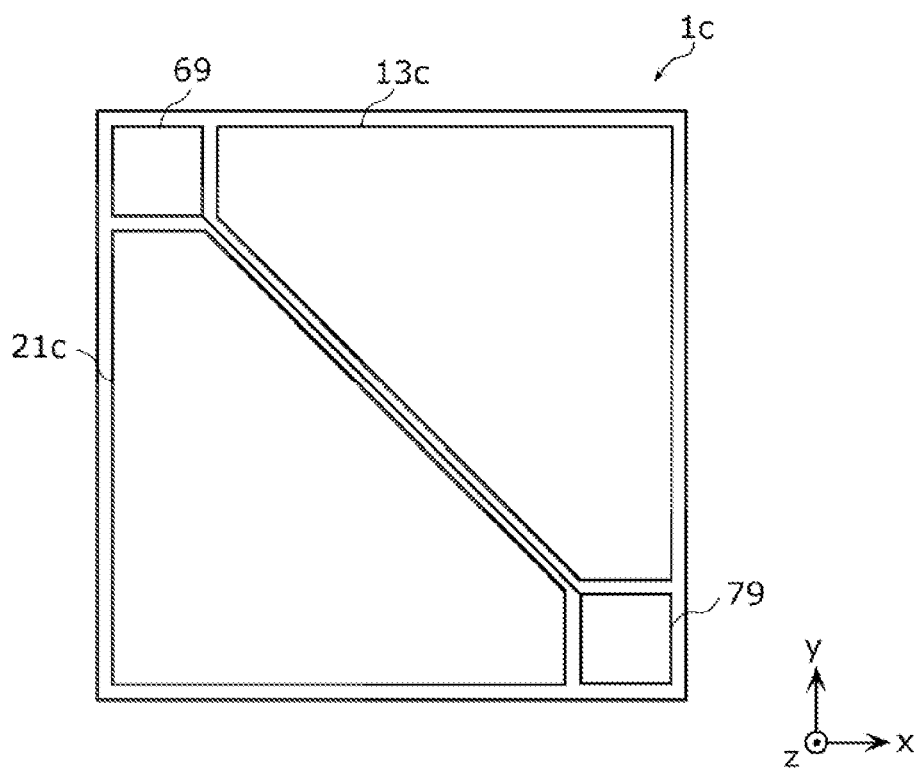
FIG. 21 is a plan view illustrating one example of the structure of the semiconductor device according to Embodiment 3.

FIG. 20 is a plan view illustrating one example of the structure of semiconductor device 1c according to Embodiment 3. FIG. 21 is a plan view illustrating one example of the structure of semiconductor device 1c. In FIG. 21, illustration of the structures between the upper surface of semiconductor device 1c and portions 13c and 23c (to be described later) is omitted so as to expose portions 13c and 23c for illustrative purposes.

As illustrated in FIG. 20 and FIG. 21, semiconductor device 1c is semiconductor device 1 according to Embodiment 1 except that first upper surface region S1 has been changed to first upper surface region S1c, second upper surface region S2 has been changed to second upper surface region S2c, upper surface boundary line 600 has been changed to upper surface boundary line 600c, the one or more first source pads 111 have been changed to one or more first source pads 2111 (first source pads 2111a, 2111b, 2111c, 2111d, and 2111e in this example), the one or more second source pads 121 have been changed to one or more second source pads 2121 (second source pads 2121a, 2121b, 2121c, 2121d, and 2121e in this example), portion 13 has been changed to portion 13c, and portion 23 has been changed to portion 23c.

As illustrated in FIG. 20, in a plan view of semiconductor layer 40, upper surface boundary line 600c, which is the boundary line between first upper surface region Sic and second upper surface region S2c, is a line segment connecting third vertex 503 and fourth vertex 504. In other words, in a plan view of semiconductor layer 40, first upper surface region S1c and second upper surface region S2c divide semiconductor layer 40 into two equal parts in terms of surface area along the line segment connecting third vertex 503 and fourth vertex 504.

Moreover, in accordance with the change in the shape of first upper surface region S1c from the shape of first upper surface region S1 according to Embodiment 1 and the change in the shape of second upper surface region S2c from the shape of second upper surface region S2 according to Embodiment 1, the shape of portion 13c has been changed from the shape of portion 13 according to Embodiment 1, and the shape of portion 23c has been changed from the shape of portion 23 according to Embodiment 1, as illustrated in FIG. 21.

[3-2. Semiconductor Module Structure]

Hereinafter, the semiconductor module according to Embodiment 3 will be described. The semiconductor module according to Embodiment 3 is semiconductor module 5 according to Embodiment 1 with some configuration changes. Accordingly, detailed description of aspects of the semiconductor module according to Embodiment 3 that are the same as semiconductor module 5 will be omitted as they have already been described above. Moreover, elements that are the same as in semiconductor module 5 have the same reference signs. Hereinafter, description will focus on the points of differences from semiconductor module 5.

Figure 22:
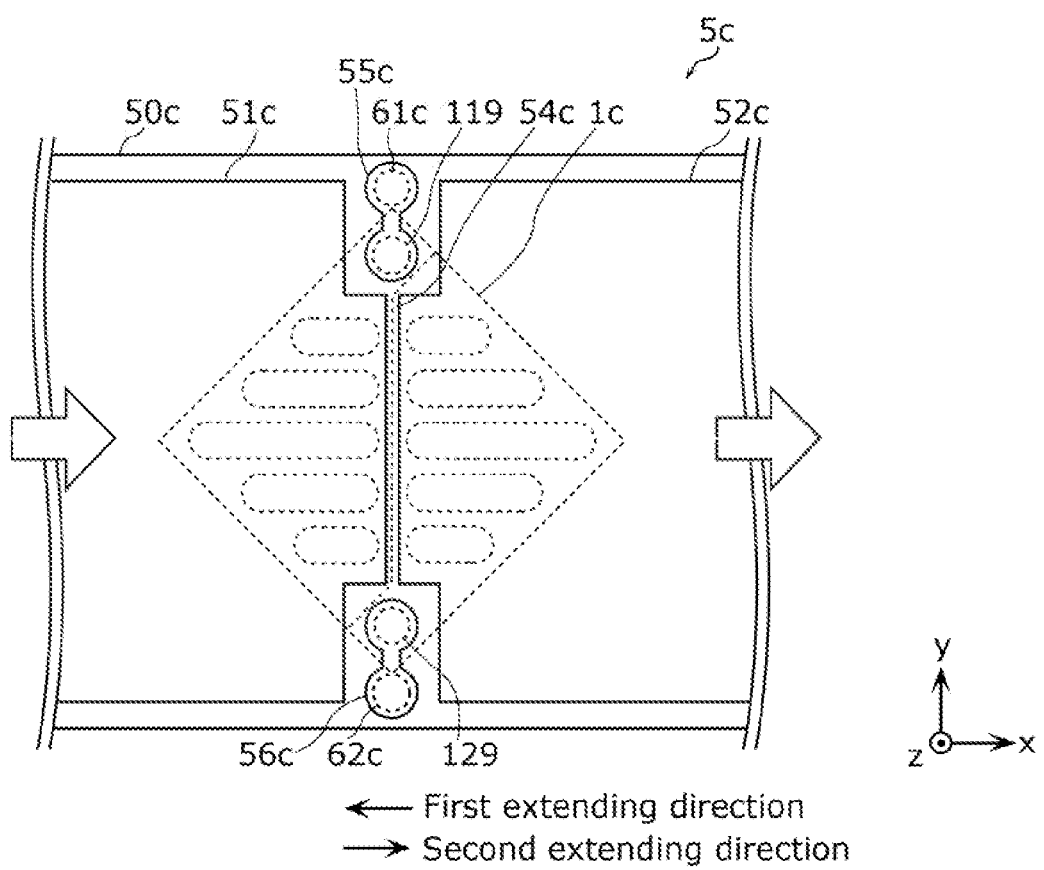
FIG. 22 is a plan view illustrating one example of the structure of a semiconductor module according to Embodiment 3.

FIG. 22 is a plan view illustrating one example of the structure of semiconductor module 5c according to Embodiment 3.

As illustrated in FIG. 22, semiconductor module 5c is semiconductor module 5 according to Embodiment 1 except that semiconductor device 1 has been changed to semiconductor device 1c and mounting substrate 50 has been changed to mounting substrate 50c. In FIG. 22, semiconductor device 1c is drawn with dashed lines as if it were transparent so that the structure of the upper surface of semiconductor device 1c and the structure of the front surface of mounting substrate 50c, which cannot actually be seen, can be illustrated clearly.

Mounting substrate 50c is mounting substrate 50 except that first metal wiring 51 has been changed to first metal wiring 51c, second metal wiring 52 has been changed to second metal wiring 52c, first via 61 has been changed to first via 61c, second via 62 has been changed to second via 62c, metal wiring 55 has been changed to metal wiring 55c, and metal wiring 56 has been changed to metal wiring 56c.

As illustrated in FIG. 22, in a plan view of semiconductor layer 40, semiconductor device 1c is face-down mounted on the front surface of mounting substrate 50c in an orientation in which the angle between each side of semiconductor device 1c and the extending directions of the lengthwise direction of mounting substrate 50c is 45 degrees.

As illustrated in FIG. 22, mounting substrate 50c includes first via 61c and second via 62c. First via 61c passes through a first conductor (here, metal wiring 55c (to be described later) electrically connected to first gate pad 119, or a conductor electrically connected to metal wiring 55c) electrically connected to first gate pad 119. Second via 62c passes through a second conductor (here, metal wiring 56c (to be described later) electrically connected to second gate pad 129, or a conductor electrically connected to metal wiring 56c) electrically connected to second gate pad 129.

As illustrated in FIG. 22, first metal wiring 51c and second metal wiring 52c are disposed aligned in the extending directions of the lengthwise direction of mounting substrate 50c (the positive and negative x-axis directions in FIG. 22) with clearance 54c therebetween.

First metal wiring 51c is bonded to all of the plurality of first source pads 2111. For example, first metal wiring 51c is bonded to all of the plurality of first source pads 2111 with a conductive bonding material such as solder.

Second metal wiring 52c is bonded to all of the plurality of second source pads 2121. For example, second metal wiring 52c is bonded to all of the plurality of second source pads 2121 with a conductive bonding material such as solder.

Metal wiring 55c is bonded to first gate pad 119. For example, metal wiring 55c is bonded to first gate pad 119 with a conductive bonding material such as solder.

First via 61c is disposed in clearance 54c. First gate pad 119 is also is disposed in clearance 54c. Metal wiring 55c is therefore also disposed in clearance 54c.

Metal wiring 56c is bonded to second gate pad 129. For example, metal wiring 56c is bonded to second gate pad 129 with a conductive bonding material such as solder.

Second via 62c is disposed in clearance 54c. Second gate pad 129 is also is disposed in clearance 54c. Metal wiring 56c is therefore also disposed in clearance 54c.

Accordingly, as illustrated in FIG. 22, semiconductor device 1c will be face-down mounted in a position bridging first metal wiring 51c and second metal wiring 52c across clearance 54c.

[3-3. Observations]

As illustrated in FIG. 22, with semiconductor device 1c configured as described above, by face-down mounting semiconductor device 1c on the front surface of the mounting substrate in an orientation in which upper surface boundary line 600c, i.e., first virtual straight line 91 is orthogonal to the extending directions of the lengthwise direction of mounting substrate 50c in a plan view of semiconductor layer 40, the width of the mounting substrate can be maximally and effectively utilized to bond the metal wiring of the mounting substrate and the source pads of semiconductor device 1c. When internal boundary line 400 and upper surface boundary line 600c coincide in a plan view of semiconductor layer 20, even though semiconductor device 1c has the same square shape and surface area as in Embodiments 1 and 2, semiconductor device 1c is characterized in that the inside thereof can be utilized maximally to the broadest extent as a conducting path, owing to the shape of upper surface boundary line 600c and the locations of the gate pads of semiconductor device 1c. Stated differently, Embodiment 3 is suitable for high-current applications, and the conduction resistance, including substrate wiring and semiconductor device 1c, can be lowered. Furthermore, when semiconductor device 1c is used as illustrated in FIG. 22, the current that flows in from first metal wiring 51c can flow in from two sides of semiconductor device 1c, and the current that flows out to second metal wiring 52c can flow out from two sides of semiconductor device 1c, making it very suitable for high-current applications.

This makes it possible to design a current path for the high current on the mounting substrate that reduces conduction resistance.

Thus, semiconductor device 1c configured as described above makes it possible to provide a semiconductor device having a feature that allows current to flow efficiently in the current path on the mounting substrate on which it is mounted.

Note that although the one or more first source pads 2111 and the one or more second source pads 2121 are exemplified as being arranged as illustrated in FIG. 20 in Embodiment 3, so long as the one or more first source pads 2111 are disposed in first upper surface region S1c and the one or more second source pads 2121 are disposed in second upper surface region S2c, the one or more first source pads 2111 and the one or more second source pads 2121 need not necessarily be arranged as illustrated in FIG. 20.

FIG. 23A, FIG. 23B, FIG. 23C, FIG. 23D, and FIG. 23E are plan views illustrating other arrangement examples of the one or more first source pads 2111 and the one or more second source pads 2121.

Figure 23A:
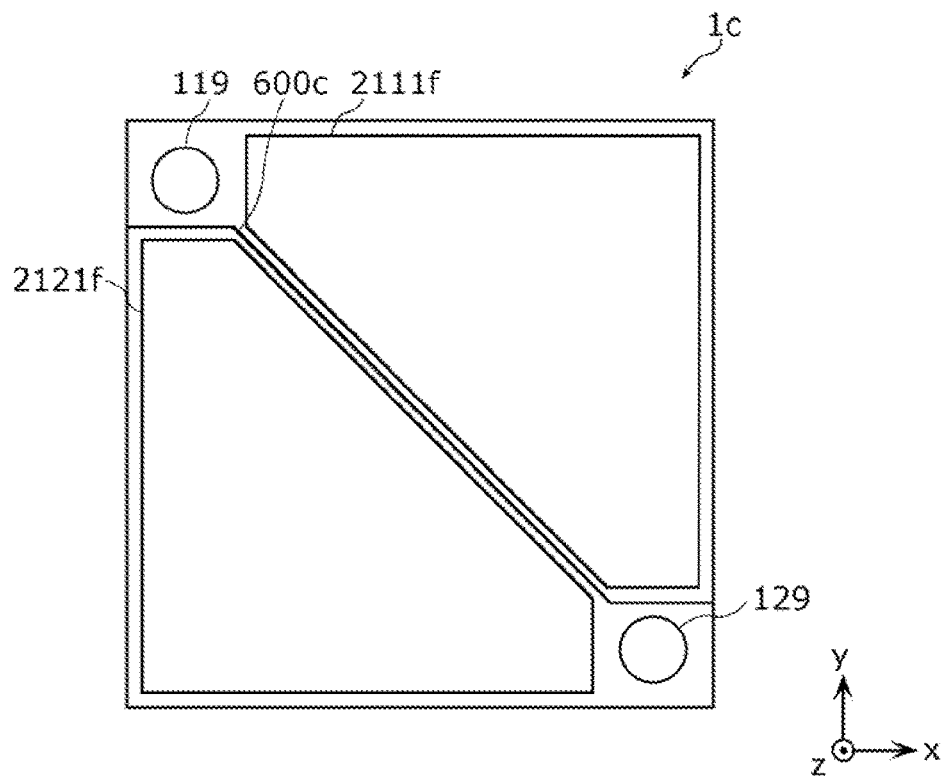
FIG. 23A is a plan view illustrating another arrangement example of first and second source pads according to Embodiment 3.
Figure 23B:
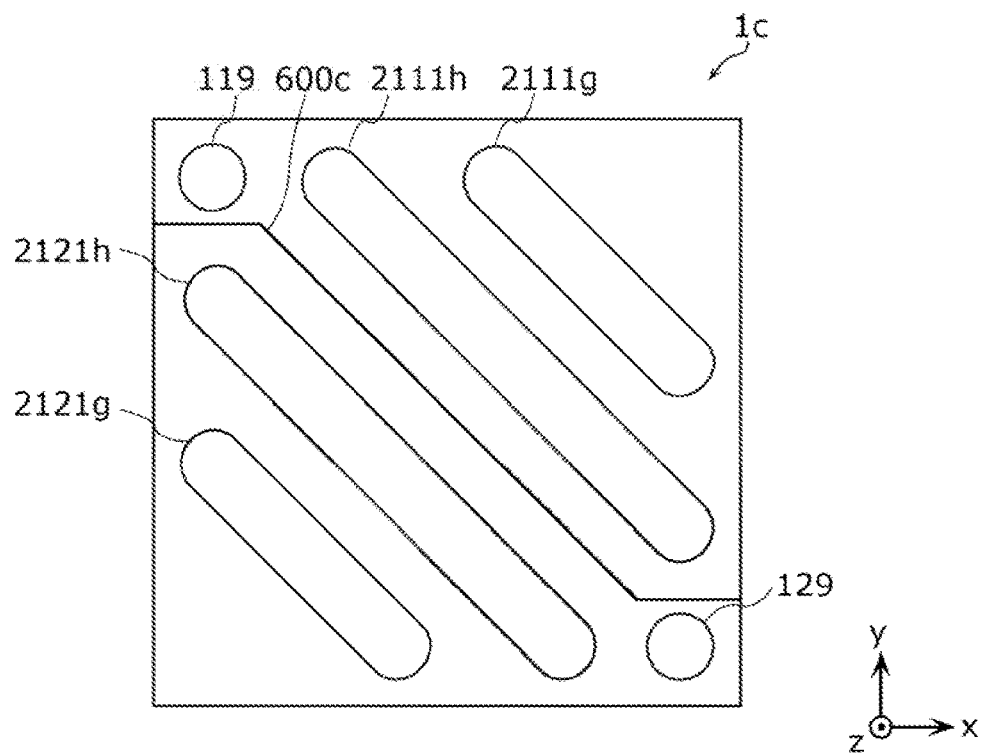
FIG. 23B is a plan view illustrating another arrangement example of the first and second source pads according to Embodiment 3.
Figure 23C:
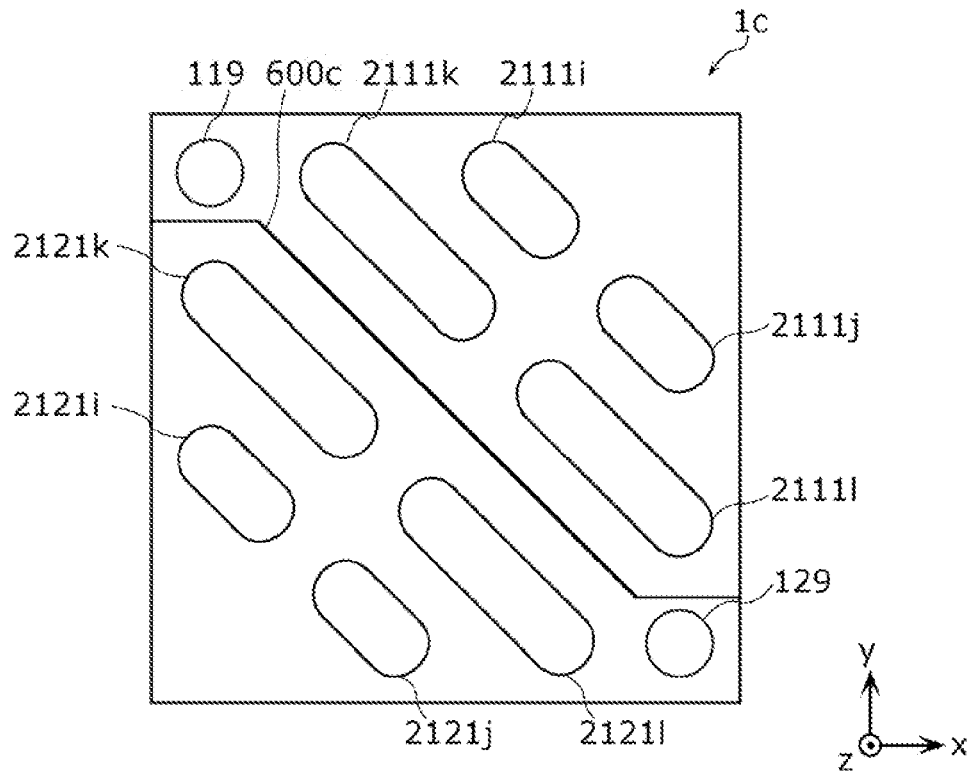
FIG. 23C is a plan view illustrating another arrangement example of the first and second source pads according to Embodiment 3.
Figure 23D:
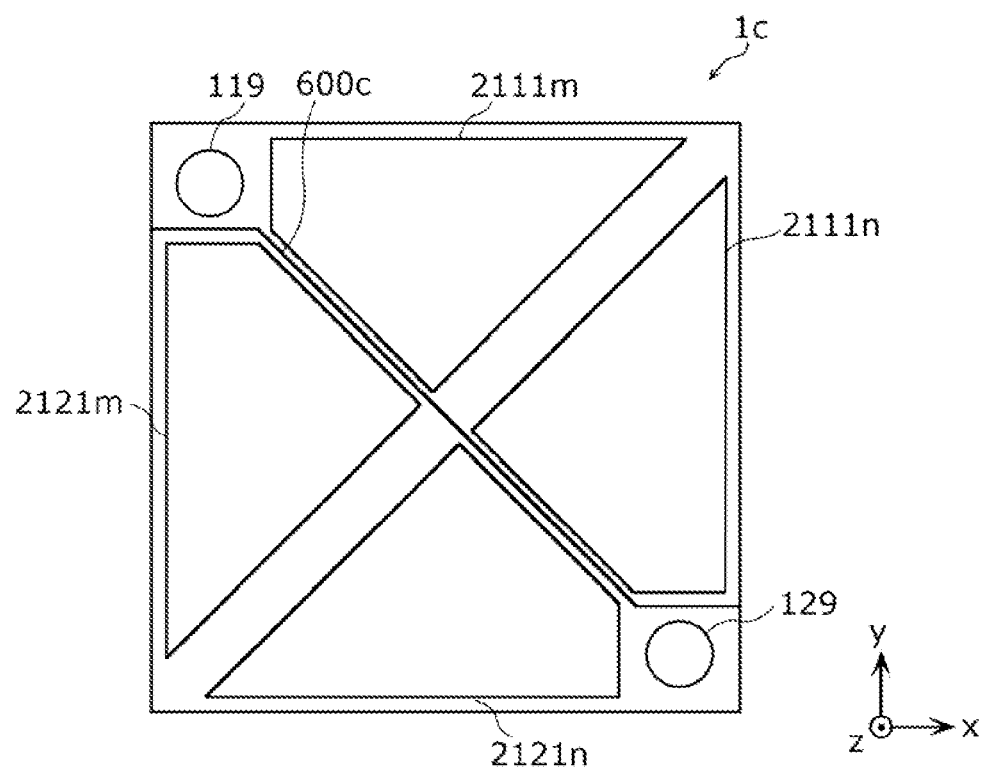
FIG. 23D is a plan view illustrating another arrangement example of the first and second source pads according to Embodiment 3.
Figure 23E:
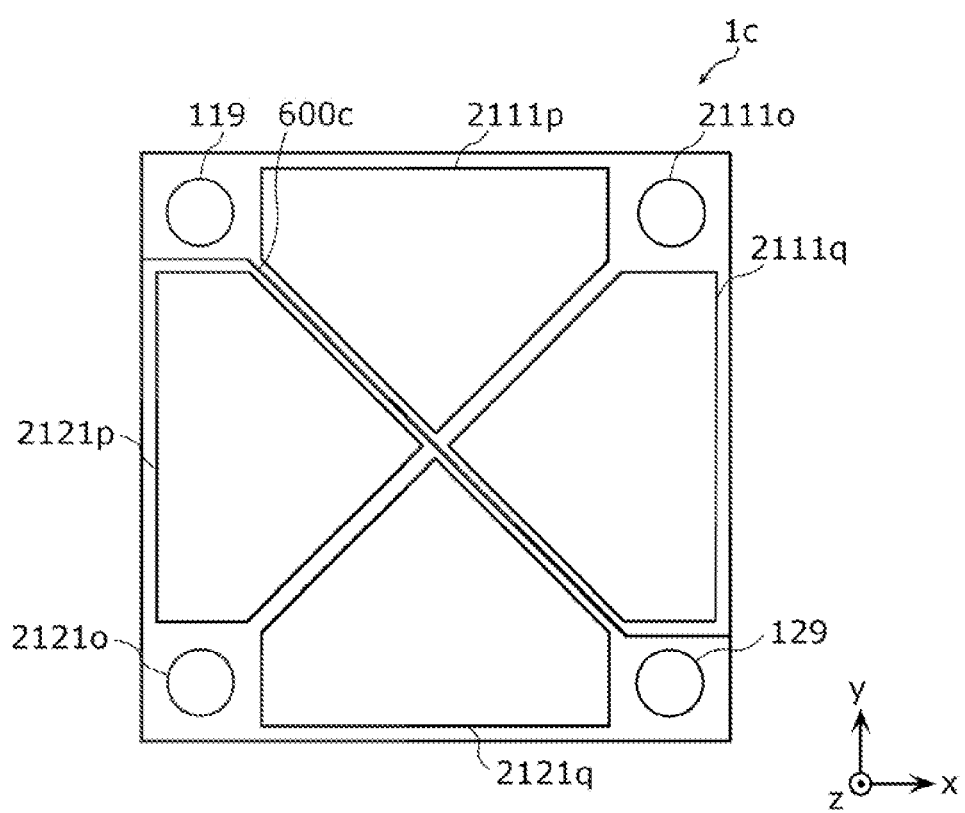
FIG. 23E is a plan view illustrating another arrangement example of the first and second source pads according to Embodiment 3.

As illustrated in FIG. 23A, a single first source pad 2111f may be disposed over approximately the entire surface of first upper surface region Sic excluding the region of first gate pad 119 and a single second source pad 2121f may be disposed over approximately the entire surface of second upper surface region S2c excluding the region of second gate pad 129. As illustrated in FIG. 23B, a plurality of first source pads 2111g through 2111h may be disposed in first upper surface region S1c, parallel to upper surface boundary line 600c, and a plurality of second source pads 2121g through 2121h may be disposed in second upper surface region S2c, parallel to upper surface boundary line 600c. As illustrated in FIG. 23C, a plurality of first source pads 2111i through 2111l may be disposed in first upper surface region S1c, in two sections, parallel to upper surface boundary line 600c, and a plurality of second source pads 2121i through 2121l may be disposed in second upper surface region S2c, in two sections, parallel to upper surface boundary line 600c. As illustrated in FIG. 23D, two first source pads 2111m and 2111n may be disposed over approximately the entire surface of first upper surface region S1c excluding the region of first gate pad 119, in two sections such that opposing sides thereof are orthogonal to upper surface boundary line 600c, and two second source pads 2121m and 2121n may be disposed over approximately the entire surface of second upper surface region S2c excluding the region of second gate pad 129, in two sections such that opposing sides thereof are orthogonal to upper surface boundary line 600c. As illustrated in FIG. 23E, in a plan view of semiconductor layer 40, a plurality of first source pads 2111o through 2111q may be disposed and shaped in first upper surface region S1c and a plurality of second source pads 2121o through 2121q may be disposed and shaped in second upper surface region S2c such that first source pad 2111p, first source pad 2111q, second source pad 2121q, and second source pad 2121p overlap and first gate pad 119, first source pad 2111o, second gate pad 129, and second source pad 2121o overlap each 90 degree rotation of semiconductor device 1c about the center of semiconductor device 1c as the axis of rotation.

Embodiment 4

[4-1. Semiconductor Device Structure]

Hereinafter, the semiconductor device according to Embodiment 4 will be described. The semiconductor device according to Embodiment 4 is semiconductor device 1 according to Embodiment 1 with some configuration changes. Accordingly, detailed description of aspects of the semiconductor device according to Embodiment 4 that are the same as semiconductor device 1 will be omitted as they have already been described above. Moreover, elements that are the same as in semiconductor device 1 have the same reference signs. Hereinafter, description will focus on the points of differences from semiconductor device 1.

Figure 24:
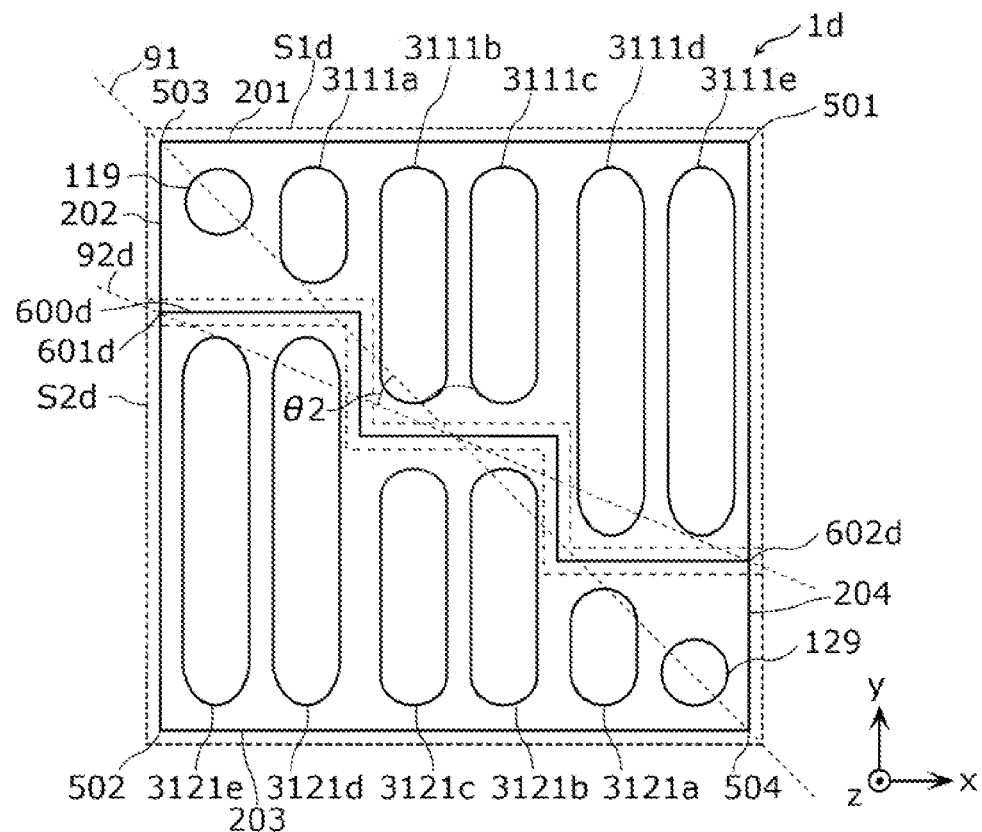
FIG. 24 is a plan view illustrating one example of the structure of a semiconductor device according to Embodiment 4.
Figure 25:
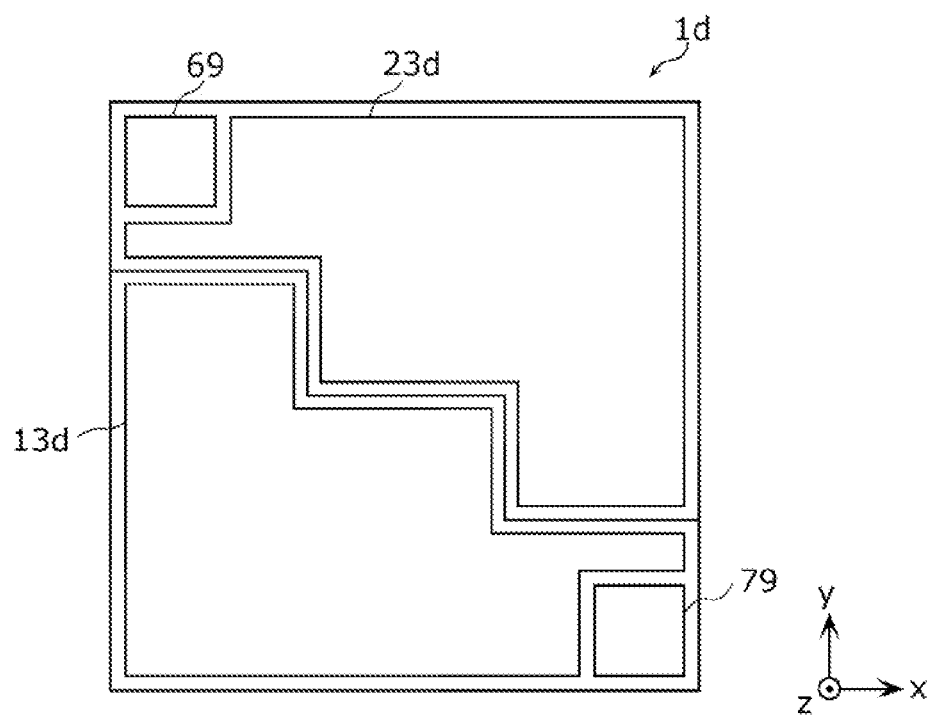
FIG. 25 is a plan view illustrating one example of the structure of the semiconductor device according to Embodiment 4.

FIG. 24 is a plan view illustrating one example of the structure of semiconductor device 1d according to Embodiment 4. FIG. 25 is a plan view illustrating one example of the structure of semiconductor device 1d. In FIG. 25, illustration of the structures between the upper surface of semiconductor device 1d and portions 13d and 23d (to be described later) is omitted so as to expose portions 13d and 23d for illustrative purposes.

As illustrated in FIG. 24 and FIG. 25, semiconductor device 1d is semiconductor device 1 according to Embodiment 1 except that first upper surface region S1 has been changed to first upper surface region S1d, second upper surface region S2 has been changed to second upper surface region S2d, upper surface boundary line 600 has been changed to upper surface boundary line 600d, the one or more first source pads 111 have been changed to one or more first source pads 3111 (first source pads 3111a, 3111b, 3111c, 3111d, and 3111e in this example), the one or more second source pads 121 have been changed to one or more second source pads 3121 (second source pads 3121a, 3121b, 3121c, 3121d, and 3121e in this example), portion 13 has been changed to portion 13d, and portion 23 has been changed to portion 23d.

As illustrated in FIG. 24, in a plan view of semiconductor layer 40, upper surface boundary line 600d, which is the boundary line between first upper surface region S1d and second upper surface region S2d, consists of alternately connected N−1 (N is an integer greater than or equal to three; in this example, N is four) line segments parallel to first side 201 and N−2 line segments parallel to second side 202, and monotonically changes in the direction in which second side 202 extends and the direction in which first side 201 extends.

The distance between third vertex 503 and first intersection 601d, which is the intersection of upper surface boundary line 600d and second side 202, is greater than or equal to 1/N of the length of second side 202 and greater than the maximum diameter of first gate pad 119.

The distance between fourth vertex 504 and second intersection 602d, which is the intersection of upper surface boundary line 600d and fourth side 204, is greater than or equal to 1/N of the length of fourth side 204 and greater than the maximum diameter of second gate pad 129.

As illustrated in FIG. 24, first upper surface region S1d and second upper surface region S2d are adjacent to each other in a plan view of semiconductor layer 40 and divide semiconductor layer 40 into two equal parts in terms of surface area.

In a plan view of semiconductor layer 40, angle θ2 between second virtual straight line 92d, which connects first intersection 601d and second intersection 602d, and first virtual straight line 91 is greater than or equal to 0 degrees and less than 45 degrees.

As illustrated in FIG. 24, the one or more first source pads 3111 are provided in plurality, and in a plan view of semiconductor layer 40, the plurality of first source pads 3111 are each a rectangle or an oval whose lengthwise direction is parallel to second side 202, and are arranged in a striped pattern parallel to second side 202. The one or more second source pads 3121 are provided in plurality, and in a plan view of semiconductor layer 40, the plurality of second source pads 3121 are each a rectangle or an oval whose lengthwise direction is parallel to fourth side 204, and are arranged in a striped pattern parallel to fourth side 204.

Moreover, in accordance with the change in the shape of first upper surface region S1d from the shape of first upper surface region S1 according to Embodiment 1 and the change in the shape of second upper surface region S2d from the shape of second upper surface region S2 according to Embodiment 1, the shape of portion 13d has been changed from the shape of portion 13 according to Embodiment 1, and the shape of portion 23d has been changed from the shape of portion 23 according to Embodiment 1, as illustrated in FIG. 25.

[4-2. Semiconductor Module Structure]

Hereinafter, the semiconductor module according to Embodiment 4 will be described. The semiconductor module according to Embodiment 4 is semiconductor module 5c according to Embodiment 3 with some configuration changes. Accordingly, detailed description of aspects of the semiconductor module according to Embodiment 4 that are the same as semiconductor module 5c will be omitted as they have already been described above. Moreover, elements that are the same as in semiconductor module 5c have the same reference signs. Hereinafter, description will focus on the points of differences from semiconductor module 5c.

Figure 26:
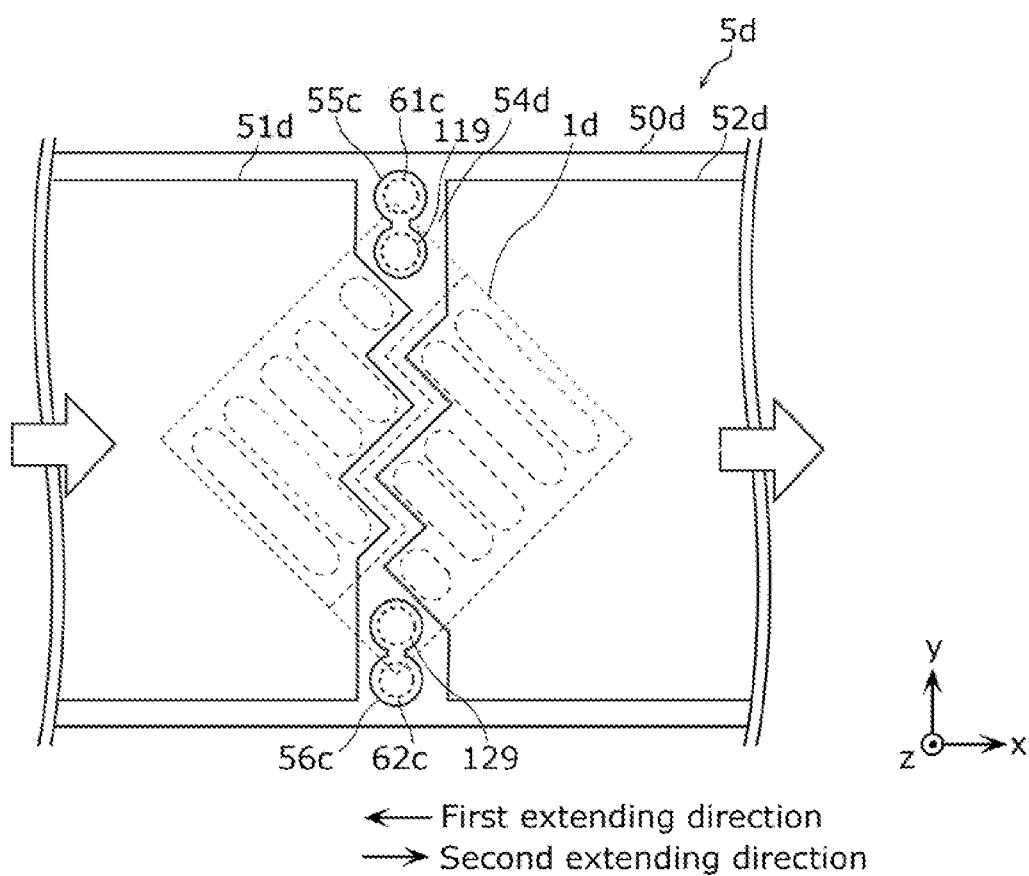
FIG. 26 is a plan view illustrating one example of the structure of a semiconductor module according to Embodiment 4.

FIG. 26 is a plan view illustrating one example of the structure of semiconductor module 5d according to Embodiment 4.

As illustrated in FIG. 26, semiconductor module 5d is semiconductor module 5c according to Embodiment 3 except that semiconductor device 1c has been changed to semiconductor device 1d and mounting substrate 50c has been changed to mounting substrate 50d. In FIG. 26, semiconductor device 1d is drawn with dashed lines as if it were transparent so that the structure of the upper surface of semiconductor device 1d and the structure of the front surface of mounting substrate 50d, which cannot actually be seen, can be illustrated clearly.

Mounting substrate 50d is mounting substrate 50 except that first metal wiring 51 has been changed to first metal wiring 51d and second metal wiring 52 has been changed to second metal wiring 52d.

As illustrated in FIG. 26, first metal wiring 51d and second metal wiring 52d are disposed aligned in the extending directions of the lengthwise direction of mounting substrate 50d (the positive and negative x-axis directions in FIG. 26) with clearance 54d therebetween.

First metal wiring 51d is bonded to all of the plurality of first source pads 3111. For example, first metal wiring 51d is bonded to all of the plurality of first source pads 3111 with a conductive bonding material such as solder.

Second metal wiring 52d is bonded to all of the plurality of second source pads 3121. For example, second metal wiring 52d is bonded to all of the plurality of second source pads 3121 with a conductive bonding material such as solder.

Accordingly, as illustrated in FIG. 26, semiconductor device 1d will be face-down mounted in a position bridging first metal wiring 51d and second metal wiring 52d across clearance 54d.

[4-3. Observations]

As illustrated in FIG. 26, with semiconductor device 1d configured as described above, by face-down mounting semiconductor device 1d on the front surface of the mounting substrate in an orientation in which first virtual straight line 91 is orthogonal to the extending directions of the lengthwise direction of mounting substrate 50d in a plan view of semiconductor layer 40, the width of the mounting substrate can be effectively utilized to bond the metal wiring of the mounting substrate and the source pads of semiconductor device 1d. When internal boundary line 400 and upper surface boundary line 600d coincide in a plan view of semiconductor layer 20, even though semiconductor device 1d has the same square shape and surface area as in Embodiments 1 and 2, semiconductor device 1d is characterized in that the inside thereof can be utilized maximally to the broadest extent as a conducting path, owing to the shape of upper surface boundary line 600d and the locations of the gate pads of semiconductor device 1d. Stated differently, Embodiment 4 is suitable for high-current applications, and the conduction resistance, including substrate wiring and semiconductor device 1d, can be lowered. Furthermore, when semiconductor device 1d is used as illustrated in FIG. 26, the current that flows in from first metal wiring 51d can flow in from two sides of semiconductor device 1d, and the current that flows out to second metal wiring 52d can flow out from two sides of semiconductor device 1d, making it very suitable for high-current applications.

This makes it possible to design a current path for the high current on the mounting substrate that reduces conduction resistance.

Thus, semiconductor device 1d configured as described above makes it possible to provide a semiconductor device having a feature that allows current to flow efficiently in the current path on the mounting substrate on which it is mounted.

Next, the preferred range of angle θ2 will be considered. Here, a case where semiconductor device 1d is square and upper surface boundary line 600d coincides with internal boundary line 400 in a plan view of semiconductor layer 40 will be considered.

Figure 27:
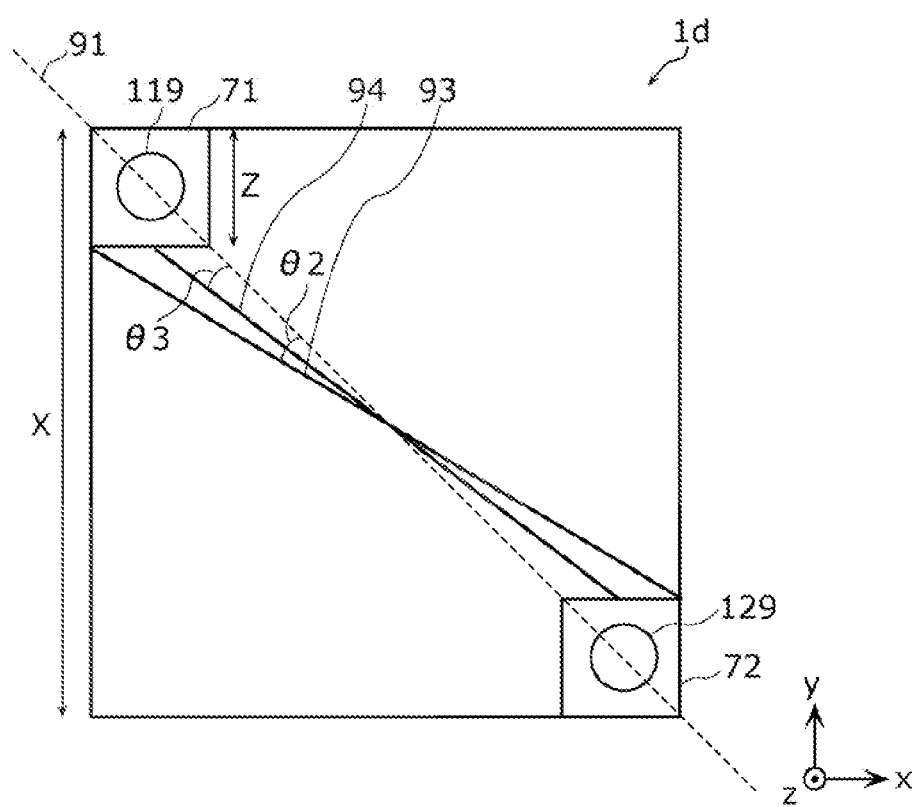
FIG. 27 is a plan view of the semiconductor device according to Embodiment 4.

FIG. 27 is a plan view of semiconductor device 1d.

In FIG. 27, first control region 71 and second control region 72 are square regions. Each side of first control region 71 and second control region 72 has a length Z. First gate pad 119 is disposed in first control region 71, and second gate pad 129 is disposed in second control region 72.

In semiconductor module 5d, in order to reduce the on-resistance of semiconductor device 1d as much as possible, opposing line segment 93 on the upper surface of semiconductor device 1d, which is the line segment of second virtual straight line 92 excluding the portions in first control region 71 and second control region 72, is desirably longer than the length X of each side of semiconductor layer 40.

Line segment 94 in FIG. 27 is a virtual line segment having a length X that connects the boundary of first control region 71 and the boundary of second control region 72.

As illustrated in FIG. 27, in order for opposing line segment 93 to be longer than line segment 94, angle θ2 must be greater than angle θ3 that line segment 94 forms with first virtual straight line 91.

Figure 28:
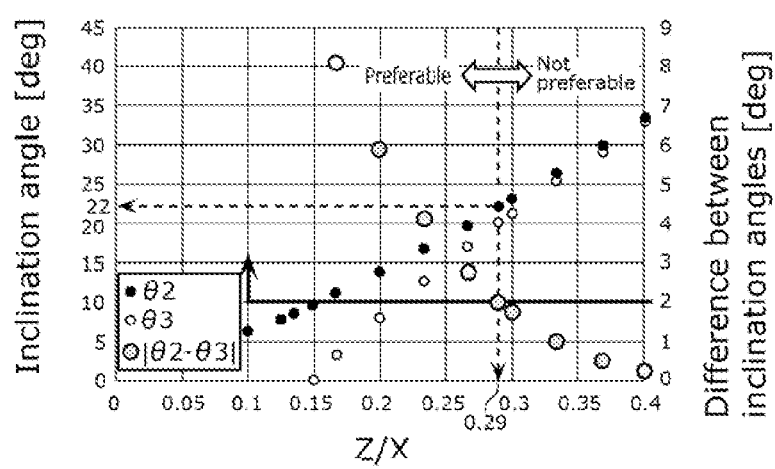
FIG. 28 is a graph illustrating the relationship between the ratio Z/X and angles $\theta 2$ and $\theta 3$.

FIG. 28 is a graph illustrating the relationship between (i) the ratio Z/X of the length X of each side of semiconductor device 1d and the length Z of each side of the control regions (first control region 71 and second control region 72; hereinafter this ratio is also referred to as ratio Z/X), and (ii) angles θ2 and θ3.

In FIG. 28, the horizontal axis is Z/X, the first vertical axis is the angle (inclination angle) of angles θ2 and θ3, and the second vertical axis is the absolute value of the difference between angles θ2 and θ3 (the difference between inclination angles), |θ2−θ3|.

As illustrated in FIG. 28, as the ratio Z/X increases, the difference between angle θ2 and angle θ3 decreases and the absolute values of both angle θ2 and angle θ3 increase, which weakens the advantageous effect of effectively utilizing the width of the mounting substrate to bond the metal wiring of the mounting substrate to the source pad of semiconductor device 1d.

As a result of repeated experiments and examination, the inventors discovered that a region where the ratio Z/X in FIG. 28 is smaller than 0.29 is preferable from the viewpoint of achieving the above advantageous effect. This corresponds to the region where |θ2−θ3| is less than two degrees in FIG. 28. Opposing line segment 93 originally refers to upper surface boundary line 600, and upper surface boundary line 600 may have an essentially finite width in a plan view. When a virtual line segment is drawn from the center of semiconductor device 1d to the intersection of the outer circumference of semiconductor device 1d and upper surface boundary line 600, there is a variation of approximately two degrees in this virtual line segment for the finite width of upper surface boundary line 600. Due to this, if |θ2−θ3| is less than two degrees, it is substantially difficult to distinguish between opposing line segment 93 and line segment 94, so it is preferable that |θ2−θ3| be two degrees or more. As illustrated in FIG. 28, the region where the ratio Z/X is smaller than 0.29 corresponds to the region where θ2 is between 0 and 22 degrees, inclusive.

Angle θ2 is therefore preferably between 0 and 22 degrees, inclusive.

Note that although the one or more first source pads 3111 and the one or more second source pads 3121 are exemplified as being arranged as illustrated in FIG. 24 in Embodiment 4, so long as the one or more first source pads 3111 are disposed in first upper surface region S1d and the one or more second source pads 3121 are disposed in second upper surface region S2d, the one or more first source pads 3111 and the one or more second source pads 3121 need not necessarily be arranged as illustrated in FIG. 24.

Figure 29A:
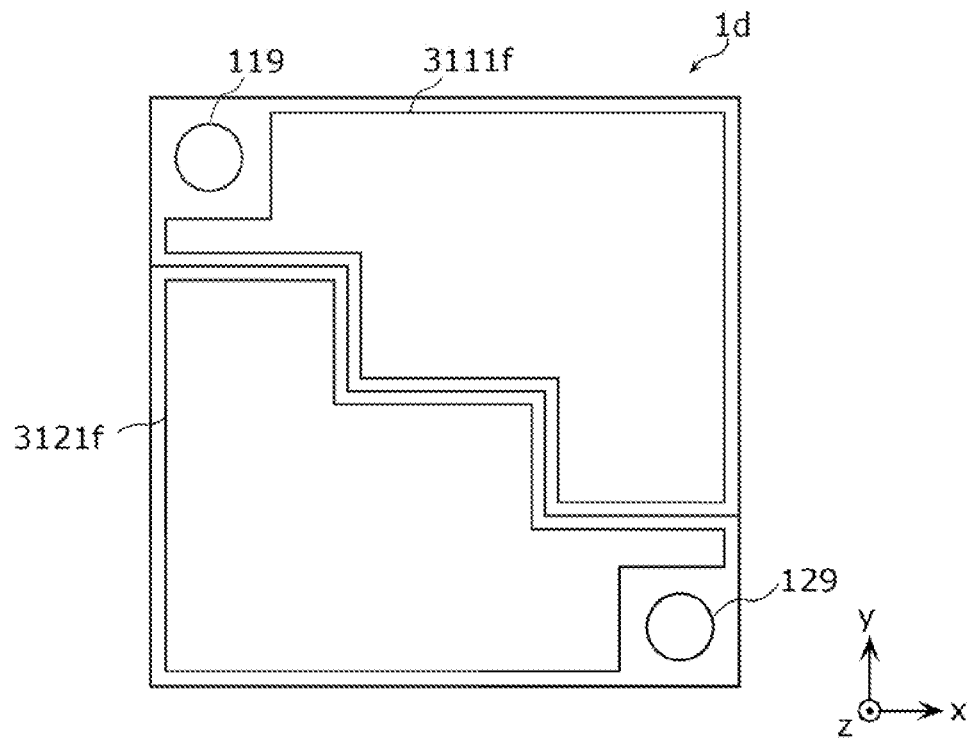
FIG. 29A is a plan view illustrating another arrangement example of first and second source pads according to Embodiment 4.
Figure 29B:
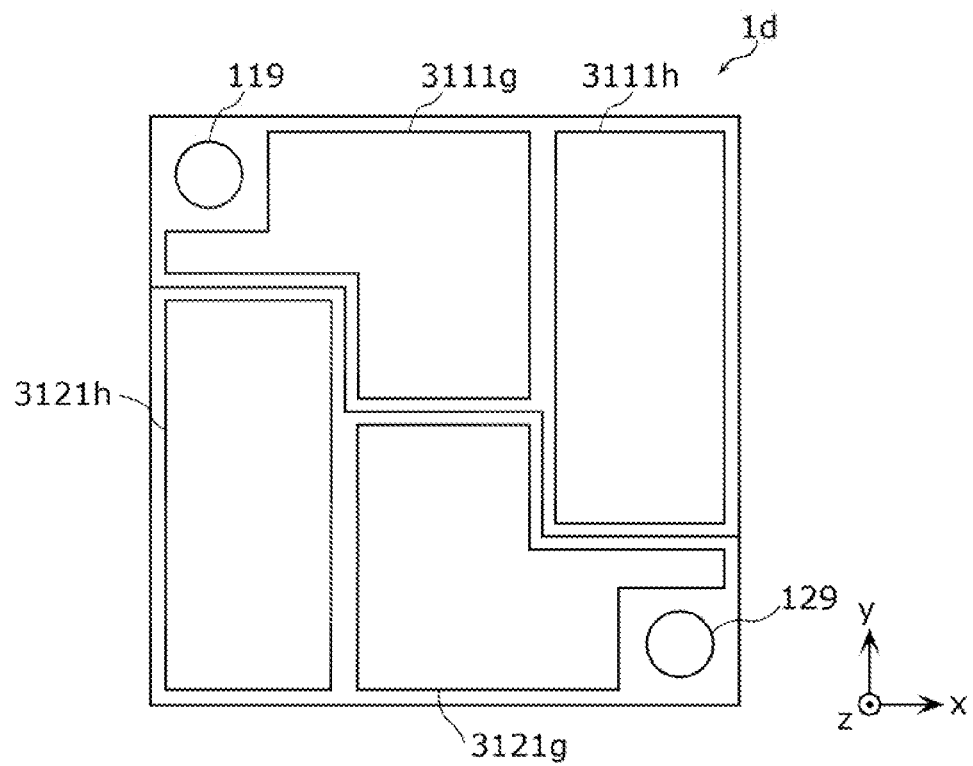
FIG. 29B is a plan view illustrating another arrangement example of the first and second source pads according to Embodiment 4.

FIG. 29A and FIG. 29B are plan views illustrating other arrangement examples of the one or more first source pads 3111 and the one or more second source pads 3121.

As illustrated in FIG. 29A, a single first source pad 3111f may be disposed over approximately the entire surface of first upper surface region S1d excluding the region of first gate pad 119 and a single second source pad 3121f may be disposed over approximately the entire surface of second upper surface region S2d excluding the region of second gate pad 129. As illustrated in FIG. 29B, two first source pads 3111g and 3111h may be disposed over approximately the entire surface of first upper surface region Sid excluding the region of first gate pad 119, in two sections such that opposing sides thereof are parallel to each other, and two second source pads 3121g and 3121h may be disposed over approximately the entire surface of second upper surface region S2d excluding the region of second gate pad 129, in two sections such that opposing sides thereof are parallel to each other.

Embodiment 5

[5-1. Semiconductor Module Structure]

Hereinafter, the structure of the semiconductor module according to Embodiment 5 will be described.

Figure 30A:
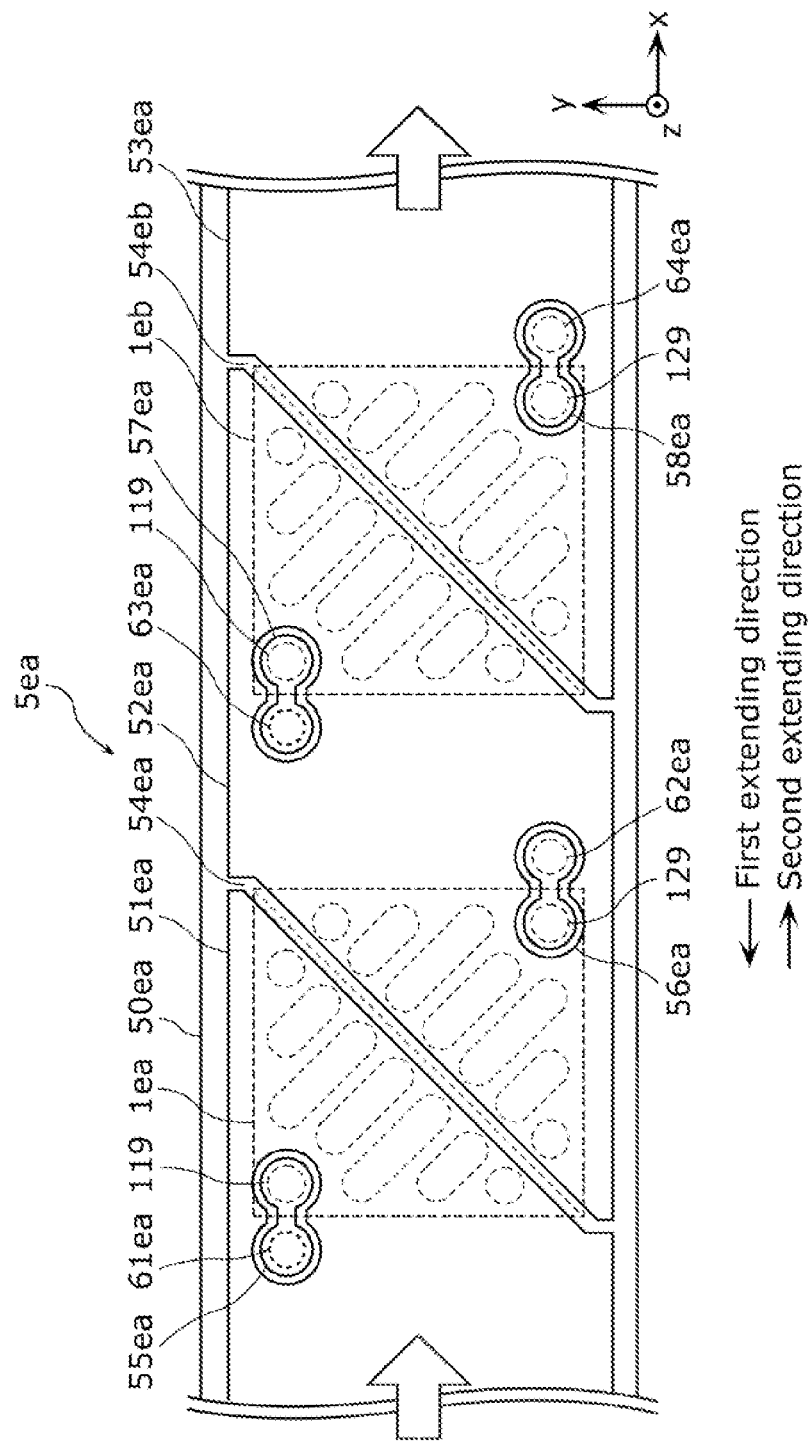
FIG. 30A is a plan view illustrating one example of the structure of a semiconductor module according to Embodiment 5.

FIG. 30A is a plan view illustrating one example of the structure of semiconductor module 5ea according to Embodiment 5.

As illustrated in FIG. 30A, semiconductor module 5ea includes two semiconductor devices 1 (hereinafter one may be referred to as semiconductor device 1ea and the other may be referred to as semiconductor device 1eb to distinguish between them) and mounting substrate 50ea on the front surface of which semiconductor devices 1ea and 1eb are face-down mounted. In FIG. 30A, semiconductor devices 1ea and 1eb are drawn with dashed lines as if they were transparent so that the structure of the upper surfaces of semiconductor devices 1ea and 1eb and the structure of the front surface of mounting substrate 50ea, which cannot actually be seen, can be illustrated clearly.

As illustrated in FIG. 30A, in a plan view of mounting substrate 50ea, semiconductor device 1ea is face-down mounted on the front surface of mounting substrate 50ea in an orientation in which first gate pad 119 is positioned on the first extending direction side among extending directions (the positive and negative x-axis directions in FIG. 30A) of the lengthwise direction of mounting substrate 50ea. Semiconductor device 1eb is face-down mounted on the front surface of mounting substrate 50ea in a position shifted from the position of semiconductor device 1ea parallel to a second extending direction among the extending directions of the lengthwise direction of mounting substrate 50ea, which is opposite the first extending direction, and in an orientation in which upper surface boundary line 600 of semiconductor device 1ea and upper surface boundary line 600 of semiconductor device 1eb are parallel and first gate pad 119 is positioned on the first extending direction side.

As illustrated in FIG. 30A, in a plan view of mounting substrate 50ea, mounting substrate 50ea is elongated in the lengthwise direction and has a constant width at least at the location where semiconductor device 1 is mounted. Mounting substrate 50ea includes first via 61ea, second via 62ea, third via 63ea, and fourth via 64ea. First via 61ea passes through a first conductor (here, metal wiring 55ea (to be described later) electrically connected to first gate pad 119 of semiconductor device 1ea, or a conductor electrically connected to metal wiring 55ea) electrically connected to first gate pad 119 of semiconductor device 1ea. Second via 62ea passes through a second conductor (here, metal wiring 56ea (to be described later) electrically connected to second gate pad 129 of semiconductor device 1ea, or a conductor electrically connected to metal wiring 56ea) electrically connected to second gate pad 129 of semiconductor device 1ea. Third via 63ea passes through a third conductor (here, metal wiring 57ea (to be described later) electrically connected to first gate pad 119 of semiconductor device 1eb, or a conductor electrically connected to metal wiring 57ea) electrically connected to first gate pad 119 of semiconductor device 1eb. Fourth via 64ea passes through a fourth conductor (here, metal wiring 58ea (to be described later) electrically connected to second gate pad 129 of semiconductor device 1eb, or a conductor electrically connected to metal wiring 58ea) electrically connected to second gate pad 129 of semiconductor device 1eb.

Mounting substrate 50ea further includes, on its front surface, first metal wiring 51ea, second metal wiring 52ea, third metal wiring 53ea, metal wiring 55ea, metal wiring 56ea, metal wiring 57ea, and metal wiring 58ea.

First metal wiring 51ea and second metal wiring 52ea are disposed aligned in the extending directions of the lengthwise direction of mounting substrate 50ea (the positive and negative x-axis directions in FIG. 30A), with clearance 54ea therebetween.

Second metal wiring 52ea and third metal wiring 53ea are disposed aligned in the extending directions of the lengthwise direction of mounting substrate 50ea, with clearance 54eb therebetween.

First metal wiring 51ea is bonded to all of the one or more first source pads 111 of semiconductor device 1ea. For example, first metal wiring 51ea is bonded to all of the one or more first source pads 111 of semiconductor device 1ea with a conductive bonding material such as solder.

Second metal wiring 52ea is bonded to all of the one or more second source pads 121 of semiconductor device 1ea and all of the one or more first source pads 111 of semiconductor device 1eb. For example, second metal wiring 52ea is bonded to all of the one or more second source pads 121 of semiconductor device 1ea and all of the one or more first source pads 111 of semiconductor device 1eb with a conductive bonding material such as solder.

Third metal wiring 53ea is bonded to all of the one or more second source pads 121 of semiconductor device 1eb. For example, third metal wiring 53ea is bonded to all of the one or more second source pads 121 of semiconductor device 1eb with a conductive bonding material such as solder.

Accordingly, as illustrated in FIG. 30A, semiconductor device 1ea will be face-down mounted in a position bridging first metal wiring 51ea and second metal wiring 52ea across clearance 54ea, and semiconductor device 1eb will be face-down mounted in a position bridging second metal wiring 52ea and third metal wiring 53ea across clearance 54eb.

Metal wiring 55ea is bonded to first gate pad 119 of semiconductor device 1ea. For example, metal wiring 55ea is bonded to first gate pad 119 of semiconductor device 1ea with a conductive bonding material such as solder.

Metal wiring 56ea is bonded to second gate pad 129 of semiconductor device 1ea. For example, metal wiring 56ea is bonded to second gate pad 129 of semiconductor device 1ea with a conductive bonding material such as solder.

Metal wiring 57ea is bonded to first gate pad 119 of semiconductor device 1eb. For example, metal wiring 57ea is bonded to first gate pad 119 of semiconductor device 1eb with a conductive bonding material such as solder.

Metal wiring 58ea is bonded to second gate pad 129 of semiconductor device 1eb. For example, metal wiring 58ea is bonded to second gate pad 129 of semiconductor device 1eb with a conductive bonding material such as solder.

Figure 30B:
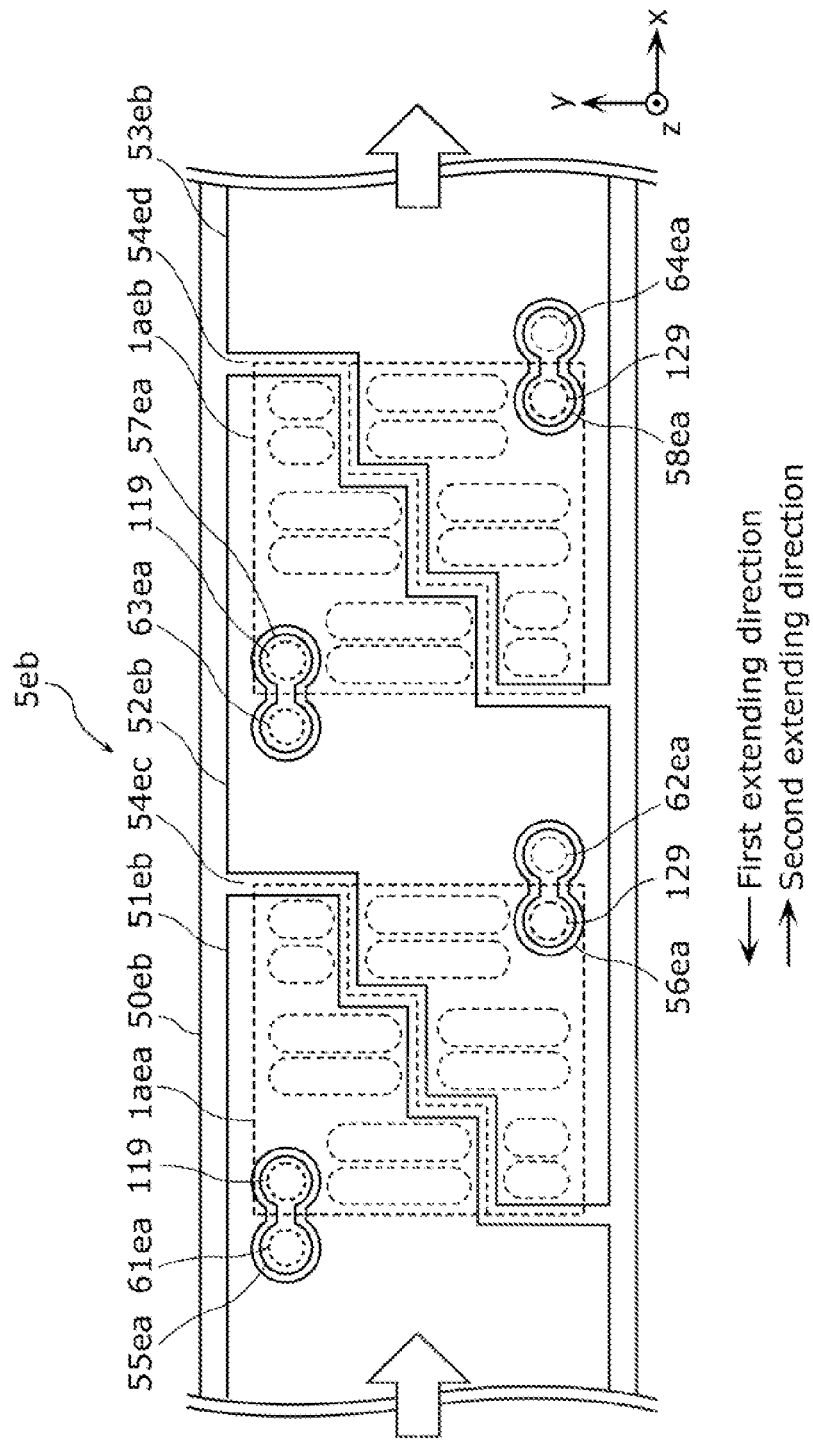
FIG. 30B is a plan view illustrating one example of the structure of the semiconductor module according to Embodiment 5.

FIG. 30B is a plan view illustrating one example of the structure of semiconductor module 5eb according to Embodiment 5.

As illustrated in FIG. 30B, semiconductor module 5eb is semiconductor module 5ea except that the two semiconductor devices 1 (semiconductor device 1ea and semiconductor device 1eb) have been changed to two semiconductor devices 1a (hereinafter one may be referred to as semiconductor device 1aea and the other may be referred to as semiconductor device 1aeb to distinguish between them), and mounting substrate 50ea has been changed to mounting substrate 50eb. In FIG. 30B, semiconductor devices 1aea and 1aeb are drawn with dashed lines as if they were transparent so that the structure of the upper surfaces of semiconductor devices 1aea and 1aeb and the structure of the front surface of mounting substrate 50eb, which cannot actually be seen, can be illustrated clearly.

As illustrated in FIG. 30B, in a plan view of mounting substrate 50eb, semiconductor device 1aea is face-down mounted on the front surface of mounting substrate 50eb in an orientation in which first gate pad 119 is positioned on the first extending direction side among extending directions (the positive and negative x-axis directions in FIG. 30B) of the lengthwise direction of mounting substrate 50eb. Semiconductor device 1aeb is face-down mounted on the front surface of mounting substrate 50eb in a position shifted from the position of semiconductor device 1aea parallel to a second extending direction among the extending directions of the lengthwise direction of mounting substrate 50eb, which is opposite the first extending direction, and in an orientation in which second virtual straight line 92 of semiconductor device 1aea and second virtual straight line 92 of semiconductor device 1aeb are parallel and first gate pad 119 is positioned on the first extending direction side.

Mounting substrate 50eb is mounting substrate 50ea except that first metal wiring 51ea has been changed to first metal wiring 51eb, second metal wiring 52ea has been changed to second metal wiring 52eb, and third metal wiring 53ea has been changed to third metal wiring 53eb.

First metal wiring 51eb and second metal wiring 52eb are disposed aligned in the extending directions of the lengthwise direction of mounting substrate 50eb (the positive and negative x-axis directions in FIG. 30B), with clearance 54ec therebetween.

Second metal wiring 52eb and third metal wiring 53eb are disposed aligned in the extending directions of the lengthwise direction of mounting substrate 50eb, with clearance 54ed therebetween.

First metal wiring 51eb is bonded to all of the one or more first source pads 1111 of semiconductor device 1aea. For example, first metal wiring 51eb is bonded to all of the one or more first source pads 1111 of semiconductor device 1aea with a conductive bonding material such as solder.

Second metal wiring 52eb is bonded to all of the one or more second source pads 1121 of semiconductor device 1aea and all of the one or more first source pads 1111 of semiconductor device 1aeb. For example, second metal wiring 52eb is bonded to all of the one or more second source pads 1121 of semiconductor device 1aea and all of the one or more first source pads 1111 of semiconductor device 1aeb with a conductive bonding material such as solder.

Third metal wiring 53eb is bonded to all of the one or more second source pads 1121 of semiconductor device 1aeb. For example, third metal wiring 53eb is bonded to all of the one or more second source pads 1121 of semiconductor device 1aeb with a conductive bonding material such as solder.

Accordingly, as illustrated in FIG. 30B, semiconductor device 1aea will be face-down mounted in a position bridging first metal wiring 51eb and second metal wiring 52eb across clearance 54ec, and semiconductor device 1aeb will be face-down mounted in a position bridging second metal wiring 52eb and third metal wiring 53eb across clearance 54ed.

FIG. 30C is a plan view illustrating one example of the structure of semiconductor module 5ec according to Embodiment 5.

As illustrated in FIG. 30C, semiconductor module 5ec includes two semiconductor devices 1a (hereinafter one may be referred to as semiconductor device 1aec and the other may be referred to as semiconductor device 1aed to distinguish between them) and mounting substrate 50ec on the front surface of which semiconductor devices 1aec and 1aed are face-down mounted. In FIG. 30C, semiconductor devices 1aec and 1aed are drawn with dashed lines as if they were transparent so that the structure of the upper surfaces of semiconductor devices 1aec and 1aed and the structure of the front surface of mounting substrate 50ec, which cannot actually be seen, can be illustrated clearly.

As illustrated in FIG. 30C, in a plan view of mounting substrate 50ec, mounting substrate 50ec is elongated in the lengthwise direction and has a constant width at least at the location where semiconductor device 1a is mounted. Mounting substrate 50ec includes first via 61ec, second via 62ec, third via 63ec, and fourth via 64ec. First via 61ec passes through a first conductor (here, metal wiring 55ec (to be described later) electrically connected to first gate pad 119 of semiconductor device 1aec, or a conductor electrically connected to metal wiring 55ec) electrically connected to first gate pad 119 of semiconductor device 1aec. Second via 62ec passes through a second conductor (here, metal wiring 56ec (to be described later) electrically connected to second gate pad 129 of semiconductor device 1aec, or a conductor electrically connected to metal wiring 56ec) electrically connected to second gate pad 129 of semiconductor device 1aec. Third via 63ec passes through a third conductor (here, metal wiring 57ec (to be described later) electrically connected to first gate pad 119 of semiconductor device 1aed, or a conductor electrically connected to metal wiring 57ec) electrically connected to first gate pad 119 of semiconductor device 1aed. Fourth via 64ec passes through a fourth conductor (here, metal wiring 58ec (to be described later) electrically connected to second gate pad 129 of semiconductor device 1aed, or a conductor electrically connected to metal wiring 58ec) electrically connected to second gate pad 129 of semiconductor device 1aed.

Mounting substrate 50ec further includes, on its front surface, first metal wiring 51ec, second metal wiring 52ec, third metal wiring 53ec, metal wiring 55ec, metal wiring 56ec, metal wiring 57ec, and metal wiring 58ec.

As illustrated in FIG. 30C, first metal wiring 51ec and second metal wiring 52ec are disposed aligned in the extending directions of the lengthwise direction of mounting substrate 50ec (the positive and negative x-axis directions in FIG. 30C), with clearance 54ee therebetween.

Second metal wiring 52ec and third metal wiring 53ec are disposed aligned in the extending directions of the lengthwise direction of mounting substrate 50ec, with clearance 54ef therebetween.

First metal wiring 51ec is bonded to all of the one or more first source pads 1111 of semiconductor device 1aec. For example, first metal wiring 51ec is bonded to all of the one or more first source pads 1111 of semiconductor device 1aec with a conductive bonding material such as solder.

Second metal wiring 52ec is bonded to all of the one or more second source pads 1121 of semiconductor device 1aec and all of the one or more first source pads 1111 of semiconductor device 1aed. For example, second metal wiring 52ec is bonded to all of the one or more second source pads 1121 of semiconductor device 1aec and all of the one or more first source pads 1111 of semiconductor device 1aed with a conductive bonding material such as solder.

Third metal wiring 53ec is bonded to all of the one or more second source pads 1121 of semiconductor device 1aed. For example, third metal wiring 53ec is bonded to all of the one or more second source pads 1121 of semiconductor device 1aed with a conductive bonding material such as solder.

Accordingly, as illustrated in FIG. 30C, semiconductor device 1aec will be face-down mounted in a position bridging first metal wiring 51ec and second metal wiring 52ec across clearance 54ee, and semiconductor device 1aed will be face-down mounted in a position bridging second metal wiring 52ec and third metal wiring 53ec across clearance 54ef.

Metal wiring 55ec is bonded to first gate pad 119 of semiconductor device 1aec. For example, metal wiring 55ec is bonded to first gate pad 119 of semiconductor device 1aec with a conductive bonding material such as solder.

Metal wiring 56ec is bonded to second gate pad 129 of semiconductor device 1aec. For example, metal wiring 56ec is bonded to second gate pad 129 of semiconductor device 1*aec* with a conductive bonding material such as solder.

Metal wiring 57*ec* is bonded to first gate pad 119 of semiconductor device 1*aed*. For example, metal wiring 57*ec* is bonded to first gate pad 119 of semiconductor device 1*aed* with a conductive bonding material such as solder.

Metal wiring 58*ec* is bonded to second gate pad 129 of semiconductor device 1*aed*. For example, metal wiring 58*ec* is bonded to second gate pad 129 of semiconductor device 1*aed* with a conductive bonding material such as solder.

FIG. 30D is a plan view illustrating one example of the structure of semiconductor module 5*ed* according to Embodiment 5.

As illustrated in FIG. 30D, semiconductor module 5*ed* includes two semiconductor devices 1*c* (hereinafter one may be referred to as semiconductor device 1*cea* and the other may be referred to as semiconductor device 1*ceb* to distinguish between them) and mounting substrate 50*ed* on the front surface of which semiconductor devices 1*cea* and 1*ceb* are face-down mounted. In FIG. 30D, semiconductor devices 1*cea* and 1*ceb* are drawn with dashed lines as if they were transparent so that the structure of the upper surfaces of semiconductor devices 1*cea* and 1*ceb* and the structure of the front surface of mounting substrate 50*ed*, which cannot actually be seen, can be illustrated clearly.

As illustrated in FIG. 30D, in a plan view of mounting substrate 50*ed*, mounting substrate 50*ed* is elongated in the lengthwise direction and has a constant width at least at the location where semiconductor device 1*c* is mounted. Mounting substrate 50*ed* includes first via 61*ed*, second via 62*ed*, third via 63*ed*, and fourth via 64*ed*. First via 61*ed* passes through a first conductor (here, metal wiring 55*ed* (to be described later) electrically connected to first gate pad 119 of semiconductor device 1*cea*, or a conductor electrically connected to metal wiring 55*ed*) electrically connected to first gate pad 119 of semiconductor device 1*cea*. Second via 62*ed* passes through a second conductor (here, metal wiring 56*ed* (to be described later) electrically connected to second gate pad 129 of semiconductor device 1*cea*, or a conductor electrically connected to metal wiring 56*ed*) electrically connected to second gate pad 129 of semiconductor device 1*cea*. Third via 63*ed* passes through a third conductor (here, metal wiring 57*ed* (to be described later) electrically connected to first gate pad 119 of semiconductor device 1*ceb*, or a conductor electrically connected to metal wiring 57*ed*) electrically connected to first gate pad 119 of semiconductor device 1*ceb*. Fourth via 64*ed* passes through a fourth conductor (here, metal wiring 58*ed* (to be described later) electrically connected to second gate pad 129 of semiconductor device 1*ceb*, or a conductor electrically connected to metal wiring 58*ed*) electrically connected to second gate pad 129 of semiconductor device 1*ceb*.

Mounting substrate 50*ed* further includes, on its front surface, first metal wiring 51*ed*, second metal wiring 52*ed*, third metal wiring 53*ed*, metal wiring 55*ed*, metal wiring 56*ed*, metal wiring 57*ed*, and metal wiring 58*ed*.

As illustrated in FIG. 30D, first metal wiring 51*ed* and second metal wiring 52*ed* are disposed aligned in the extending directions of the lengthwise direction of mounting substrate 50*ed* (the positive and negative x-axis directions in FIG. 30D), with clearance 54*eg* therebetween.

Second metal wiring 52*ed* and third metal wiring 53*ed* are disposed aligned in the extending directions of the lengthwise direction of mounting substrate 50*ed*, with clearance 54*eh* therebetween.

First metal wiring 51*ed* is bonded to all of the one or more first source pads 2111 of semiconductor device 1*cea*. For example, first metal wiring 51*ed* is bonded to all of the one or more first source pads 2111 of semiconductor device 1*cea* with a conductive bonding material such as solder.

Second metal wiring 52*ed* is bonded to all of the one or more second source pads 2121 of semiconductor device 1*cea* and all of the one or more first source pads 2111 of semiconductor device 1*ceb*. For example, second metal wiring 52*ed* is bonded to all of the one or more second source pads 2121 of semiconductor device 1*cea* and all of the one or more first source pads 2111 of semiconductor device 1*ceb* with a conductive bonding material such as solder.

Third metal wiring 53*ed* is bonded to all of the one or more second source pads 2121 of semiconductor device 1*ceb*. For example, third metal wiring 53*ed* is bonded to all of the one or more second source pads 2121 of semiconductor device 1*ceb* with a conductive bonding material such as solder.

Accordingly, as illustrated in FIG. 30D, semiconductor device 1*cea* will be face-down mounted in a position bridging first metal wiring 51*ed* and second metal wiring 52*ed* across clearance 54*eg*, and semiconductor device 1*ceb* will be face-down mounted in a position bridging second metal wiring 52*ed* and third metal wiring 53*ed* across clearance 54*eh*.

Metal wiring 55*ed* is bonded to first gate pad 119 of semiconductor device 1*cea*. For example, metal wiring 55*ed* is bonded to first gate pad 119 of semiconductor device 1*cea* with a conductive bonding material such as solder.

First via 61*ed* is disposed in clearance 54*eg*. First gate pad 119 of semiconductor device 1*cea* is also disposed in clearance 54*eg*. Metal wiring 55*ed* is therefore also disposed in clearance 54*eg*.

Metal wiring 56*ed* is bonded to second gate pad 129 of semiconductor device 1*cea*. For example, metal wiring 56*ed* is bonded to second gate pad 129 of semiconductor device 1*cea* with a conductive bonding material such as solder.

Second via 62*ed* is disposed in clearance 54*eg*. Second gate pad 129 of semiconductor device 1*cea* is also disposed in clearance 54*eg*. Metal wiring 56*ed* is therefore also disposed in clearance 54*eg*.

Metal wiring 57*ed* is bonded to first gate pad 119 of semiconductor device 1*ceb*. For example, metal wiring 57*ed* is bonded to first gate pad 119 of semiconductor device 1*ceb* with a conductive bonding material such as solder.

Third via 63*ed* is disposed in clearance 54*eh*. First gate pad 119 of semiconductor device 1*ceb* is also disposed in clearance 54*eh*. Metal wiring 57*ed* is therefore also disposed in clearance 54*eh*.

Metal wiring 58*ed* is bonded to second gate pad 129 of semiconductor device 1*ceb*. For example, metal wiring 58*ed* is bonded to second gate pad 129 of semiconductor device 1*ceb* with a conductive bonding material such as solder.

Fourth via 64*ed* is disposed in clearance 54*eh*. Second gate pad 129 of semiconductor device 1*ceb* is also disposed in clearance 54*eh*. Metal wiring 58*ed* is therefore also disposed in clearance 54*eh*.

FIG. 30E is a plan view illustrating one example of the structure of semiconductor module 5*ee* according to Embodiment 5.

As illustrated in FIG. 30E, semiconductor module 5*ee* is semiconductor module 5*ed* except that the two semiconductor devices 1*c* (semiconductor device 1*cea* and semiconductor device 1*ceb*) have been changed to two semiconductor devices 1*d* (hereinafter one may be referred to as semiconductor device 1*dea* and the other may be referred to as semiconductor device 1*deb* to distinguish between them), and mounting substrate 50*ed* has been changed to mounting substrate 50*ee*. In FIG. 30E, semiconductor devices 1*dea* and 1*deb* are drawn with dashed lines as if they were transparent so that the structure of the upper surfaces of semiconductor devices 1*dea* and 1*deb* and the structure of the front surface of mounting substrate 50*ee*, which cannot actually be seen, can be illustrated clearly.

Mounting substrate 50*ee* is mounting substrate 50*ed* except that first metal wiring 51*ed* has been changed to first metal wiring 51*ee*, second metal wiring 52*ed* has been changed to second metal wiring 52*ee*, and third metal wiring 53*ed* has been changed to third metal wiring 53*ee*.

First metal wiring 51*ee* and second metal wiring 52*ee* are disposed aligned in the extending directions of the lengthwise direction of mounting substrate 50*ee* (the positive and negative x-axis directions in FIG. 30E), with clearance 54*ei* therebetween.

Second metal wiring 52*ee* and third metal wiring 53*ee* are disposed aligned in the extending directions of the lengthwise direction of mounting substrate 50*ee*, with clearance 54*ej* therebetween.

First metal wiring 51*ee* is bonded to all of the one or more first source pads 3111 of semiconductor device 1*dea*. For example, first metal wiring 51*ee* is bonded to all of the one or more first source pads 3111 of semiconductor device 1*dea* with a conductive bonding material such as solder.

Second metal wiring 52*ee* is bonded to all of the one or more second source pads 3121 of semiconductor device 1*dea* and all of the one or more first source pads 3111 of semiconductor device 1*deb*. For example, second metal wiring 52*ee* is bonded to all of the one or more second source pads 3121 of semiconductor device 1*dea* and all of the one or more first source pads 3111 of semiconductor device 1*deb* with a conductive bonding material such as solder.

Third metal wiring 53*ee* is bonded to all of the one or more second source pads 3121 of semiconductor device 1*deb*. For example, third metal wiring 53*ee* is bonded to all of the one or more second source pads 3121 of semiconductor device 1*deb* with a conductive bonding material such as solder.

Accordingly, as illustrated in FIG. 30E, semiconductor device 1*dea* will be face-down mounted in a position bridging first metal wiring 51*ee* and second metal wiring 52*ee* across clearance 54*ei*, and semiconductor device 1*deb* will be face-down mounted in a position bridging second metal wiring 52*ee* and third metal wiring 53*ee* across clearance 54*ej*.

[5-2. Observations]

According to semiconductor modules 5*ea* through 5*ee* configured as described above, the current path of current that flows from the first metal wiring (first metal wiring 51*ea* through first metal wiring 51*ee*) through the second metal wiring (second metal wiring 52*ea* through second metal wiring 52*ee*) to the third metal wiring (third metal wiring 53*ea* through third metal wiring 53*ee*) can be made linear. Since first vias 61*ea*, 61*ec*, 61*ed*, second vias 62*ea*, 62*ec*, 62*ed*, third vias 63*ea*, 63*ec*, 63*ed*, and fourth vias 64*ea*, 64*ec*, 64*ed* can be provided closer to the edges of the mounting substrate, the current path of the main current that flows through the mounting substrate and the semiconductor devices is unobstructed.

This makes it possible to design a current path for the main current on the mounting substrate that reduces conduction resistance.

Thus, semiconductor modules 5*ea* through 5*ee* configured as described above make it possible to provide a semiconductor module having a feature that allows current to flow efficiently in the current path on the mounting substrate.

Embodiment 6

[6-1. Semiconductor Module Structure]

Hereinafter, the structure of the semiconductor module according to Embodiment 6 will be described.

Figure 31A:
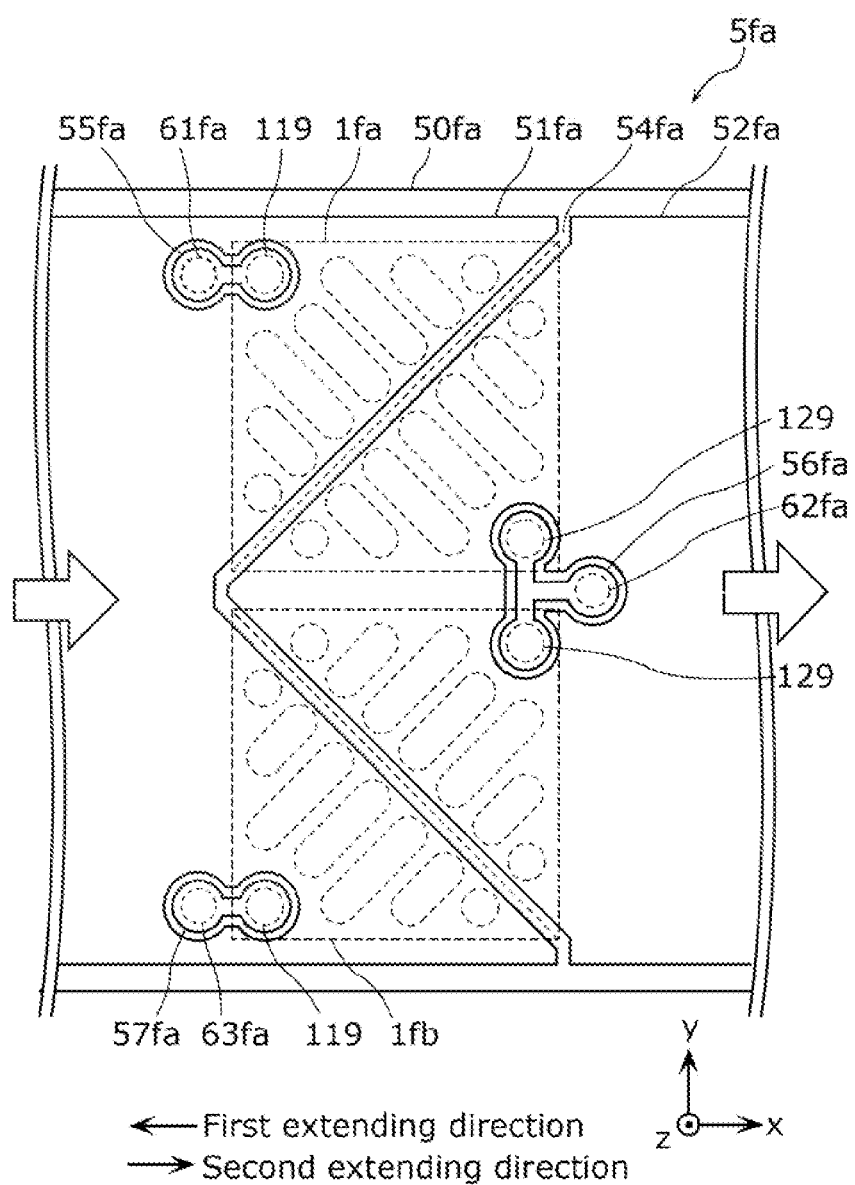
FIG. 31A is a plan view illustrating one example of the structure of a semiconductor module according to Embodiment 6.

FIG. 31A is a plan view illustrating one example of the structure of semiconductor module 5*fa* according to Embodiment 6.

As illustrated in FIG. 31A, semiconductor module 5*fa* includes two semiconductor devices 1 (hereinafter one may be referred to as semiconductor device 1*fa* and the other may be referred to as semiconductor device 1*fb* to distinguish between them) and mounting substrate 50*fa* on the front surface of which semiconductor devices 1*fa* and 1*fb* are face-down mounted. In FIG. 31A, semiconductor devices 1*fa* and 1*fb* are drawn with dashed lines as if they were transparent so that the structure of the upper surfaces of semiconductor devices 1*fa* and 1*fb* and the structure of the front surface of mounting substrate 50*fa*, which cannot actually be seen, can be illustrated clearly.

As illustrated in FIG. 31A, in a plan view of mounting substrate 50*fa*, semiconductor device 1*fa* is face-down mounted on the front surface of mounting substrate 50*fa* in an orientation in which first gate pad 119 is positioned on the first extending direction side among extending directions (the positive and negative x-axis directions in FIG. 31A) of the lengthwise direction of mounting substrate 50*fa*. Semiconductor device 1*fb* is face-down mounted on the front surface of mounting substrate 50*fa* in a position shifted from the position of semiconductor device 1*fa* parallel to a direction orthogonal to an extending direction of the lengthwise direction of mounting substrate 50*fa*, and in an orientation in which upper surface boundary line 600 of semiconductor device 1*fa* and upper surface boundary line 600 of semiconductor device 1*fb* are at a right angle and first gate pad 119 is positioned on the first extending direction side.

As illustrated in FIG. 31A, in a plan view of mounting substrate 50*fa*, mounting substrate 50*fa* is elongated in the lengthwise direction and has a constant width at least at the location where semiconductor device 1 is mounted. Mounting substrate 50*fa* includes first via 61*fa*, second via 62*fa*, and third via 63*fa*. First via 61*fa* passes through a first conductor (here, metal wiring 55*fa* (to be described later) electrically connected to first gate pad 119 of semiconductor device 1*fa*, or a conductor electrically connected to metal wiring 55*fa*) electrically connected to first gate pad 119 of semiconductor device 1*fa*. Second via 62*fa* passes through a second conductor (here, metal wiring 56*fa* (to be described later) electrically connected to second gate pad 129 of semiconductor device 1*fa* and second gate pad 129 of semiconductor device 1*fb*, or a conductor electrically connected to metal wiring 56*fa*) electrically connected to second gate pad 129 of semiconductor device 1*fa* and second gate pad 129 of semiconductor device 1*fb*. Third via 63*fa* passes through a third conductor (here, metal wiring 57*fa* (to be described later) electrically connected to first gate pad 119 of semiconductor device 1*fb*, or a conductor electrically connected to metal wiring 57*fa*) electrically connected to first gate pad 119 of semiconductor device 1*fb*.

Mounting substrate 50*fa* further includes, on the front surface thereof, first metal wiring 51*fa*, second metal wiring 52*fa*, metal wiring 55*fa*, metal wiring 56*fa*, and metal wiring 57*fa*.

First metal wiring 51*fa* and second metal wiring 52*fa* are disposed aligned in the extending directions of the lengthwise direction of mounting substrate 50*fa* (the positive and negative x-axis directions in FIG. 31A), with clearance 54*fa* therebetween.

First metal wiring 51*fa* is bonded to all of the one or more first source pads 111 of semiconductor device 1*fa* and all of the one or more first source pads 111 of semiconductor device 1*fb*. For example, first metal wiring 51*fa* is bonded to all of the one or more first source pads 111 of semiconductor device 1*fa* and all of the one or more first source pads 111 of semiconductor device 1*fb* with a conductive bonding material such as solder.

Second metal wiring 52*fa* is bonded to all of the one or more second source pads 121 of semiconductor device 1*fa* and all of the one or more second source pads 121 of semiconductor device 1*fb*. For example, second metal wiring 52*fa* is bonded to all of the one or more second source pads 121 of semiconductor device 1*fa* and all of the one or more second source pads 121 of semiconductor device 1*fb* with a conductive bonding material such as solder.

Accordingly, as illustrated in FIG. 31A, semiconductor device 1*fa* and semiconductor device 1*fb* will be face-down mounted in positions bridging first metal wiring 51*fa* and second metal wiring 52*fa* across clearance 54*fa*.

Metal wiring 55*fa* is bonded to first gate pad 119 of semiconductor device 1*fa*. For example, metal wiring 55*fa* is bonded to first gate pad 119 of semiconductor device 1*fa* with a conductive bonding material such as solder.

Metal wiring 56*fa* is bonded to second gate pad 129 of semiconductor device 1*fa* and second gate pad 129 of semiconductor device 1*fb*. For example, metal wiring 56*fa* is bonded to second gate pad 129 of semiconductor device 1*fa* and second gate pad 129 of semiconductor device 1*fb* with a conductive bonding material such as solder.

Metal wiring 57*fa* is bonded to first gate pad 119 of semiconductor device 1*fb*. For example, metal wiring 57*fa* is bonded to first gate pad 119 of semiconductor device 1*fb* with a conductive bonding material such as solder.

Figure 31B:
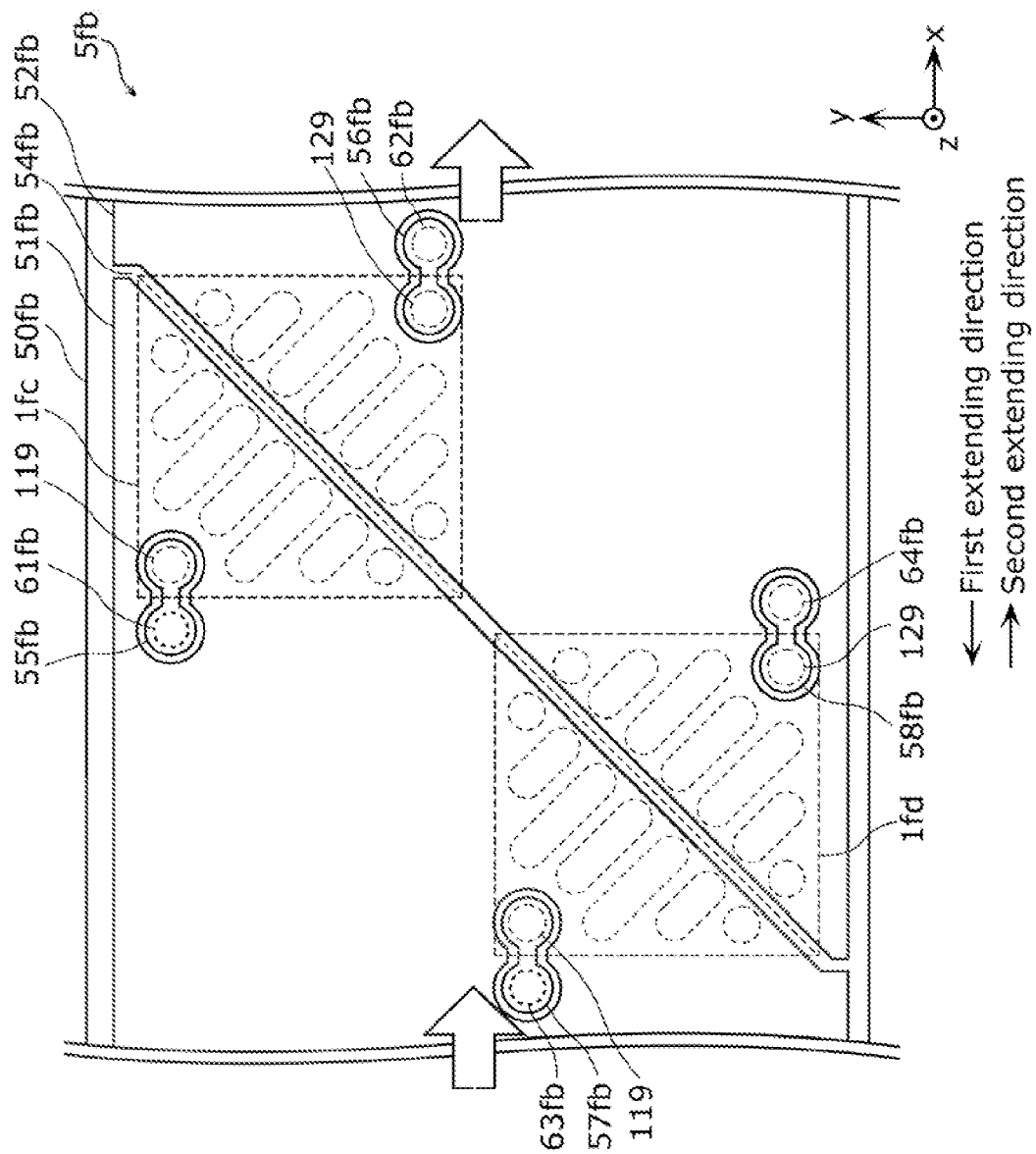
FIG. 31B is a plan view illustrating one example of the structure of the semiconductor module according to Embodiment 6.

FIG. 31B is a plan view illustrating one example of the structure of semiconductor module 5*fb* according to Embodiment 6.

As illustrated in FIG. 31B, semiconductor module 5*fb* includes two semiconductor devices 1 (hereinafter one may be referred to as semiconductor device 1*fc* and the other may be referred to as semiconductor device 1*fd* to distinguish between them) and mounting substrate 50*fb* on the front surface of which semiconductor devices 1*fc* and 1*fd* are face-down mounted. In FIG. 31B, semiconductor devices 1*fc* and 1*fd* are drawn with dashed lines as if they were transparent so that the structure of the upper surfaces of semiconductor devices 1*fc* and 1*fd* and the structure of the front surface of mounting substrate 50*fb*, which cannot actually be seen, can be illustrated clearly.

As illustrated in FIG. 31B, in a plan view of mounting substrate 50*fb*, semiconductor device 1*fc* is face-down mounted on the front surface of mounting substrate 50*fb* in an orientation in which first gate pad 119 is positioned on the first extending direction side among extending directions (the positive and negative x-axis directions in FIG. 31B) of the lengthwise direction of mounting substrate 50*fb*. Semiconductor device 1*fd* is face-down mounted on the front surface of mounting substrate 50*fb* in a position shifted from the position of semiconductor device 1*fc* approximately parallel to the direction in which upper surface boundary line 600 of semiconductor device 1*fc* extends, and in an orientation in which upper surface boundary line 600 of semiconductor device 1*fc* and upper surface boundary line 600 of semiconductor device 1*fd* are coincident and first gate pad 119 is positioned on the first extending direction side.

As illustrated in FIG. 31B, in a plan view of mounting substrate 50*fb*, mounting substrate 50*fb* is elongated in the lengthwise direction and has a constant width at least at the location where semiconductor device 1 is mounted. Mounting substrate 50*fb* includes first via 61*fb*, second via 62*fb*, third via 63*fb*, and fourth via 64*fb*. First via 61*fb* passes through a first conductor (here, metal wiring 55*fb* (to be described later) electrically connected to first gate pad 119 of semiconductor device 1*fc*, or a conductor electrically connected to metal wiring 55*fb*) electrically connected to first gate pad 119 of semiconductor device 1*fc*. Second via 62*fb* passes through a second conductor (here, metal wiring 56*fb* (to be described later) electrically connected to second gate pad 129 of semiconductor device 1*fc*, or a conductor electrically connected to metal wiring 56*fb*) electrically connected to second gate pad 129 of semiconductor device 1*fc*. Third via 63*fb* passes through a third conductor (here, metal wiring 57*fb* (to be described later) electrically connected to first gate pad 119 of semiconductor device 1*fd*, or a conductor electrically connected to metal wiring 57*fb*) electrically connected to first gate pad 119 of semiconductor device 1*fd*. Fourth via 64*fb* passes through a fourth conductor (here, metal wiring 58*fb* (to be described later) electrically connected to second gate pad 129 of semiconductor device 1*fd*, or a conductor electrically connected to metal wiring 58*fb*) electrically connected to second gate pad 129 of semiconductor device 1*fd*.

Mounting substrate 50*fb* further includes, on the front surface thereof, first metal wiring 51*fb*, second metal wiring 52*fb*, metal wiring 55*fb*, metal wiring 56*fb*, metal wiring 57*fb*, and metal wiring 58*fb*.

First metal wiring 51*fb* and second metal wiring 52*fb* are disposed aligned in the extending directions of the lengthwise direction of mounting substrate 50*fb* (the positive and negative x-axis directions in FIG. 31B), with clearance 54*fb* therebetween.

First metal wiring 51*fb* is bonded to all of the one or more first source pads 111 of semiconductor device 1*fc* and all of the one or more first source pads 111 of semiconductor device 1*fd*. For example, first metal wiring 51*fb* is bonded to all of the one or more first source pads 111 of semiconductor device 1*fc* and all of the one or more first source pads 111 of semiconductor device 1*fd* with a conductive bonding material such as solder.

Second metal wiring 52*fb* is bonded to all of the one or more second source pads 121 of semiconductor device 1*fc* and all of the one or more second source pads 121 of semiconductor device 1*fd*. For example, second metal wiring 52*fb* is bonded to all of the one or more second source pads 121 of semiconductor device 1*fc* and all of the one or more second source pads 121 of semiconductor device 1*fd* with a conductive bonding material such as solder.

Accordingly, as illustrated in FIG. 31B, semiconductor devices 1*fc* and 1*fd* will be face-down mounted in positions bridging first metal wiring 51*fb* and second metal wiring 52*fb* across clearance 54*fb*.

Metal wiring 55*fb* is bonded to first gate pad 119 of semiconductor device 1*fc*. For example, metal wiring 55*fb* is bonded to first gate pad 119 of semiconductor device 1*fc* with a conductive bonding material such as solder.

Metal wiring 56*fb* is connected to second gate pad 129 of semiconductor device 1*fc*. For example, metal wiring 56*fb* is bonded to second gate pad 129 of semiconductor device 1*fc* with a conductive bonding material such as solder.

Metal wiring 57fb is bonded to first gate pad 119 of semiconductor device 1fd. For example, metal wiring 57fb is bonded to first gate pad 119 of semiconductor device 1fd with a conductive bonding material such as solder.

Metal wiring 58fb is bonded to second gate pad 129 of semiconductor device 1fd. For example, metal wiring 58fb is bonded to second gate pad 129 of semiconductor device 1fd with a conductive bonding material such as solder.

Figure 31C:
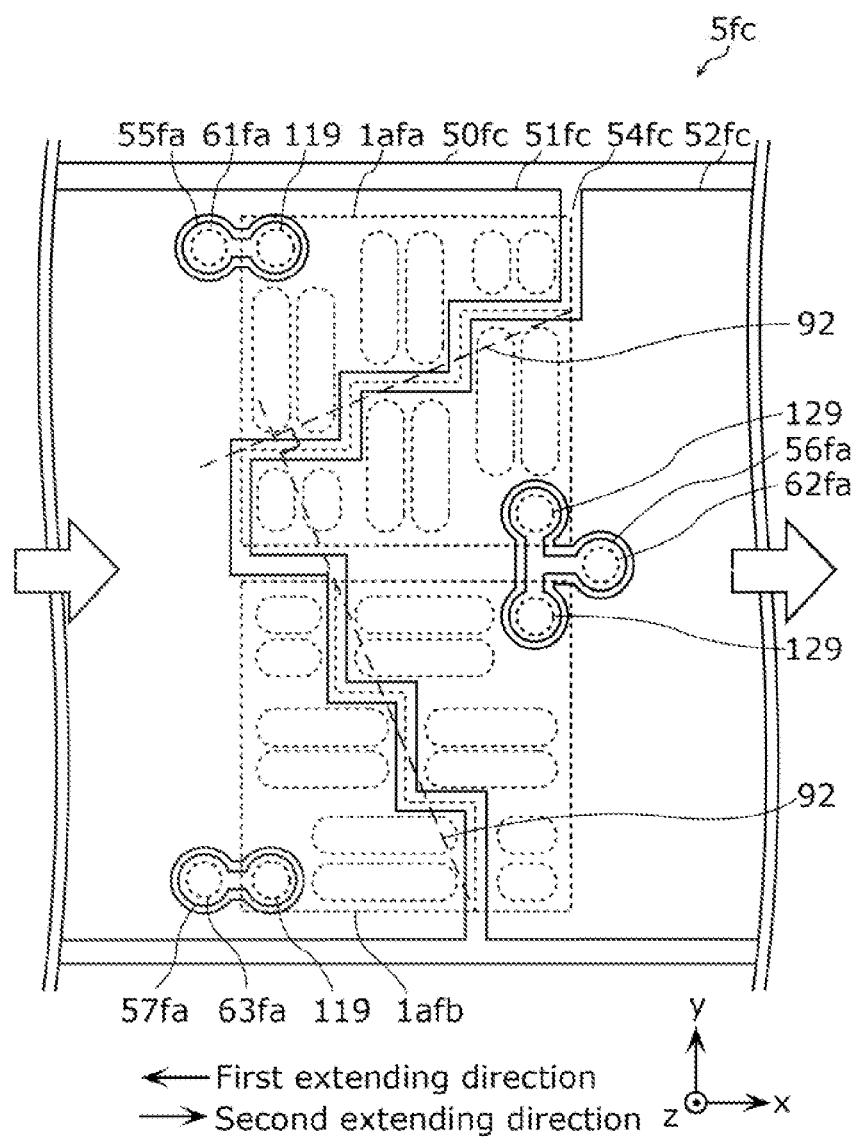
FIG. 31C is a plan view illustrating one example of the structure of the semiconductor module according to Embodiment 6.

FIG. 31C is a plan view illustrating one example of the structure of semiconductor module 5fc according to Embodiment 6.

As illustrated in FIG. 31C, semiconductor module 5fc is semiconductor module 5fa except that the two semiconductor devices 1 (semiconductor device 1fa and semiconductor device 1fb) have been changed to two semiconductor devices 1a (hereinafter one may be referred to as semiconductor device 1afa and the other may be referred to as semiconductor device 1afb to distinguish between them), and mounting substrate 50fa has been changed to mounting substrate 50fc. In FIG. 31C, semiconductor devices 1afa and 1afb are drawn with dashed lines as if they were transparent so that the structure of the upper surfaces of semiconductor devices 1afa and 1afb and the structure of the front surface of mounting substrate 50fc, which cannot actually be seen, can be illustrated clearly.

As illustrated in FIG. 31C, in a plan view of mounting substrate 50fc, semiconductor device 1afa is face-down mounted on the front surface of mounting substrate 50fc in an orientation in which first gate pad 119 is positioned on the first extending direction side among extending directions (the positive and negative x-axis directions in FIG. 31C) of the lengthwise direction of mounting substrate 50fc. Semiconductor device 1afb is face-down mounted on the front surface of mounting substrate 50fc in a position shifted from the position of semiconductor device 1afa parallel to a direction orthogonal to an extending direction of the lengthwise direction of mounting substrate 50fc, and in an orientation in which second virtual straight line 92 of semiconductor device 1afa and second virtual straight line 92 of semiconductor device 1afb are at a right angle and first gate pad 119 is positioned on the first extending direction side.

Mounting substrate 50fc is mounting substrate 50fa except that first metal wiring 51fa has been changed to first metal wiring 51fc and second metal wiring 52fa has been changed to second metal wiring 52fc.

First metal wiring 51fc and second metal wiring 52fc are disposed aligned in the extending directions of the lengthwise direction of mounting substrate 50fc (the positive and negative x-axis directions in FIG. 30B), with clearance 54fc therebetween.

First metal wiring 51fc is bonded to all of the one or more first source pads 1111 of semiconductor device 1afa and all of the one or more first source pads 1111 of semiconductor device 1afb. For example, first metal wiring 51fc is bonded to all of the one or more first source pads 1111 of semiconductor device 1afa and all of the one or more source pads 1111 of semiconductor device 1afb with a conductive bonding material such as solder.

Second metal wiring 52fc is bonded to all of the one or more second source pads 1121 of semiconductor device 1afa and all of the one or more second source pads 1121 of semiconductor device 1afb. For example, second metal wiring 52fc is bonded to all of the one or more second source pads 1121 of semiconductor device 1afa and all of the one or more second source pads 1121 of semiconductor device 1afb with a conductive bonding material such as solder.

Accordingly, as illustrated in FIG. 31C, semiconductor devices 1afa and 1afb will be face-down mounted in positions bridging first metal wiring 51fc and second metal wiring 52fc across clearance 54fc.

Figure 31D:
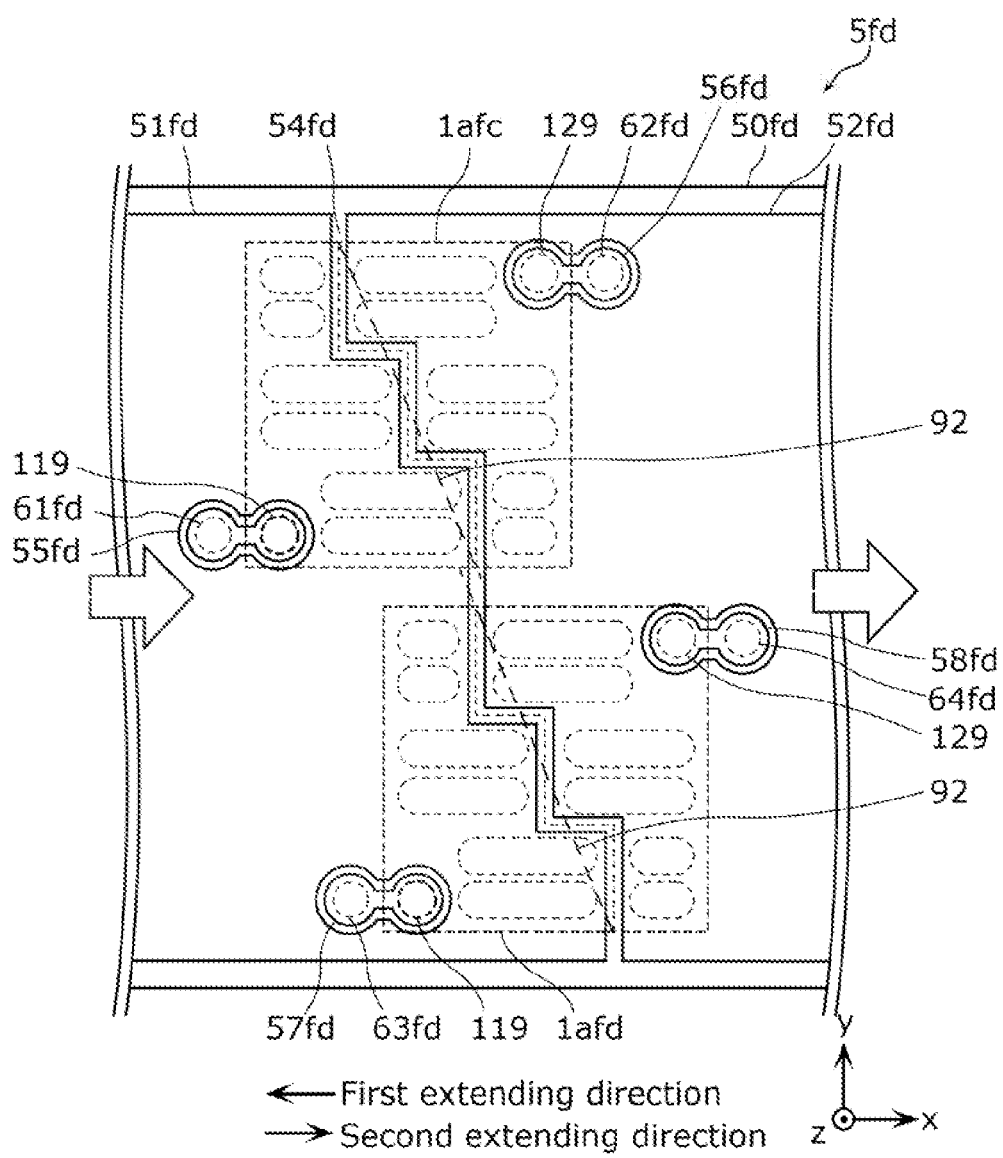
FIG. 31D is a plan view illustrating one example of the structure of the semiconductor module according to Embodiment 6.

FIG. 31D is a plan view illustrating one example of the structure of semiconductor module 5fd according to Embodiment 6.

As illustrated in FIG. 31D, semiconductor module 5fd includes two semiconductor devices 1a (hereinafter one may be referred to as semiconductor device 1afc and the other may be referred to as semiconductor device 1afd to distinguish between them) and mounting substrate 50fd on the front surface of which semiconductor devices 1afc and 1afd are face-down mounted. In FIG. 31D, semiconductor devices 1afc and 1afd are drawn with dashed lines as if they were transparent so that the structure of the upper surfaces of semiconductor devices 1afc and 1afd and the structure of the front surface of mounting substrate 50fd, which cannot actually be seen, can be illustrated clearly.

As illustrated in FIG. 31D, in a plan view of mounting substrate 50fd, semiconductor device 1afc is face-down mounted on the front surface of mounting substrate 50fd in an orientation in which first gate pad 119 is positioned on the first extending direction side among extending directions (the positive and negative x-axis directions in FIG. 31D) of the lengthwise direction of mounting substrate 50fd. Semiconductor device 1afd is face-down mounted on the front surface of mounting substrate 50fd in a position shifted from the position of semiconductor device 1afc approximately parallel to the direction in which second virtual straight line 92 of semiconductor device 1afc extends, and in an orientation in which second virtual straight line 92 of semiconductor device 1afc and second virtual straight line 92 of semiconductor device 1afd are parallel and first gate pad 119 is positioned on the first extending direction side.

As illustrated in FIG. 31D, in a plan view of mounting substrate 50fd, mounting substrate 50fd is elongated in the lengthwise direction and has a constant width at least at the location where semiconductor device 1a is mounted. Mounting substrate 50fd includes first via 61fd, second via 62fd, third via 63fd, and fourth via 64fd. First via 61fd passes through a first conductor (here, metal wiring 55fd (to be described later) electrically connected to first gate pad 119 of semiconductor device 1afc, or a conductor electrically connected to metal wiring 55fd) electrically connected to first gate pad 119 of semiconductor device 1afc. Second via 62fd passes through a second conductor (here, metal wiring 56fd (to be described later) electrically connected to second gate pad 129 of semiconductor device 1afc, or a conductor electrically connected to metal wiring 56fd) electrically connected to second gate pad 129 of semiconductor device 1afc. Third via 63fd passes through a third conductor (here, metal wiring 57fd (to be described later) electrically connected to first gate pad 119 of semiconductor device 1afd, or a conductor electrically connected to metal wiring 57fd) electrically connected to first gate pad 119 of semiconductor device 1afd. Fourth via 64fd passes through a fourth conductor (here, metal wiring 58fd (to be described later) electrically connected to second gate pad 129 of semiconductor device 1afd, or a conductor electrically connected to metal wiring 58fd) electrically connected to second gate pad 129 of semiconductor device 1afd.

Mounting substrate 50fd further includes, on the front surface thereof, first metal wiring 51fd, second metal wiring 52fd, metal wiring 55fd, metal wiring 56fd, metal wiring 57fd, and metal wiring 58fd.

First metal wiring 51*fd* and second metal wiring 52*fd* are disposed aligned in the extending directions of the lengthwise direction of mounting substrate 50*fd* (the positive and negative x-axis directions in FIG. 31D), with clearance 54*fd* therebetween.

First metal wiring 51*fd* is bonded to all of the one or more first source pads 1111 of semiconductor device 1*afc* and all of the one or more first source pads 1111 of semiconductor device 1*afd*. For example, first metal wiring 51*fd* is bonded to all of the one or more first source pads 1111 of semiconductor device 1*afc* and all of the one or more first source pads 1111 of semiconductor device 1*afd* with a conductive bonding material such as solder.

Second metal wiring 52*fd* is bonded to all of the one or more second source pads 1121 of semiconductor device 1*afc* and all of the one or more second source pads 1121 of semiconductor device 1*afd*. For example, second metal wiring 52*fd* is bonded to all of the one or more second source pads 1121 of semiconductor device 1*afc* and all of the one or more second source pads 1121 of semiconductor device 1*afd* with a conductive bonding material such as solder.

Accordingly, as illustrated in FIG. 31D, semiconductor devices 1*afc* and 1*afd* will be face-down mounted in positions bridging first metal wiring 51*fd* and second metal wiring 52*fd* across clearance 54*fd*.

Metal wiring 55*fd* is bonded to first gate pad 119 of semiconductor device 1*afc*. For example, metal wiring 55*fd* is bonded to first gate pad 119 of semiconductor device 1*afc* with a conductive bonding material such as solder.

Metal wiring 56*fd* is connected to second gate pad 129 of semiconductor device 1*afc*. For example, metal wiring 56*fd* is bonded to second gate pad 129 of semiconductor device 1*afc* with a conductive bonding material such as solder.

Metal wiring 57*fd* is bonded to first gate pad 119 of semiconductor device 1*afd*. For example, metal wiring 57*fd* is bonded to first gate pad 119 of semiconductor device 1*afd* with a conductive bonding material such as solder.

Metal wiring 58*fd* is bonded to second gate pad 129 of semiconductor device 1*afd*. For example, metal wiring 58*fd* is bonded to second gate pad 129 of semiconductor device 1*afd* with a conductive bonding material such as solder.

Figure 31E:
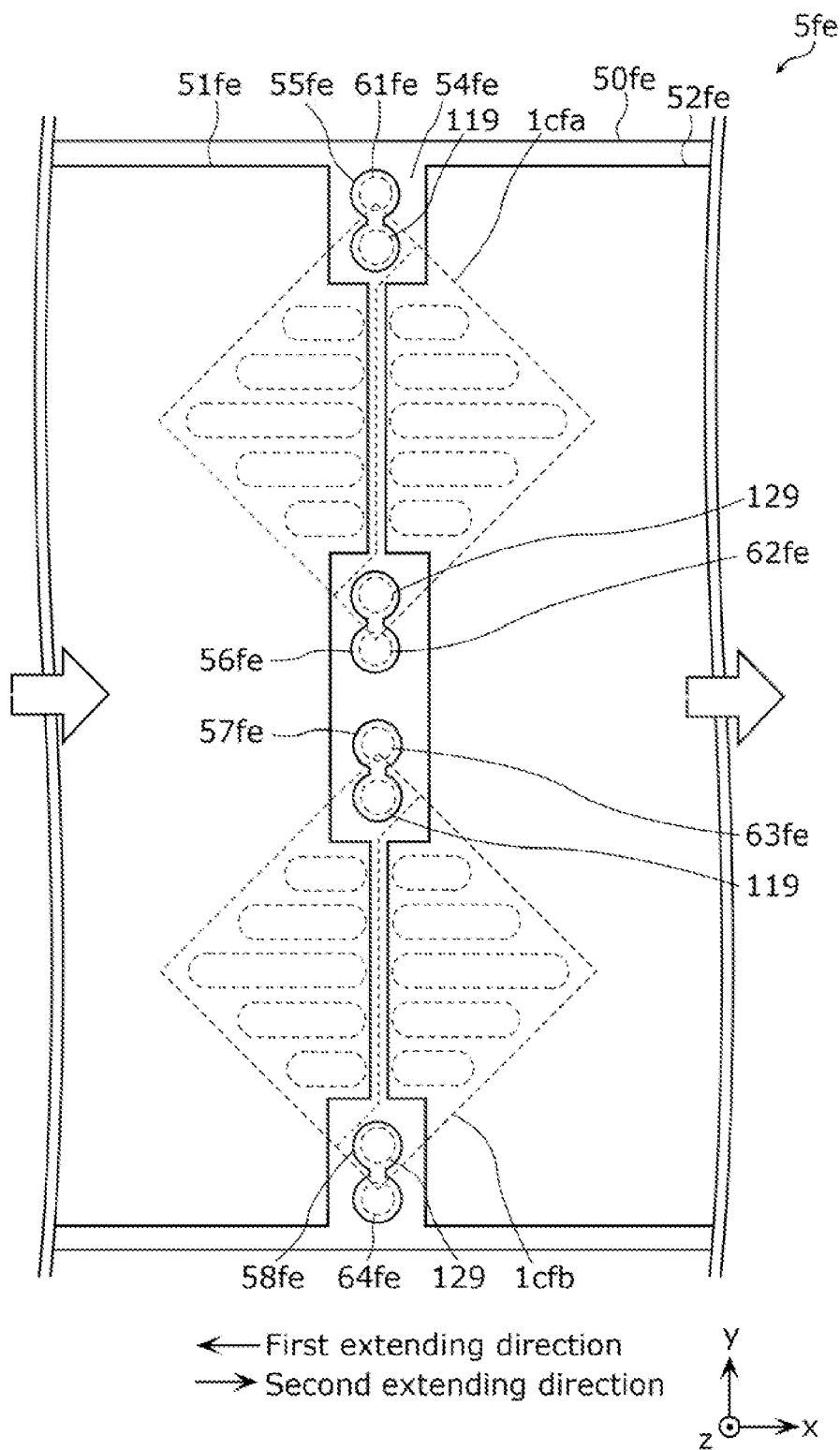
FIG. 31E is a plan view illustrating one example of the structure of the semiconductor module according to Embodiment 6.

FIG. 31E is a plan view illustrating one example of the structure of semiconductor module 5*fe* according to Embodiment 6.

As illustrated in FIG. 31E, semiconductor module 5*fe* includes two semiconductor devices 1*c* (hereinafter one may be referred to as semiconductor device 1*cfa* and the other may be referred to as semiconductor device 1*cfb* to distinguish between them) and mounting substrate 50*fe* on the front surface of which semiconductor devices 1*cfa* and 1*cfb* are face-down mounted. In FIG. 31E, semiconductor devices 1*cfa* and 1*cfb* are drawn with dashed lines as if they were transparent so that the structure of the upper surfaces of semiconductor devices 1*cfa* and 1*cfb* and the structure of the front surface of mounting substrate 50*fe*, which cannot actually be seen, can be illustrated clearly.

As illustrated in FIG. 31E, in a plan view of mounting substrate 50*fe*, mounting substrate 50*fe* is elongated in the lengthwise direction and has a constant width at least at the location where semiconductor device 1*c* is mounted. Mounting substrate 50*fe* includes first via 61*fe*, second via 62*fe*, third via 63*fe*, and fourth via 64*fe*. First via 61*fe* passes through a first conductor (here, metal wiring 55*fe* (to be described later) electrically connected to first gate pad 119 of semiconductor device 1*cfa*, or a conductor electrically connected to metal wiring 55*fe*) electrically connected to first gate pad 119 of semiconductor device 1*cfa*. Second via 62*fe* passes through a second conductor (here, metal wiring 56*fe* (to be described later) electrically connected to second gate pad 129 of semiconductor device 1*cfa*, or a conductor electrically connected to metal wiring 56*fe*) electrically connected to second gate pad 129 of semiconductor device 1*cfa*. Third via 63*fe* passes through a third conductor (here, metal wiring 57*fe* (to be described later) electrically connected to first gate pad 119 of semiconductor device 1*cfb*, or a conductor electrically connected to metal wiring 57*fe*) electrically connected to first gate pad 119 of semiconductor device 1*cfb*. Fourth via 64*fe* passes through a fourth conductor (here, metal wiring 58*fe* (to be described later) electrically connected to second gate pad 129 of semiconductor device 1*cfb*, or a conductor electrically connected to metal wiring 58*fe*) electrically connected to second gate pad 129 of semiconductor device 1*cfb*.

Mounting substrate 50*fe* further includes, on the front surface thereof, first metal wiring 51*fe*, second metal wiring 52*fe*, metal wiring 55*fe*, metal wiring 56*fe*, metal wiring 57*fe*, and metal wiring 58*fe*.

First metal wiring 51*fe* and second metal wiring 52*fe* are disposed aligned in the extending directions of the lengthwise direction of mounting substrate 50*fe* (the positive and negative x-axis directions in FIG. 31E), with clearance 54*fe* therebetween.

First metal wiring 51*fe* is bonded to all of the one or more first source pads 2111 of semiconductor device 1*cfa* and all of the one or more first source pads 2111 of semiconductor device 1*cfb*. For example, first metal wiring 51*fe* is bonded to all of the one or more first source pads 2111 of semiconductor device 1*cfa* and all of the one or more first source pads 2111 of semiconductor device 1*cfb* with a conductive bonding material such as solder.

Second metal wiring 52*fe* is bonded to all of the one or more second source pads 2121 of semiconductor device 1*cfa* and all of the one or more second source pads 2121 of semiconductor device 1*cfb*. For example, second metal wiring 52*fe* is bonded to all of the one or more second source pads 2121 of semiconductor device 1*cfa* and all of the one or more second source pads 2121 of semiconductor device 1*cfb* with a conductive bonding material such as solder.

Accordingly, as illustrated in FIG. 31E, semiconductor devices 1*cfa* and 1*cfb* will be face-down mounted in positions bridging first metal wiring 51*fe* and second metal wiring 52*fe* across clearance 54*fe*.

Metal wiring 55*fe* is bonded to first gate pad 119 of semiconductor device 1*cfa*. For example, metal wiring 55*fe* is bonded to first gate pad 119 of semiconductor device 1*cfa* with a conductive bonding material such as solder.

First via 61*fe* is disposed in clearance 54*fe*. First gate pad 119 of semiconductor device 1*cfa* is also disposed in clearance 54*fe*. Metal wiring 55*fe* is therefore also disposed in clearance 54*fe*.

Metal wiring 56*fe* is bonded to second gate pad 129 of semiconductor device 1*cfa*. For example, metal wiring 56*fe* is bonded to second gate pad 129 of semiconductor device 1*cfa* with a conductive bonding material such as solder.

Second via 62*fe* is disposed in clearance 54*fe*. Second gate pad 129 of semiconductor device 1*cfa* is also disposed in clearance 54*fe*. Metal wiring 56*fe* is therefore also disposed in clearance 54*fe*.

Metal wiring 57*fe* is bonded to first gate pad 119 of semiconductor device 1*cfb*. For example, metal wiring 57*fe* is bonded to first gate pad 119 of semiconductor device 1*cfb* with a conductive bonding material such as solder.

Third via 63*fe* is disposed in clearance 54*fe*. First gate pad 119 of semiconductor device 1*cfb* is also disposed in clearance 54*fe*. Metal wiring 57*fe* is therefore also disposed in clearance 54*fe*.

Metal wiring 58*fe* is bonded to second gate pad 129 of semiconductor device 1*cfb*. For example, metal wiring 58*fe* is bonded to second gate pad 129 of semiconductor device 1*cfb* with a conductive bonding material such as solder.

Fourth via 64*fe* is disposed in clearance 54*fe*. Second gate pad 129 of semiconductor device 1*cfb* is also disposed in clearance 54*fe*. Metal wiring 58*fe* is therefore also disposed in clearance 54*fe*.

Figure 31F:
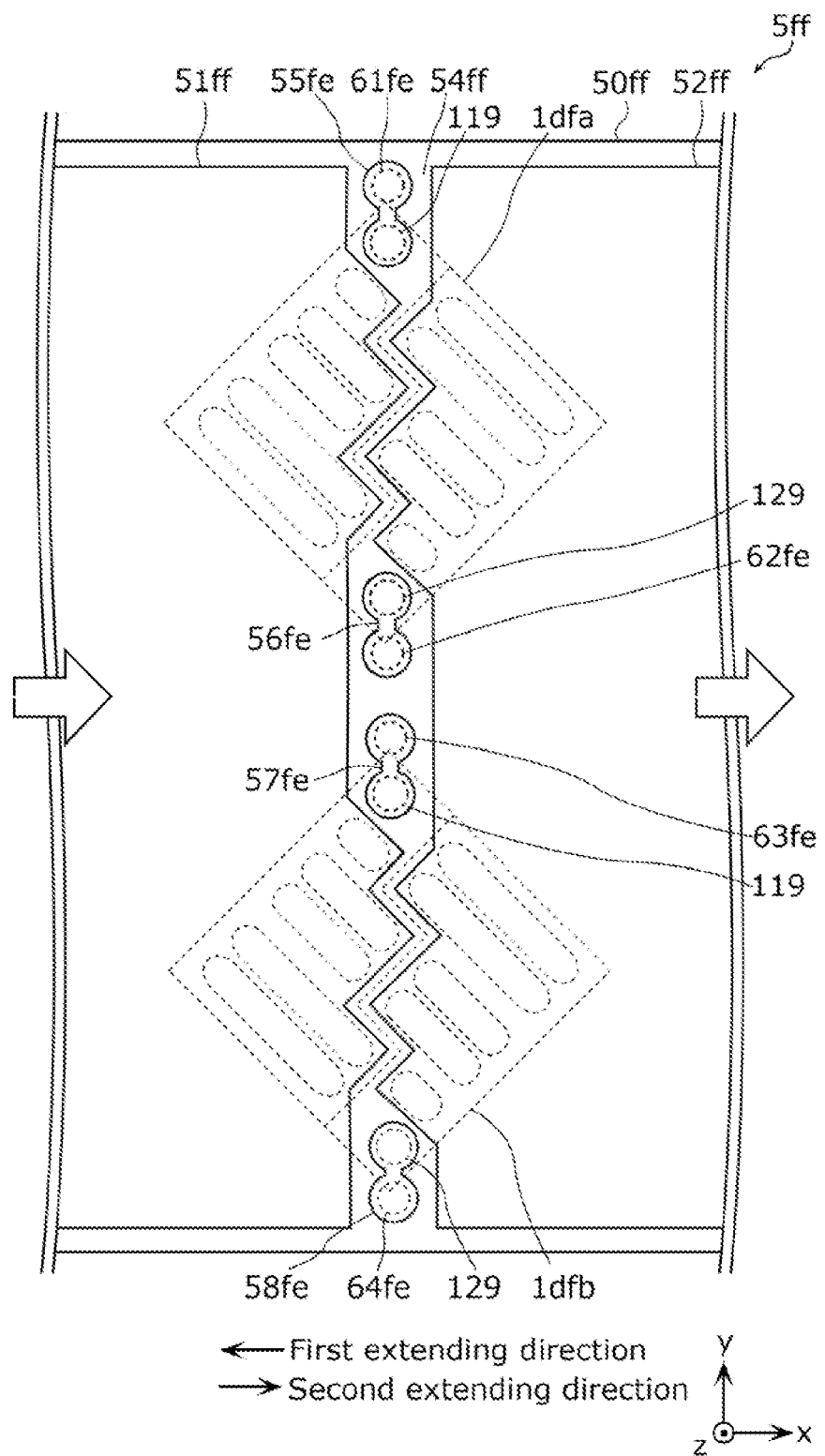
FIG. 31F is a plan view illustrating one example of the structure of the semiconductor module according to Embodiment 6.

FIG. 31F is a plan view illustrating one example of the structure of semiconductor module 5*ff* according to Embodiment 6.

As illustrated in FIG. 31F, semiconductor module 5*ff* is semiconductor module 5*fe* except that the two semiconductor devices 1*c* (semiconductor device 1*cfa* and semiconductor device 1*cfb*) have been changed to two semiconductor devices 1*d* (hereinafter one may be referred to as semiconductor device 1*dfa* and the other may be referred to as semiconductor device 1*dfb* to distinguish between them), and mounting substrate 50*fe* has been changed to mounting substrate 50*ff*. In FIG. 31F, semiconductor devices 1*dfa* and 1*dfb* are drawn with dashed lines as if they were transparent so that the structure of the upper surfaces of semiconductor devices 1*dfa* and 1*dfb* and the structure of the front surface of mounting substrate 50*ff*, which cannot actually be seen, can be illustrated clearly.

Mounting substrate 50*ff* is mounting substrate 50*fe* except that first metal wiring 51*fe* has been changed to first metal wiring 51*ff* and second metal wiring 52*fe* has been changed to second metal wiring 52*ff*.

First metal wiring 51*ff* and second metal wiring 52*ff* are disposed aligned in the extending directions of the lengthwise direction of mounting substrate 50*ff* (the positive and negative x-axis directions in FIG. 31F), with clearance 54*ff* therebetween.

First metal wiring 51*ff* is bonded to all of the one or more first source pads 3111 of semiconductor device 1*dfa* and all of the one or more first source pads 3111 of semiconductor device 1*dfb*. For example, first metal wiring 51*ff* is bonded to all of the one or more first source pads 3111 of semiconductor device 1*dfa* and all of the one or more first source pads 3111 of semiconductor device 1*dfb* with a conductive bonding material such as solder.

Second metal wiring 52*ff* is bonded to all of the one or more second source pads 3121 of semiconductor device 1*dfa* and all of the one or more second source pads 3121 of semiconductor device 1*dfb*. For example, second metal wiring 52*ff* is bonded to all of the one or more second source pads 3121 of semiconductor device 1*dfa* and all of the one or more second source pads 3121 of semiconductor device 1*dfb* with a conductive bonding material such as solder.

Accordingly, as illustrated in FIG. 31F, semiconductor devices 1*dfa* and 1*dfb* will be face-down mounted in positions bridging first metal wiring 51*ff* and second metal wiring 52*ff* across clearance 54*ff*.

Metal wiring 55*fe* is bonded to first gate pad 119 of semiconductor device 1*dfa*. For example, metal wiring 55*fe* is bonded to first gate pad 119 of semiconductor device 1*dfa* with a conductive bonding material such as solder.

Metal wiring 56*fe* is bonded to second gate pad 129 of semiconductor device 1*dfa*. For example, metal wiring 56*fe* is bonded to second gate pad 129 of semiconductor device 1*dfa* with a conductive bonding material such as solder.

Metal wiring 57*fe* is bonded to first gate pad 119 of semiconductor device 1*dfb*. For example, metal wiring 57*fe* is bonded to first gate pad 119 of semiconductor device 1*dfb* with a conductive bonding material such as solder.

Metal wiring 58*fe* is bonded to second gate pad 129 of semiconductor device 1*dfb*. For example, metal wiring 58*fe* is bonded to second gate pad 129 of semiconductor device 1*dfb* with a conductive bonding material such as solder.

[6-2. Observations]

According to semiconductor module 5*fa* configured as described above, a via for passing a conductor that applies voltage to second gate pad 129 of semiconductor device 1*fa* and a via for passing a conductor that applies voltage to second gate pad 129 of semiconductor device 1*fb* can both be realized with a single second via 62*fa*.

This makes it possible to design a current path for the main current on mounting substrate 50*fa* that reduces conduction resistance.

Similarly, according to semiconductor module 5*fc* configured as described above, a via for passing a conductor that applies voltage to second gate pad 129 of semiconductor device 1*afa* and a via for passing a conductor that applies voltage to second gate pad 129 of semiconductor device 1*afb* can both be realized with a single second via 62*fa*. Moreover, since each common via can be disposed closer to an edge of the mounting substrate, the current path of the main current that flows through the mounting substrate and the semiconductor devices is unobstructed.

This makes it possible to design a current path for the main current on mounting substrate 50*fc* that reduces conduction resistance.

Thus, semiconductor modules 5*fa* through 5*fc* configured as described above make it possible to provide a semiconductor module having a feature that allows current to flow efficiently in the current path on the mounting substrate.

Semiconductor modules 5*fa* through 5*fd* configured as described above allow vias to be disposed in positions that do not obstruct the main current that flows through the mounting substrate and the semiconductor devices. Moreover, in semiconductor modules 5*fa* and 5*fc*, some vias can be shared. This allows for a design that reduces the conduction resistance of the mounting substrate.

Similarly, semiconductor modules 5*fe* and 5*ff* configured as described above allow vias to be disposed in positions in the clearance that do not obstruct the main current that flows through the mounting substrate and the semiconductor devices. This allows for a design that reduces the conduction resistance of the mounting substrate.

Embodiment 7

[7-1. Semiconductor Module Structure]

Hereinafter, the structure of the semiconductor module according to Embodiment 7 will be described.

Figure 32A:
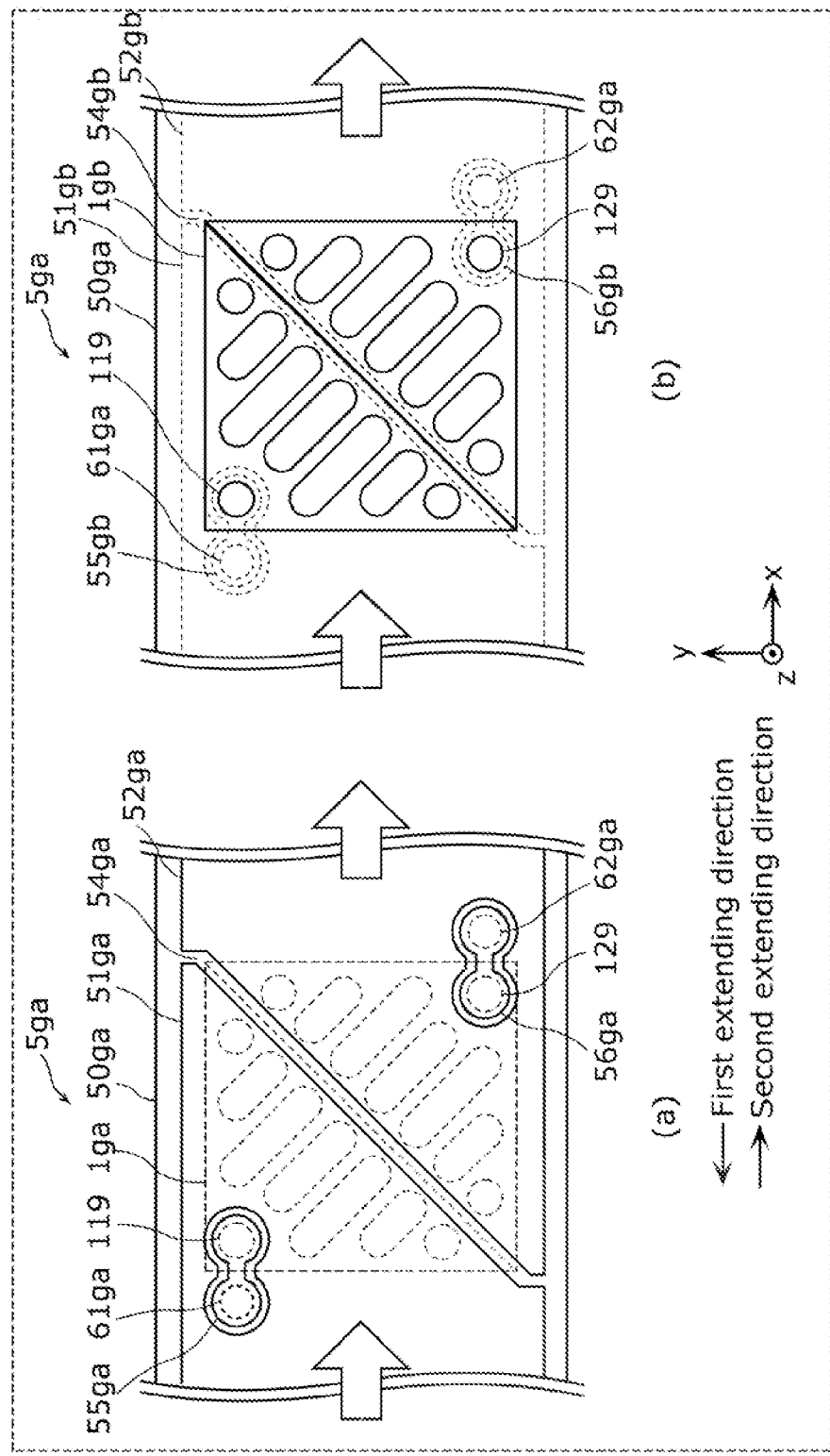
FIG. 32A is a plan view illustrating one example of the structure of a semiconductor module according to Embodiment 7.

FIG. 32A is a plan view illustrating one example of the structure of semiconductor module 5*ga* according to Embodiment 7.

As illustrated in FIG. 32A, semiconductor module 5*ga* includes two semiconductor devices 1 (hereinafter one may be referred to as semiconductor device 1*ga* and the other may be referred to as semiconductor device 1*gb* to distinguish between them) and mounting substrate 50*ga* on the front surface (hereinafter also referred to as a first surface) of which semiconductor device 1*ga* is face-down mounted and on the rear surface (hereinafter also referred to as second surface) of which semiconductor device 1*gb* is face-down mounted. In (a) in FIG. 32A, semiconductor device 1*ga* is drawn with dashed lines as if it were transparent so that the structure of the upper surface of semiconductor device 1ga and the structure of the first surface of mounting substrate 50ga, which cannot actually be seen, can be illustrated clearly, and in (b) in FIG. 32A, elements other than semiconductor device 1gb are drawn with dashed lines as if they were transparent and semiconductor device 1gb is drawn in solid lines so that the structure of the upper surface of semiconductor device 1gb can be illustrated clearly.

As illustrated in FIG. 32A, in a plan view of mounting substrate 50ga, semiconductor device 1ga is face-down mounted on the first surface of mounting substrate 50ga in an orientation in which first gate pad 119 is positioned on the first extending direction side among extending directions (the positive and negative x-axis directions in FIG. 32A) of the lengthwise direction of mounting substrate 50ga. In a plan view of mounting substrate 50ga, semiconductor device 1gb is face-down mounted on the second surface of mounting substrate 50ga in an orientation in which semiconductor device 1ga and semiconductor device 1gb overlap and the positions of first gate pad 119 of semiconductor device 1ga and first gate pad 119 of semiconductor device 1gb overlap.

Accordingly, in a plan view of mounting substrate 50ga, first upper surface region S1 of semiconductor device 1ga and first upper surface region S1 of semiconductor device 1gb overlap 100%, and second upper surface region S2 of semiconductor device 1ga and second upper surface region S2 of semiconductor device 1gb overlap 100%.

As illustrated in FIG. 32A, in a plan view of mounting substrate 50ga, mounting substrate 50ga is elongated in the lengthwise direction and has a constant width at least at the location where semiconductor device 1 is mounted. Mounting substrate 50ga includes first via 61ga and second via 62ga. First via 61ga passes through a first conductor (here, metal wiring 55ga (to be described later) electrically connected to first gate pad 119 of semiconductor device 1ga, or a conductor electrically connected to metal wiring 55ga, and metal wiring 55gb (to be described later) electrically connected to first gate pad 119 of semiconductor device 1gb, or a conductor electrically connected to metal wiring 55gb) electrically connected to first gate pad 119 of semiconductor device 1ga and first gate pad 119 of semiconductor device 1gb. Second via 62ga passes through a second conductor (here, metal wiring 56ga (to be described later) electrically connected to second gate pad 129 of semiconductor device 1ga, or a conductor electrically connected to metal wiring 56ga, and metal wiring 56gb (to be described later) electrically connected to second gate pad 129 of semiconductor device 1gb, or a conductor electrically connected to metal wiring 56gb) electrically connected to second gate pad 129 of semiconductor device 1ga and second gate pad 129 of semiconductor device 1gb.

Mounting substrate 50ga further includes, on the first surface thereof, first metal wiring 51ga, second metal wiring 52ga, metal wiring 55ga, and metal wiring 56ga.

First metal wiring 51ga and second metal wiring 52ga are disposed aligned in the extending directions of the lengthwise direction of mounting substrate 50ga (the positive and negative x-axis directions in FIG. 32A), with clearance 54ga therebetween.

First metal wiring 51ga is bonded to all of the one or more first source pads 111 of semiconductor device 1ga. For example, first metal wiring 51ga is bonded to all of the one or more first source pads 111 of semiconductor device 1ga with a conductive bonding material such as solder.

Second metal wiring 52ga is bonded to all of the one or more second source pads 121 of semiconductor device 1ga. For example, second metal wiring 52ga is bonded to all of the one or more second source pads 121 of semiconductor device 1ga with a conductive bonding material such as solder.

Accordingly, as illustrated in FIG. 32A, semiconductor device 1ga will be face-down mounted in a position bridging first metal wiring 51ga and second metal wiring 52ga across clearance 54ga.

Metal wiring 55ga is bonded to first gate pad 119 of semiconductor device 1ga. For example, metal wiring 55ga is bonded to first gate pad 119 of semiconductor device 1ga with a conductive bonding material such as solder.

Metal wiring 56ga is bonded to second gate pad 129 of semiconductor device 1ga. For example, metal wiring 56ga is bonded to second gate pad 129 of semiconductor device 1ga with a conductive bonding material such as solder.

Mounting substrate 50ga further includes, on the second surface thereof, first metal wiring 51gb, second metal wiring 52gb, metal wiring 55gb, and metal wiring 56gb.

First metal wiring 51gb and second metal wiring 52gb are disposed aligned in the extending directions of the lengthwise direction of mounting substrate 50ga (the positive and negative x-axis directions in FIG. 32A), with clearance 54gb therebetween.

First metal wiring 51gb is bonded to all of the one or more first source pads 111 of semiconductor device 1gb. For example, first metal wiring 51gb is bonded to all of the one or more first source pads 111 of semiconductor device 1gb with a conductive bonding material such as solder.

Second metal wiring 52gb is bonded to all of the one or more second source pads 121 of semiconductor device 1gb. For example, second metal wiring 52gb is bonded to all of the one or more second source pads 121 of semiconductor device 1gb with a conductive bonding material such as solder.

Accordingly, as illustrated in FIG. 32A, semiconductor device 1gb will be face-down mounted in a position bridging first metal wiring 51gb and second metal wiring 52gb across clearance 54gb.

Metal wiring 55gb is bonded to first gate pad 119 of semiconductor device 1gb. For example, metal wiring 55gb is bonded to first gate pad 119 of semiconductor device 1gb with a conductive bonding material such as solder.

Metal wiring 56gb is bonded to second gate pad 129 of semiconductor device 1gb. For example, metal wiring 56gb is bonded to second gate pad 129 of semiconductor device 1gb with a conductive bonding material such as solder.

Figure 32B:
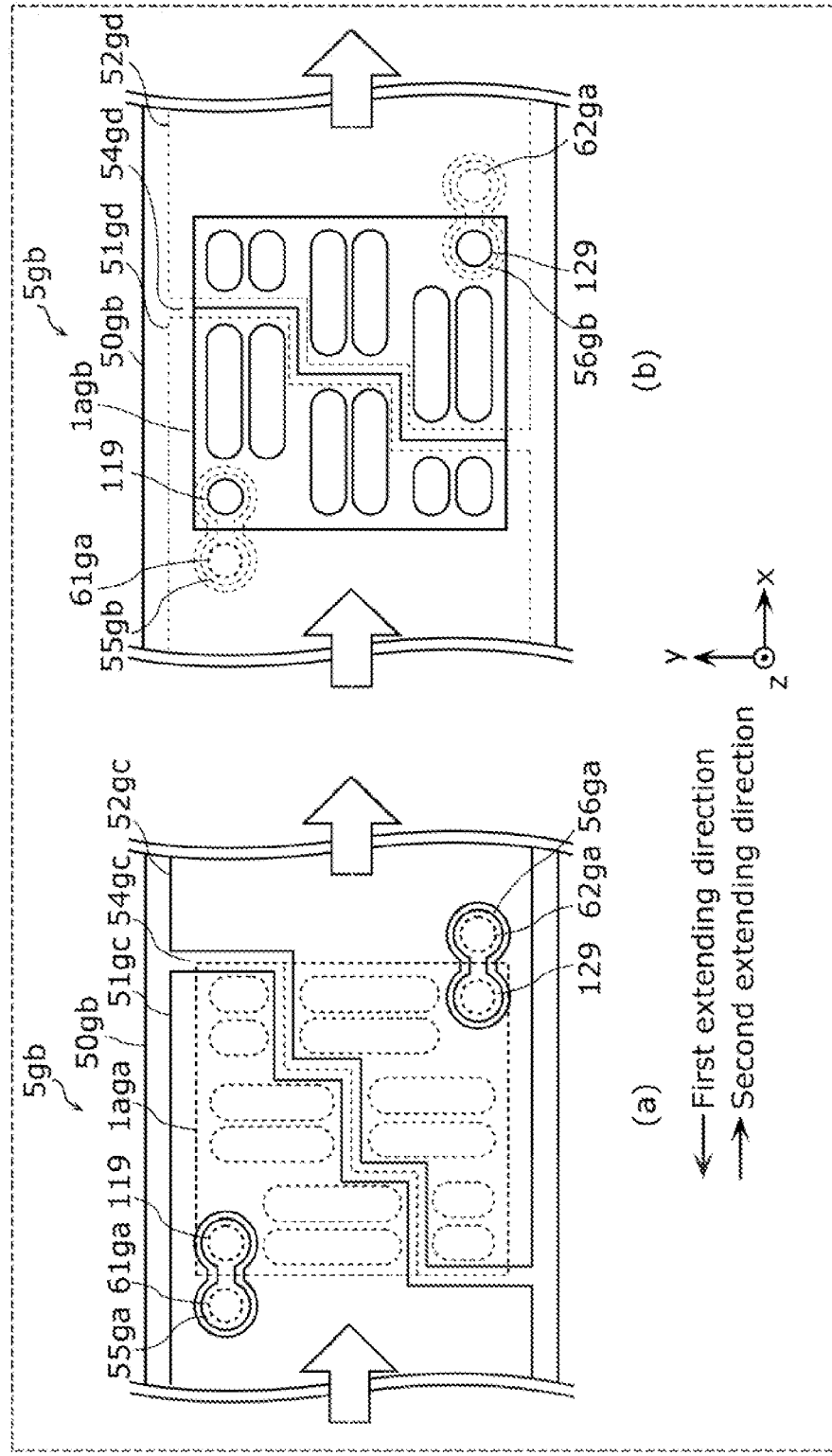
FIG. 32B is a plan view illustrating one example of the structure of the semiconductor module according to Embodiment 7.

FIG. 32B is a plan view illustrating one example of the structure of semiconductor module 5gb according to Embodiment 7.

As illustrated in FIG. 32B, semiconductor module 5gb is semiconductor module 5ga except that semiconductor device 1ga has been changed to semiconductor device 1aga, semiconductor device 1gb has been changed to semiconductor device 1agb, and mounting substrate 50ga has been changed to mounting substrate 50gb. In (a) in FIG. 32B, semiconductor device 1aga is drawn with dashed lines as if it were transparent so that the structure of the upper surface of semiconductor device 1aga and the structure of the first surface of mounting substrate 50gb, which cannot actually be seen, can be illustrated clearly, and in (b) in FIG. 32B, elements other than semiconductor device 1agb are drawn with dashed lines as if they were transparent and semiconductor device 1*agb* is drawn in solid lines so that the structure of the upper surface of semiconductor device 1*agb* can be illustrated clearly.

As illustrated in FIG. 32B, in a plan view of mounting substrate 50*gb*, semiconductor device 1*aga* is face-down mounted on the first surface of mounting substrate 50*gb* in an orientation in which first gate pad 119 is positioned on the first extending direction side among extending directions (the positive and negative x-axis directions in FIG. 32B) of the lengthwise direction of mounting substrate 50*gb*. In a plan view of mounting substrate 50*gb*, semiconductor device 1*agb* is face-down mounted on the second surface of mounting substrate 50*gb* in an orientation in which semiconductor device 1*aga* and semiconductor device 1*agb* overlap and the positions of first gate pad 119 of semiconductor device 1*aga* and first gate pad 119 of semiconductor device 1*agb* overlap.

As described above, in semiconductor devices 1*aga* and 1*agb*, angle θ1 between second virtual straight line 92 and the first virtual straight line is greater than 45 degrees and less than or equal to 90 degrees. Accordingly, in a plan view of mounting substrate 50*gb*, first upper surface region S1*a* of semiconductor device 1*agb* and first upper surface region S1*a* of semiconductor device 1*aga* overlap more than 50%, and second upper surface region S2*a* of semiconductor device 1*aga* and second upper surface region S2*a* of semiconductor device 1*agb* overlap more than 50%.

Mounting substrate 50*gb* is mounting substrate 50*ga* except that first metal wiring 51*ga* has been changed to first metal wiring 51*gc*, second metal wiring 52*ga* has been changed to second metal wiring 52*gc*, first metal wiring 51*gb* has been changed to first metal wiring 51*gd*, and second metal wiring 52*gb* has been changed to second metal wiring 52*gd*.

First metal wiring 51*gc* and second metal wiring 52*gc* are disposed aligned in the extending directions of the lengthwise direction of mounting substrate 50*gb* (the positive and negative x-axis directions in FIG. 32B), with clearance 54*gc* therebetween.

First metal wiring 51*gc* is bonded to all of the one or more first source pads 1111 of semiconductor device 1*aga*. For example, first metal wiring 51*gc* is bonded to all of the one or more first source pads 1111 of semiconductor device 1*aga* with a conductive bonding material such as solder.

Second metal wiring 52*gc* is bonded to all of the one or more second source pads 1121 of semiconductor device 1*aga*. For example, second metal wiring 52*gc* is bonded to all of the one or more second source pads 1121 of semiconductor device 1*aga* with a conductive bonding material such as solder.

Accordingly, as illustrated in FIG. 32B, semiconductor device 1*aga* will be face-down mounted in a position bridging first metal wiring 51*gc* and second metal wiring 52*gc* across clearance 54*gc*.

First metal wiring 51*gd* and second metal wiring 52*gd* are disposed aligned in the extending directions of the lengthwise direction of mounting substrate 50*gb* (the positive and negative x-axis directions in FIG. 32B), with clearance 54*gd* therebetween.

First metal wiring 51*gd* is bonded to all of the one or more first source pads 1111 of semiconductor device 1*agb*. For example, first metal wiring 51*gd* is bonded to all of the one or more first source pads 1111 of semiconductor device 1*agb* with a conductive bonding material such as solder.

Second metal wiring 52*gd* is bonded to all of the one or more second source pads 1121 of semiconductor device 1*agb*. For example, second metal wiring 52*gd* is bonded to all of the one or more second source pads 1121 of semiconductor device 1*agb* with a conductive bonding material such as solder.

Accordingly, as illustrated in FIG. 32B, semiconductor device 1*agb* will be face-down mounted in a position bridging first metal wiring 51*gd* and second metal wiring 52*gd* across clearance 54*gd*.

[7-2. Observations]

According to semiconductor module 5*ga* configured as described above, a via for passing a conductor that applies voltage to first gate pad 119 of semiconductor device 1*ga* and a via for passing a conductor that applies voltage to first gate pad 119 of semiconductor device 1*gb* can both be realized with a single first via 61*ga*, and a via for passing a conductor that applies voltage to second gate pad 129 of semiconductor device 1*ga* and a via for passing a conductor that applies voltage to second gate pad 129 of semiconductor device 1*gb* can both be realized with a single second via 62*ga*.

Moreover, since first via 61*ga* and second via 62*ga* can be provided closer to the edges of the mounting substrate, the current path of the main current that flows through the mounting substrate and the semiconductor devices is unobstructed.

In this way, since, on the mounting substrate on which two semiconductor devices of the same type are mounted, one on the front surface and the other on the rear surface, common wiring (vias) can be used for controlling both the electric potential of the first gate pad of one semiconductor device and the electric potential of the first gate pad of the other semiconductor device and common wiring (vias) can be used for controlling both the electric potential of the second gate pad of one semiconductor device and the electric potential of the second gate pad of the other semiconductor device, the wiring (vias) that conventionally had to be provided individually can be reduced, and the wiring of the mounting substrate, which tends to be complex, can therefore be simplified, which increases the ease of substrate design.

Furthermore, as illustrated in FIG. 32A and FIG. 32B, due to the fact that the gate pads of the semiconductor devices according to the present disclosure are provided near the corners of the semiconductor devices, the common wiring (vias) can be drawn out to the edges of the mounting substrate so as not to obstruct the flow of the main current. This is suitable for securing a wide current path for the main current on the mounting substrate, and allows for mounting that reduces conduction resistance.

This makes it possible to design a current path for the main current on mounting substrate 50*ga* that reduces conduction resistance.

According to semiconductor module 5*ga* configured as described above, in a plan view of mounting substrate 50*ga*, first upper surface region S1 of semiconductor device 1*ga* and first upper surface region S1 of semiconductor device 1*gb* can be made to completely overlap with mounting substrate 50*ga* therebetween, and second upper surface region S2 of semiconductor device 1*ga* and second upper surface region S2 of semiconductor device 1*gb* can be made to completely overlap with mounting substrate 50*ga* therebetween.

This makes it possible to maximally widen the conduction cross-sectional area of the current path on mounting substrate 50*ga*.

This makes it possible to design a current path for the main current on mounting substrate 50*ga* that reduces conduction resistance.

Similarly, according to semiconductor module 5*gb* configured as described above, a via for passing a conductor that applies voltage to first gate pad 119 of semiconductor device 1*aga* and a via for passing a conductor that applies voltage to first gate pad 119 of semiconductor device 1*agb* can both be realized with a single first via 61*ga*, and a via for passing a conductor that applies voltage to second gate pad 129 of semiconductor device 1*aga* and a via for passing a conductor that applies voltage to second gate pad 129 of semiconductor device 1*agb* can both be realized with a single second via 62*ga*.

Moreover, since first via 61*ga* and second via 62*ga* can be provided closer to the edges of the mounting substrate, the current path of the main current that flows through the mounting substrate and the semiconductor devices is unobstructed.

Just like with mounting substrate 50*ga*, this makes it possible to design a current path for the main current on mounting substrate 50*gb* that reduces conduction resistance.

According to semiconductor module 5*gb* configured as described above, in a plan view of mounting substrate 50*gb*, first upper surface region S1*a* of semiconductor device 1*aga* and first upper surface region S1*a* of semiconductor device 1*agb* can be made to overlap more than 50% with mounting substrate 50*ga* therebetween, and second upper surface region S2*a* of semiconductor device 1*aga* and second upper surface region S2*a* of semiconductor device 1*agb* can be made to overlap more than 50% with mounting substrate 50*ga* therebetween.

This allows for a relatively wide conduction cross-sectional area of the current path on mounting substrate 50*gb*.

Embodiment 8

[8-1. Semiconductor Device Structure]

Hereinafter, the semiconductor device according to Embodiment 8 will be described. The semiconductor device according to Embodiment 8 is semiconductor device 1*a* according to Embodiment 2 with some configuration changes. Accordingly, detailed description of aspects of the semiconductor device according to Embodiment 8 that are the same as semiconductor device 1*a* will be omitted as they have already been described above. Moreover, elements that are the same as in semiconductor device 1*a* have the same reference signs. Hereinafter, description will focus on the points of differences from semiconductor device 1*a*.

Figure 33:
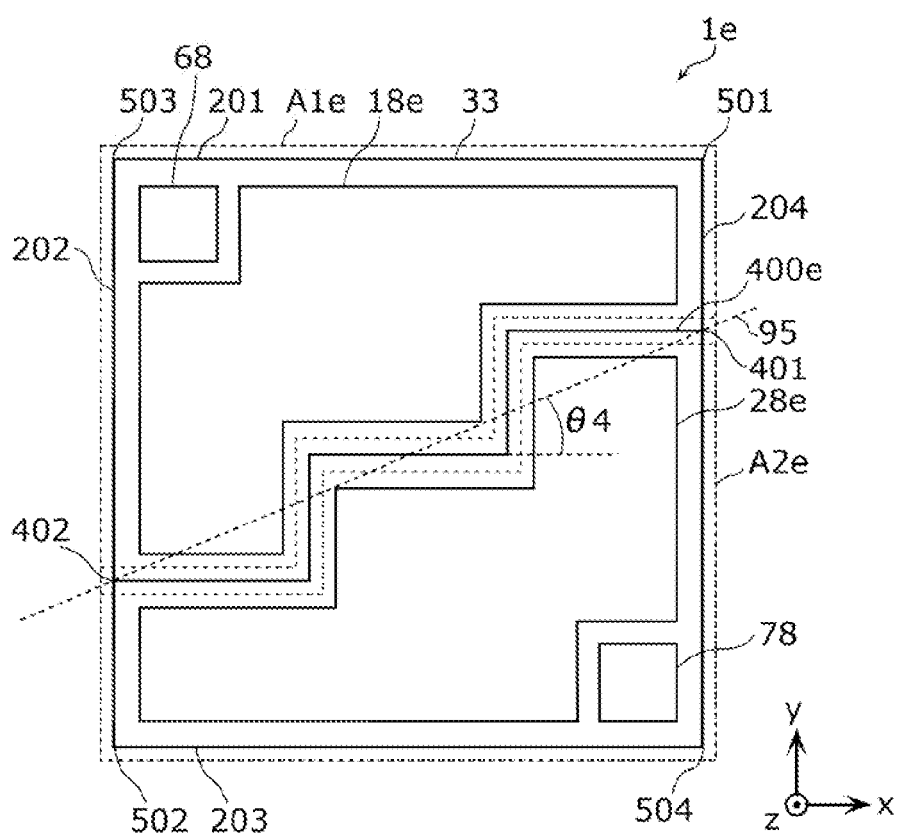
FIG. 33 is a plan view illustrating one example of the structure of a semiconductor device according to Embodiment 8.

FIG. 33 is a plan view illustrating one example of the structure of semiconductor device 1*e* according to Embodiment 8. In FIG. 33, illustration of the structures between the upper surface of semiconductor device 1*e* and first body region 18*e* (to be described later) and second body region 28*e* (to be described later) is omitted so as to expose first body region 18*e* and second body region 28*e* for illustrative purposes.

As illustrated in FIG. 33, semiconductor device 1*e* is semiconductor device 1*a* according to Embodiment 2 except that first body region 18 has been changed to first body region 18*e*, second body region 28 has been changed to second body region 28*e*, first internal region A1 has been changed to first internal region A1*e*, and second internal region A2 has been changed to second internal region A2*e*.

As illustrated in FIG. 33, first body region 18*e*, second body region 28*e*, first internal region A1*e*, and second internal region A2*e* differ from first body region 18, second body region 28, first internal region A1, and second internal region A2, respectively, in regard to their shapes.

As illustrated in FIG. 33, first internal region A1*e* and second internal region A2*e* are adjacent to each other in a plan view of semiconductor layer 40 and divide semiconductor layer 40 into two equal parts in terms of surface area.

As illustrated in FIG. 33, in a plan view of semiconductor layer 40, internal boundary line 400*e*, which is the boundary line between first internal region A1*e* and second internal region A2*e*, consists of alternately connected N−1 (N is an integer greater than or equal to three; in this example, N is four) line segments orthogonal to fourth side 204 at which first terminal end 401, which is one of the terminal ends of internal boundary line 400*e*, terminates, and N−2 line segments parallel to fourth side 204, and monotonically changes in the direction in which second side 202 extends and the direction in which first side 201 extends.

The distance between first vertex 501 and first terminal end 401 is greater than or equal to 1/N of the length of fourth side 204.

The distance between second vertex 502 and second terminal end 402, which is the other terminal end of internal boundary line 400*e*, is greater than or equal to 1/N of the length of second side 202.

In a plan view of semiconductor layer 40, angle θ4 between third virtual straight line 95, which connects first terminal end 401 and second terminal end 402, and first side 201 is greater than or equal to 16 degrees.

Internal boundary line 400*e* does not necessarily need to coincide with upper surface boundary line 600*a* in a plan view of semiconductor layer 40, but it may.

Although the shape of semiconductor layer 40 is described as square here, the shape of semiconductor layer 40 may be rectangular, not square. In such cases, first terminal end 401 terminates on one, first longer side of semiconductor layer 40 and second terminal end 402 terminates on the other, second longer side of semiconductor layer 40. Alternatively, first terminal end 401 terminates on one, first shorter side of semiconductor layer 40 and second terminal end 402 terminates on the other, second shorter side of semiconductor layer 40.

[8-2. Semiconductor Module Structure]

Hereinafter, the semiconductor module according to Embodiment 8 will be described. The semiconductor module according to Embodiment 8 is semiconductor module 5*ea* or 5*eb* according to Embodiment 5 with some configuration changes, or semiconductor module 5*fb* or 5*fd* according to Embodiment 6 with some configuration changes. Accordingly, detailed description of aspects of the semiconductor module according to Embodiment 8 that are the same as semiconductor module 5*ea* or 5*eb*, or semiconductor module 5*fb* or 5*fd* will be omitted as they have already been described above. Moreover, elements that are the same as in semiconductor module 5*ea* or 5*eb*, or semiconductor module 5*fb* or 5*fd* have the same reference signs. Hereinafter, description will focus on the points of differences from semiconductor module 5*ea* or 5*eb* or semiconductor module 5*fb* or 5*fd*.

Figure 34A:
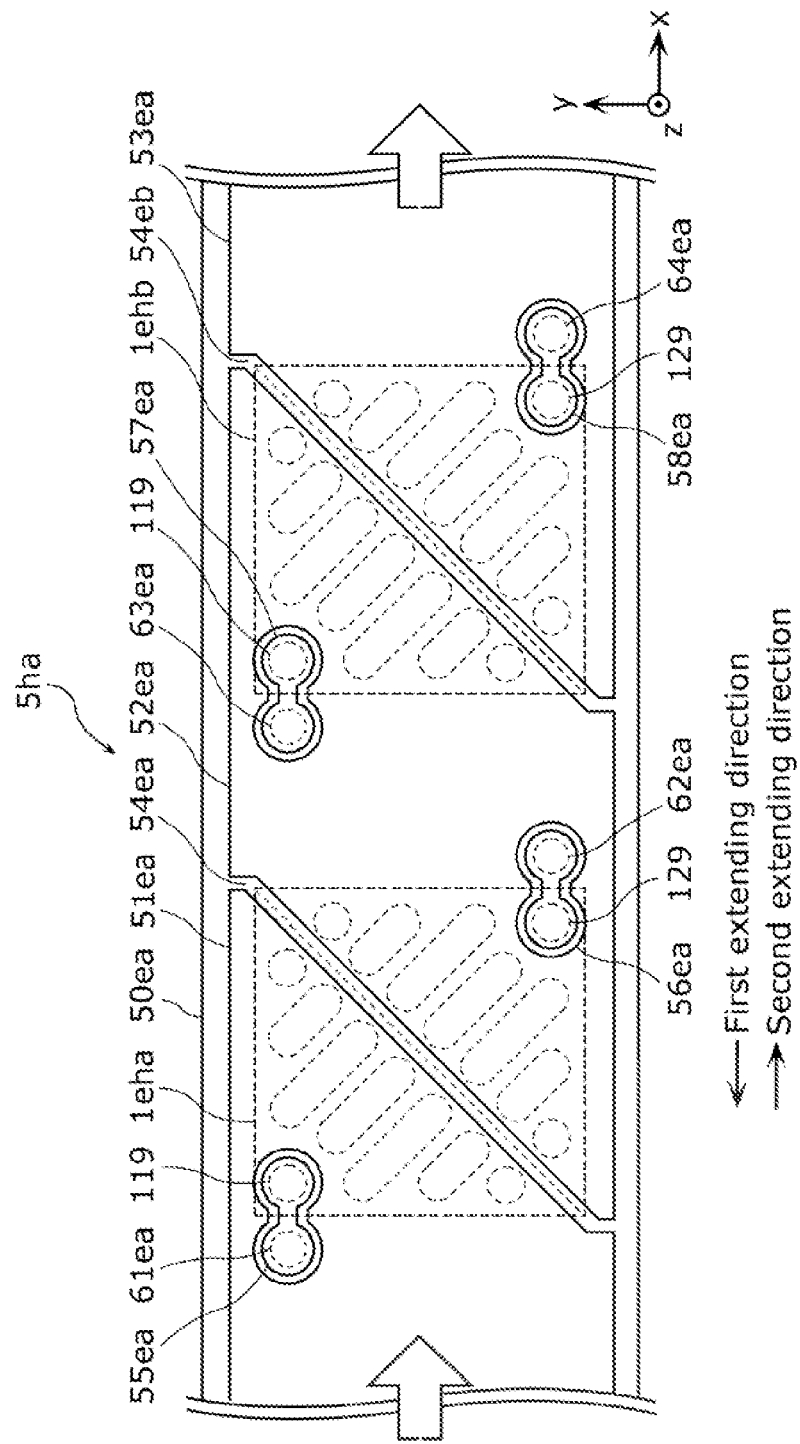
FIG. 34A is a plan view illustrating one example of the structure of a semiconductor module according to Embodiment 8.

FIG. 34A is a plan view illustrating one example of the structure of semiconductor module 5*ha* according to Embodiment 8.

As illustrated in FIG. 34A, semiconductor module 5*ha* is semiconductor module 5*ea* according to Embodiment 5 except that semiconductor device 1*ea* has been changed to semiconductor device 1*eha*, which is one of semiconductor devices 1*e*, and semiconductor device 1*eb* has been changed to semiconductor device 1*ehb*, which is the other of semiconductor devices 1*e*.

Here, semiconductor devices 1*eha* and 1*ehb* are equivalent to semiconductor devices 1*e* whose upper surfaces have the same shape as semiconductor device 1.

Figure 34B:
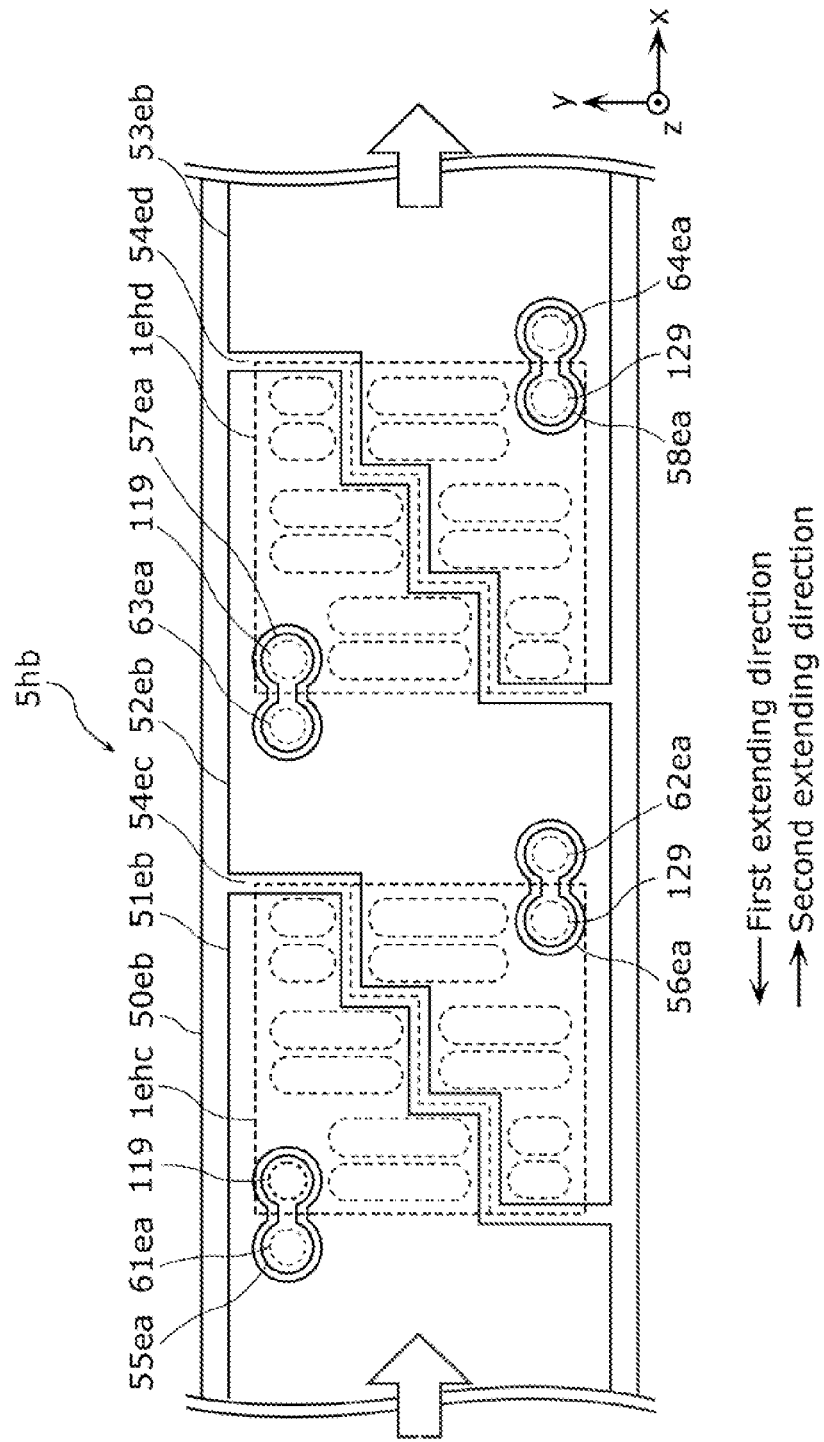
FIG. 34B is a plan view illustrating one example of the structure of the semiconductor module according to Embodiment 8.

FIG. 34B is a plan view illustrating one example of the structure of semiconductor module 5*hb* according to Embodiment 8.

As illustrated in FIG. 34B, semiconductor module 5*hb* is semiconductor module 5*eb* according to Embodiment 5 except that semiconductor device 1*aea* has been changed to semiconductor device 1*ehc*, which is one of semiconductor devices 1*e*, and semiconductor device 1*aeb* has been changed to semiconductor device 1*ehd*, which is the other of semiconductor devices 1*e*.

Here, semiconductor devices 1*ehc* and 1*ehd* are equivalent to semiconductor devices 1*e* whose upper surfaces have the same shape as semiconductor device 1*a* and, in a plan view of semiconductor layer 40, whose internal boundary line 400*e* and upper surface boundary line 600*a* coincide.

Figure 35A:
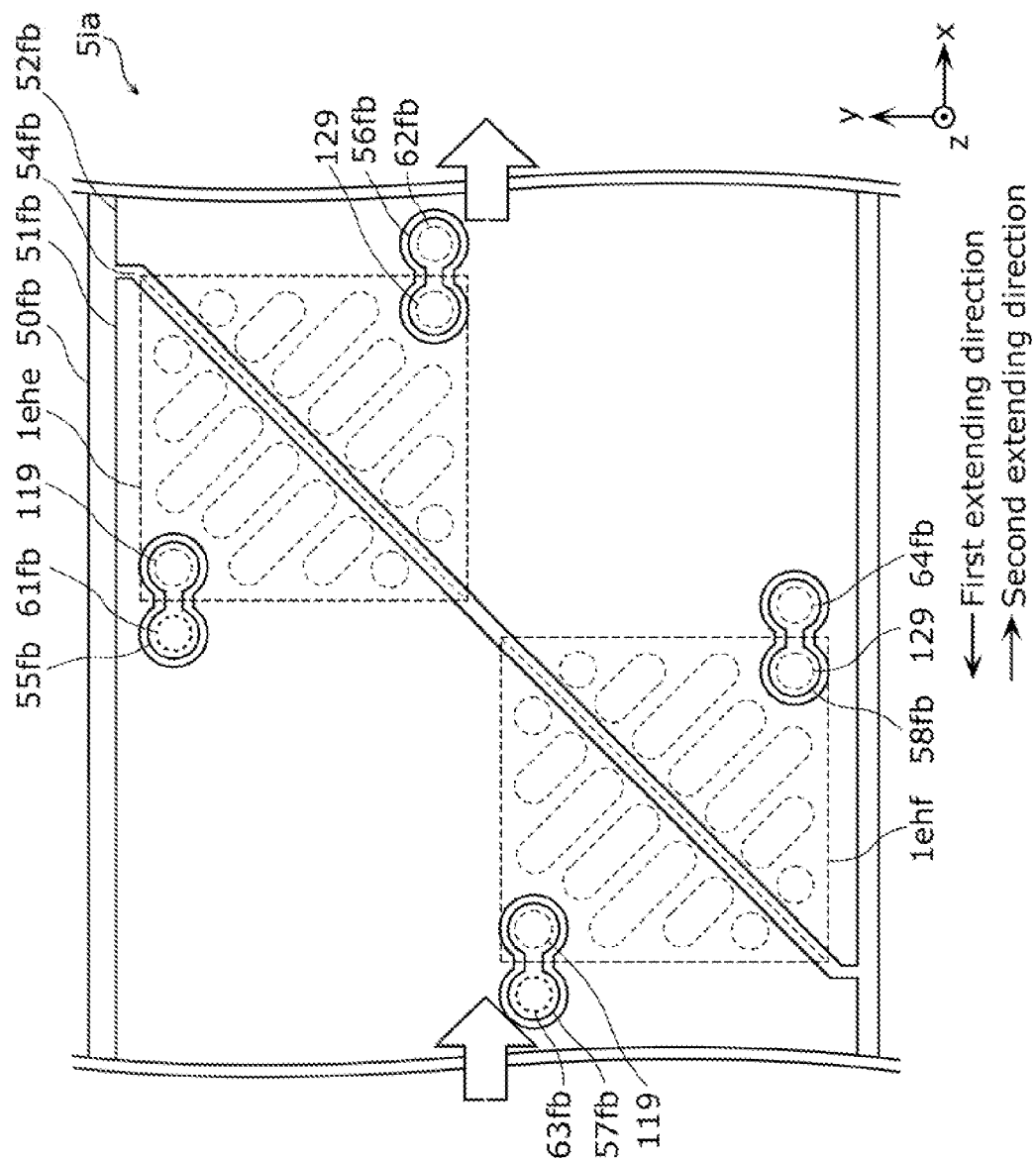
FIG. 35A is a plan view illustrating one example of the structure of a semiconductor module according to Embodiment 8.

FIG. 35A is a plan view illustrating one example of the structure of semiconductor module 5*ia* according to Embodiment 8.

As illustrated in FIG. 35A, semiconductor module 5*ia* is semiconductor module 5*fb* according to Embodiment 6 except that semiconductor device 1*fc* has been changed to semiconductor device 1*ehe*, which is one of semiconductor devices 1*e*, and semiconductor device 1*fd* has been changed to semiconductor device 1*ehf*, which is the other of semiconductor devices 1*e*.

Here, semiconductor devices 1*ehe* and 1*ehf* are equivalent to semiconductor devices 1*e* whose upper surfaces have the same shape as semiconductor device 1.

Figure 35B:
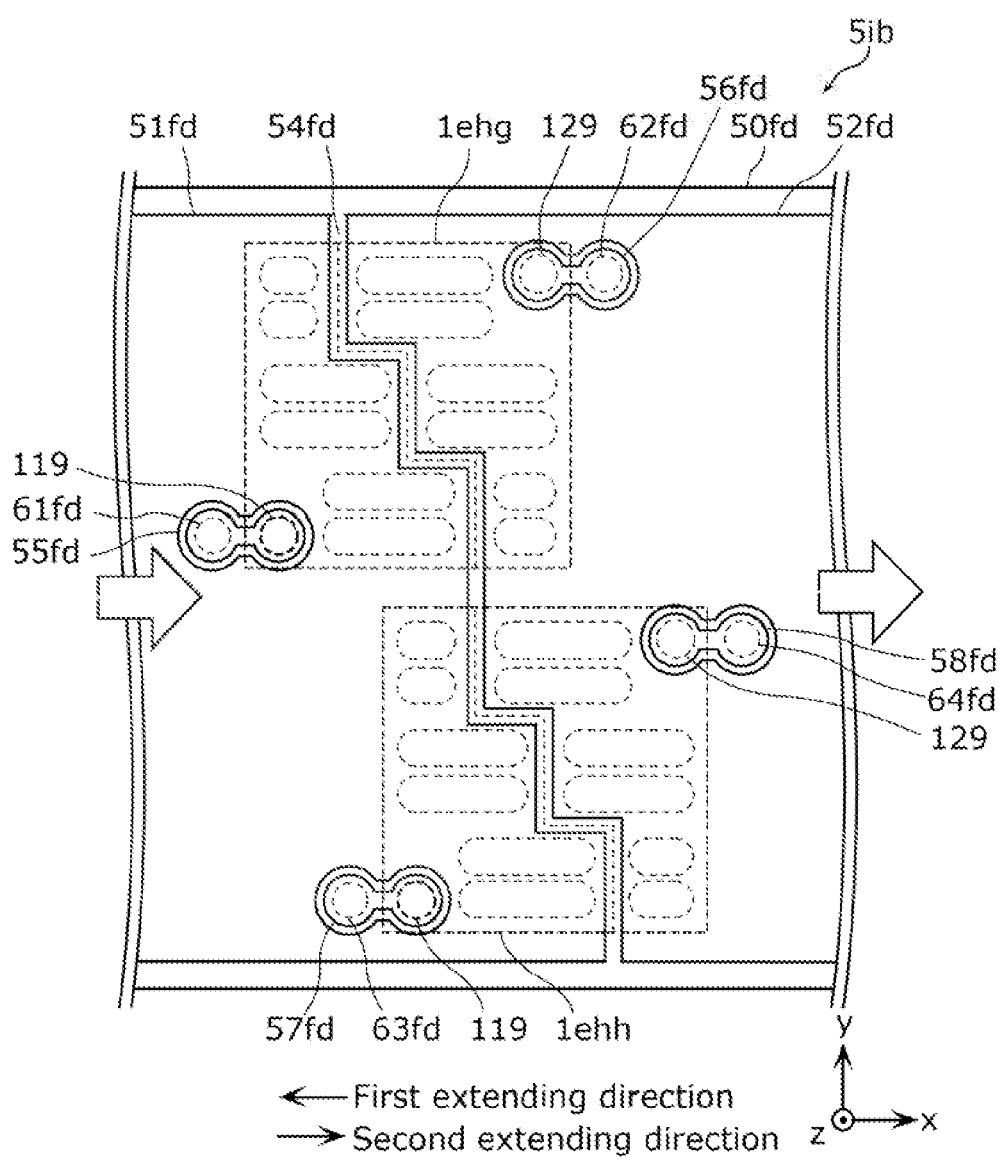
FIG. 35B is a plan view illustrating one example of the structure of the semiconductor module according to Embodiment 8.

FIG. 35B is a plan view illustrating one example of the structure of semiconductor module 5*ib* according to Embodiment 8.

As illustrated in FIG. 35B, semiconductor module 5*ib* is semiconductor module 5*fd* according to Embodiment 6 except that semiconductor device 1*afc* has been changed to semiconductor device 1*ehg*, which is one of semiconductor devices 1*e*, and semiconductor device 1*afd* has been changed to semiconductor device 1*ehh*, which is the other of semiconductor devices 1*e*.

Here, semiconductor devices 1*ehg* and 1*ehh* are equivalent to semiconductor devices 1*e* whose upper surfaces have the same shape as semiconductor device 1*a* and, in a plan view of semiconductor layer 40, whose internal boundary line 400*e* and upper surface boundary line 600*a* coincide.

[8-3. Observations]

According to semiconductor device 1*e* configured as described above, in a plan view of semiconductor layer 40, the length of internal boundary line 400*e* is longer than the internal boundary line of a conventional semiconductor device, which extends in a straight line orthogonal or parallel to the longer side direction of the semiconductor layer. Therefore, the current-carrying cross-sectional area of the current that flows horizontally through metal layer 30 is larger when the current flows from first source pads 1111 to second source pads 1121 or from second source pads 1121 to first source pads 1111.

With this, when the current flows from first source pads 1111 to second source pads 1121 or from second source pads 1121 to first source pads 1111, the resistance value of semiconductor device 1*e* can be reduced more than conventional techniques.

Thus, semiconductor device 1*e* configured as described above makes it possible to provide a semiconductor device having a feature that allows current to flow efficiently in the current path on the mounting substrate on which it is mounted.

According to semiconductor module 5*ib* configured as described above, semiconductor device 1*ehg* and semiconductor device 1*ehh* are disposed in an inclined positional relationship with respect to each side of semiconductor device 1*ehg* and each side of semiconductor device 1*ehh*.

This reduces the effect of the heat generated by semiconductor device 1*ehg* on semiconductor device 1*ehh* and the effect of the heat generated by semiconductor device 1*ehh* on semiconductor device 1*ehg* in semiconductor module 5*ib*.

Thus, semiconductor module 5*ib* configured as described above makes it possible to provide a semiconductor module having a feature that allows current to flow efficiently in the current path on the mounting substrate.

Next, the preferred range of angle $\theta 4$ will be considered.

Figure 36:
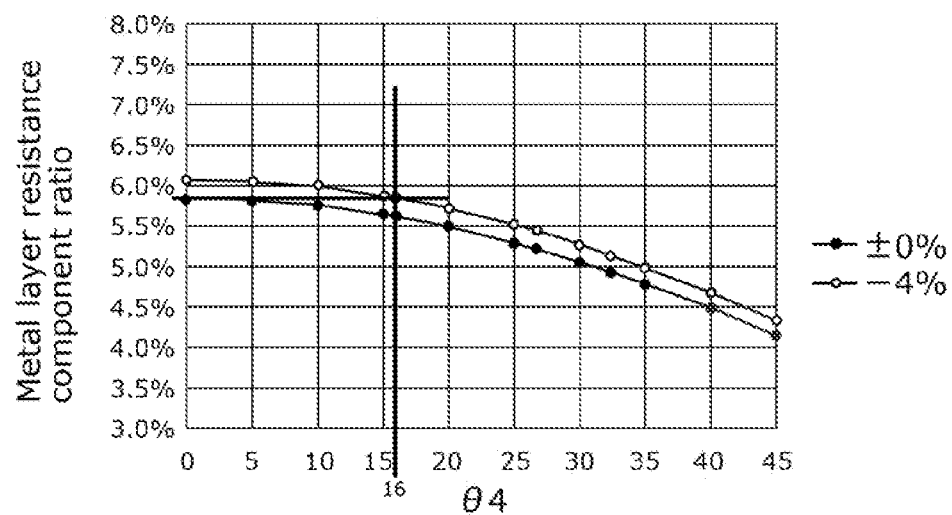
FIG. 36 is a graph illustrating the relationship between angle $\theta 4$ and the metal layer resistance component ratio according to Embodiment 8.
Figure 37:
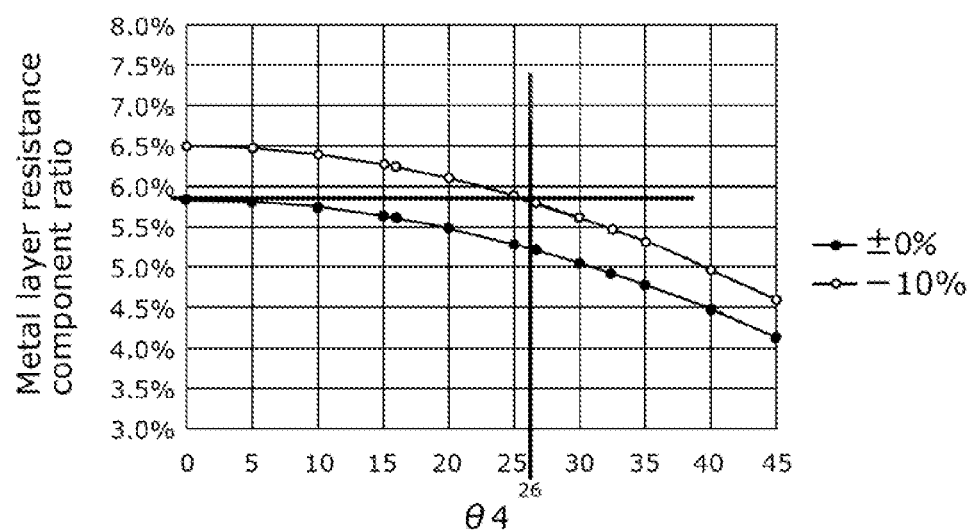
FIG. 37 is a graph illustrating the relationship between angle θ4 and the metal layer resistance component ratio according to Embodiment 8.

FIG. 36 and FIG. 37 are graphs illustrating the relationship between angle $\theta 4$ and the on-resistance of semiconductor device 1*e*, i.e., the resistance component ratio of metal layer 30 in the resistance of semiconductor device 1*e* when the current flows from first source pads 1111 to second source pads 1121 or from second source pads 1121 to first source pads 1111 (hereinafter also referred to as the metal layer resistance component ratio).

In FIG. 36 and FIG. 37, the horizontal axis is angle $\theta 4$, and the vertical axis is the metal layer resistance component ratio.

In FIG. 36 and FIG. 37, the black circles indicate the metal layer resistance component ratio when the finished dimension of the thickness of metal layer 30 is the specified value. In FIG. 36, the white circles indicate the metal layer resistance component ratio when the finished dimension of the thickness of metal layer 30 is 4% thinner than the specified value. In FIG. 37, the white circles indicate the metal layer resistance component ratio when the finished dimension of the thickness of metal layer 30 is 10% thinner than the specified value.

The finished dimension of the thickness of metal layer 30 of semiconductor device 1*e* may vary in a range of ±4% due to manufacturing variations in the production process.

As illustrated in FIG. 36, so long as $\theta 4$ is greater than or equal to 16 degrees, even when the finished dimension of the thickness of metal layer 30 is 4% thinner than the specified value due to manufacturing variations, semiconductor device 1*e* can maintain the metal layer resistance component ratio corresponding to when the finished dimension of the thickness of metal layer 30 is the specified value when $\theta 4$ is 0 degrees.

$\theta 4$ is therefore preferably greater than or equal to 16 degrees.

As illustrated in FIG. 37, by setting $\theta 4$ to greater than or equal to 26 degrees, semiconductor device 1*e* can reduce the thickness of metal layer 30 by 10% while maintaining the metal layer resistance component ratio corresponding to when $\theta 4$ is 0 degrees.

Therefore, by setting $\theta 4$ to greater than or equal to 26 degrees, semiconductor device 1*e* can achieve the same low-resistance advantageous effects as when the thickness of metal layer 30 is 10% thicker. Accordingly, $\theta 4$ is preferably greater than or equal to 26 degrees.

Next, the amount of offset between semiconductor devices 1*ehg* and 1*ehh* in semiconductor module 5*ib* in the direction in the extending directions of the lengthwise direction of mounting substrate 50*fd* (the positive and negative x-axis directions in FIG. 35B) (hereinafter also referred to as the amount of offset between semiconductor devices 1e) will be considered.

The inventors discovered that increasing the amount of offset between semiconductor devices 1e reduces the effect of the heat generated by semiconductor device 1ehg on semiconductor device 1ehh and the effect of the heat generated by semiconductor device 1ehh on semiconductor device 1ehg in semiconductor module 5ib. If the amount of offset between semiconductor devices 1e is too large, however, the lengthwise dimension of mounting substrate 50fd will increase, which is disadvantageous.

For this reason, the inventors conducted repeated experiments and examination in order to calculate an effective value for the amount of offset between semiconductor devices 1e. As a result, the inventors found that the amount of offset between semiconductor devices 1e is preferably greater than or equal to half the width of semiconductor devices 1e in the extending directions of the lengthwise direction of mounting substrate 50fd.

Figures 38, 39:
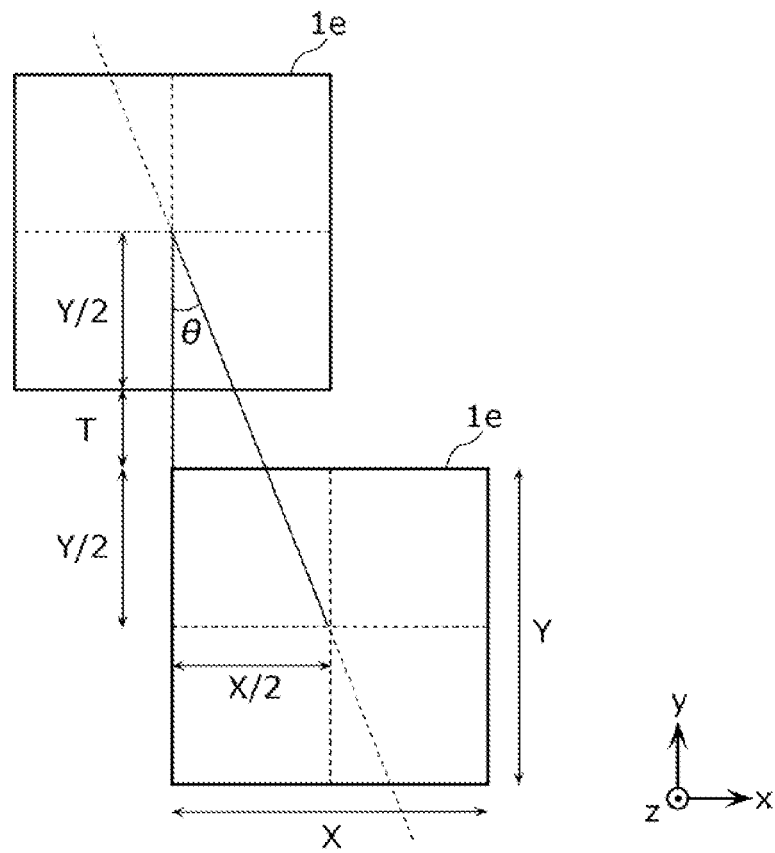
FIG. 38 is a schematic diagram illustrating the relationship between (i) the size of the semiconductor devices and the amount of offset between the semiconductor devices, and (ii) angle θ according to Embodiment 8.
FIG. 39 is a diagram illustrating one example of the relationship between (i) the size of the semiconductor devices and the amount of offset between the semiconductor devices, and (ii) angle θ according to Embodiment 8 which the inventors believe to be preferable.

FIG. 38 is a schematic diagram illustrating, in semiconductor module 5ib, the relationship between (i) the size of the two semiconductor devices 1e (semiconductor devices 1ehg and 1ehh) and the amount of offset between semiconductor devices 1e, and (ii) angle θ between a straight line connecting the centers of the two semiconductor devices 1e and the direction orthogonal to the extending directions of the lengthwise direction of mounting substrate 50fd.

FIG. 39 is a diagram illustrating one example, which the inventors consider preferable, of the relationship between (i) the size of the two semiconductor devices 1e and the amount of offset between semiconductor devices 1e and (ii) θ.

In FIG. 38 and FIG. 39, length Y is the width of semiconductor device 1e in the direction orthogonal to the extending directions of the lengthwise direction of mounting substrate 50fd, length X is the width of semiconductor device 1e in the extending directions of the lengthwise direction of mounting substrate 50fd, length T is the distance between the two semiconductor devices 1e in the direction orthogonal to the extending directions of the lengthwise direction of mounting substrate 50fd, and angle θ is the angle between the straight line connecting the centers of the two semiconductor devices 1e and the direction orthogonal to the extending directions of the lengthwise direction of mounting substrate 50fd.

As illustrated in FIG. 39, angle θ is from 25.8 degrees to 26.0 degrees, and 26 degrees or more is preferred for the amount of offset.

The advantageous effect achieved by the present Embodiment 8 is the reduction of the resistance component when the current that flows through metal layer 30 of semiconductor device 1e flows horizontally. However, the advantageous effect is weakened if internal boundary line 400 contains areas where current cannot flow in the horizontal component in the first place. Stated differently, no matter how long internal boundary line 400 is, no advantageous effect can be expected unless internal boundary line 400 is defined by the so-called active regions—where channels are formed in the respective first and second transistors and contribute to conduction—facing each other. Therefore, in order to properly achieve the advantageous effect of the present Embodiment 8, internal boundary line 400 is desirably limited to the length of the portions of the active regions that face each other.

The slope angle θ of internal boundary line 400 described above has an upper limit. Assuming that aspect α(=Ly/Lx) is calculated from length Lx of the longer side of semiconductor device 1e and length Ly of the shorter side of semiconductor device 1e, the upper limit of angle θ when the two terminal ends of internal boundary line 400 are on the shorter sides of semiconductor device 1e is atan(α) degrees, and the upper limit of angle θ when the two terminal ends of internal boundary line 400 are on the longer sides of semiconductor device 1e is atan (1/α) degrees.

Additional Comments

Although the semiconductor device and the semiconductor module according to one aspect of the present disclosure have been described above based on Embodiments 1 to 8, the present disclosure is not limited to these embodiments. Various modifications to the embodiments which may be conceived by those skilled in the art, as well as other forms resulting from combinations of one or more elements from different embodiments are also included within the scope of the present disclosure so long as they do not depart from the essence of the present disclosure.

INDUSTRIAL APPLICABILITY

The present disclosure is widely applicable to, for example, semiconductor devices and semiconductor modules using the same.

The invention claimed is:

1. A semiconductor device of chip-size package type that is face-down mountable, the semiconductor device comprising:
   a semiconductor layer;
   a metal layer in contact with a rear surface of the semiconductor layer;
   a first vertical MOS transistor in a first internal region inside the semiconductor layer;
   a second vertical MOS transistor in a second internal region inside the semiconductor layer, the second internal region being adjacent to the first internal region in a plan view of the semiconductor layer;
   one or more first source pads and a first gate pad in a first upper surface region of an upper surface of the semiconductor layer, the one or more first source pads being connected to a source electrode of the first vertical MOS transistor, the first gate pad being connected to a gate electrode of the first vertical MOS transistor; and
   one or more second source pads and a second gate pad in a second upper surface region of the upper surface of the semiconductor layer, the one or more second source pads being connected to a source electrode of the second vertical MOS transistor, the second gate pad being connected to a gate electrode of the second vertical MOS transistor, the second upper surface region being adjacent to the first upper surface region in the plan view of the semiconductor layer, wherein:
   in the plan view of the semiconductor layer, the first internal region and the second internal region divide the semiconductor layer into two equal parts in terms of surface area,
   in the plan view of the semiconductor layer, the first upper surface region and the second upper surface region divide the semiconductor layer into two equal parts in terms of surface area,
   the semiconductor layer includes a semiconductor substrate,
   the semiconductor substrate functions as a common drain region for the first vertical MOS transistor and the second vertical MOS transistor, the semiconductor layer has a rectangular plan view shape, and in the plan view of the semiconductor layer:
a first virtual straight line connecting a center of the first gate pad and a center of the second gate pad passes through a center of the semiconductor layer and forms a 45 degree angle with each long side of the semiconductor layer;
a length of an upper surface boundary line is greater than a length of a longer side of the semiconductor layer, the upper surface boundary line being a boundary line between the first upper surface region and the second upper surface region; and
the upper surface boundary line monotonically changes in a longer side direction in which the longer side extends and a shorter side direction in which a shorter side of the semiconductor layer extends, and
in the upper surface, the semiconductor device comprises no pad other than the first gate pad, the second gate pad, the one or more first source pads and the one or more second source pads.

2. A semiconductor device of chip-size package type that is face-down mountable, the semiconductor device comprising:
a semiconductor layer;
a metal layer in contact with a rear surface of the semiconductor layer;
a first vertical MOS transistor in a first internal region inside the semiconductor layer;
a second vertical MOS transistor in a second internal region inside the semiconductor layer, the second internal region being adjacent to the first internal region in a plan view of the semiconductor layer;
one or more first source pads and a first gate pad in a first upper surface region of an upper surface of the semiconductor layer, the one or more first source pads being connected to a source electrode of the first vertical MOS transistor, the first gate pad being connected to a gate electrode of the first vertical MOS transistor; and
one or more second source pads and a second gate pad in a second upper surface region of the upper surface of the semiconductor layer, the one or more second source pads being connected to a source electrode of the second vertical MOS transistor, the second gate pad being connected to a gate electrode of the second vertical MOS transistor, the second upper surface region being adjacent to the first upper surface region in the plan view of the semiconductor layer, wherein:
in the plan view of the semiconductor layer, the first internal region and the second internal region divide the semiconductor layer into two equal parts in terms of surface area,
in the plan view of the semiconductor layer, the first upper surface region and the second upper surface region divide the semiconductor layer into two equal parts in terms of surface area,
the semiconductor layer includes a semiconductor substrate,
the semiconductor substrate functions as a common drain region for the first vertical MOS transistor and the second vertical MOS transistor,
the semiconductor layer has a square plan view shape with sides extending in a first direction and a second direction orthogonal to the first direction,
in the plan view of the semiconductor layer:
a first virtual straight line connecting a center of the first gate pad and a center of the second gate pad passes through a center of the semiconductor layer and forms a 45 degree angle with each side of the semiconductor layer; and
an upper surface boundary line between the first upper surface region and the second upper surface region monotonically changes in the first direction and the second direction, and
in the upper surface, the semiconductor device comprises no pad other than the first gate pad, the second gate pad, the one or more first source pads and the one or more second source pads.

3. The semiconductor device according to claim 2, wherein
in the plan view of the semiconductor layer, the first gate pad is arranged such that no part of any of the one or more first source pads is disposed between the first gate pad and a first side of the semiconductor layer or the first gate pad and a second side of the semiconductor layer, the first side and the second side being nearest neighboring sides among four sides of the semiconductor layer, and
in the plan view of the semiconductor layer, the second gate pad is arranged such that no part of any of the one or more second source pads is disposed between the second gate pad and a third side of the semiconductor layer or the second gate pad and a fourth side of the semiconductor layer, the third side and the fourth side being nearest neighboring sides among the four sides of the semiconductor layer.

4. The semiconductor device according to claim 3, wherein
in the plan view of the semiconductor layer, an angle between the first virtual straight line and a second virtual straight line is greater than 45 degrees and less than or equal to 90 degrees, the second virtual straight line connecting a first intersection and a second intersection, the first intersection being an intersection of the upper surface boundary line and the first side or the second side, the second intersection being an intersection of the upper surface boundary line and the third side or the fourth side.

5. The semiconductor device according to claim 4, wherein
the angle is greater than or equal to 60 degrees and less than or equal to 90 degrees.

6. The semiconductor device according to claim 3, wherein
in the plan view of the semiconductor layer, an angle between the first virtual straight line and a second virtual straight line is greater than or equal to 0 degrees and less than 45 degrees, the second virtual straight line connecting a first intersection and a second intersection, the first intersection being an intersection of the upper surface boundary line and the first side or the second side, the second intersection being an intersection of the upper surface boundary line and the third side or the fourth side.

7. The semiconductor device according to claim 6, wherein
the angle is greater than or equal to 0 degrees and less than 22 degrees.

8. The semiconductor device according to claim 3, wherein
the one or more first source pads are composed of one first source pad disposed over approximately an entire surface of the first upper surface region excluding a region of the first gate pad, and the one or more second source pads are composed of one second source pad disposed over approximately an entire surface of the second upper surface region excluding a region of the second gate pad.

9. The semiconductor device according to claim 3, wherein
the one or more first source pads comprise a plurality of first source pads, each of the one or more first source pads is shaped such that each side opposing another one of the plurality of first source pads is orthogonal or parallel to the upper surface boundary line,
the one or more second source pads comprise a plurality of second source pads, and
each of the one or more second source pads is shaped such that each side opposing another one of the plurality of second source pads is orthogonal or parallel to the upper surface boundary line.

10. The semiconductor device according to claim 2, wherein in the plan view of the semiconductor layer:
when, among four sides of the semiconductor layer, a first side is defined as a side nearest the first gate pad and intersecting the upper surface boundary line, a second side is defined as a side nearest the first gate pad and not intersecting the upper surface boundary line, a third side is defined as a side nearest the second gate pad and intersecting the upper surface boundary line, a fourth side is defined as a side nearest the second gate pad and not intersecting the upper surface boundary line, a first vertex is defined as a vertex of the first side and the fourth side, a second vertex is defined as a vertex of the second side and the third side, a first intersection is defined as an intersection of the upper surface boundary line and the first side, and a second intersection is defined as an intersection of the upper surface boundary line and the third side; a distance between the first vertex and the first intersection is greater than or equal to 1/N of a length of a side of the semiconductor layer and greater than a maximum diameter of the second gate pad, and
a distance between the second vertex and the second intersection is greater than or equal to 1/N of the length of the side of the semiconductor layer and greater than a maximum diameter of the first gate pad, where N is an integer greater than or equal to three; and
the upper surface boundary line consists of alternately connected N-1 line segments parallel to the second side and N-2 line segments parallel to the first side.

11. The semiconductor device according to claim 10, wherein
N is three, four, or five.

12. The semiconductor device according to claim 10 or 11, wherein
the one or more first source pads comprise a plurality of first source pads,
in the plan view of the semiconductor layer, the one or more first source pads are each a rectangle or an oval whose lengthwise direction is parallel to the first side, and are arranged in a striped pattern parallel to the first side,
the one or more second source pads comprise a plurality of second source pads, and
in the plan view of the semiconductor layer, the one or more second source pads are each a rectangle or an oval whose lengthwise direction is parallel to the first side, and are arranged in a striped pattern parallel to the first side.

13. A semiconductor module comprising:
a first semiconductor device that is the semiconductor device according to claim 2; and
a mounting substrate on which the first semiconductor device is face-down mounted, wherein
the mounting substrate includes a first via that passes through a first conductor electrically connected to the first gate pad of the first semiconductor device, and a second via that passes through a second conductor electrically connected to the second gate pad of the first semiconductor device.

14. The semiconductor module according to claim 13, wherein
in a plan view of the mounting substrate:
in a state in which the first semiconductor device is face-down mounted on the mounting substrate, a center of the first via and a center of the second via are located on the first virtual straight line of the first semiconductor device.

15. The semiconductor module according to claim 13, wherein
in the plan view of the semiconductor layer, the first gate pad is arranged such that no part of any of the one or more first source pads is disposed between the first gate pad and a first side of the semiconductor layer or the first gate pad and a second side of the semiconductor layer, the first side and the second side being nearest neighboring sides among four sides of the semiconductor layer,
in the plan view of the semiconductor layer, the second gate pad is arranged such that no part of any of the one or more second source pads is disposed between the second gate pad and a third side of the semiconductor layer or the second gate pad and a fourth side of the semiconductor layer, the third side and the fourth side being nearest neighboring sides among the four sides of the semiconductor layer, and
in a plan view of the mounting substrate:
in a state in which the first semiconductor device is face-down mounted on the mounting substrate, a center of the first via is positioned at any of the following: (1) on the first virtual straight line; (2) outside the first semiconductor device beyond the second side in a direction in which the first side extends and between the first side and a center of the first gate pad, in a direction in which the second side extends; and (3) outside the first semiconductor device beyond the first side in the direction in which the second side extends and between the second side and the center of the first gate pad, in the direction in which the first side extends; and
in a state in which the first semiconductor device is face-down mounted on the mounting substrate, a center of the second via is positioned at any of the following: (1) on the first virtual straight line; (2) outside the first semiconductor device beyond the fourth side in a direction in which the third side extends and between the third side and a center of the second gate pad, in a direction in which the fourth side extends; and (3) outside the first semiconductor device beyond the third side in the direction in which the fourth side extends and between the fourth side and the center of the second gate pad, in the direction in which the third side extends.

16. The semiconductor module according to claim 15, wherein
   in the plan view of the semiconductor layer, an angle between the first virtual straight line and a second virtual straight line is greater than 45 degrees and less than or equal to 90 degrees, the second virtual straight line connecting a first intersection and a second intersection, the first intersection being an intersection of the upper surface boundary line and the first side or the second side, the second intersection being an intersection of the upper surface boundary line and the third side or the fourth side,
   in the plan view of the mounting substrate:
      the mounting substrate is elongated in a lengthwise direction and has a constant width at least at a location where the first semiconductor device is mounted, and includes first metal wiring and second metal wiring aligned in the lengthwise direction on a first surface of the mounting substrate, the first metal wiring bonding all of the one or more first source pads of the first semiconductor device, the second metal wiring bonding all of the one or more second source pads of the first semiconductor device; and
      the first semiconductor device is mounted on the first surface of the mounting substrate in an orientation in which an angle between the second virtual straight line and the lengthwise direction is greater than or equal to 15 degrees and less than or equal to 75 degrees.

17. The semiconductor module according to claim 16, further comprising:
   a second semiconductor device configured identically to the first semiconductor device, wherein
   in the plan view of the mounting substrate:
      the first semiconductor device is face-down mounted on the first surface in a first orientation in which the first gate pad of the first semiconductor device is positioned on a first extending direction side of the first semiconductor device, the first extending direction being parallel to the lengthwise direction, the first extending direction side being a side relative to a center of the first semiconductor device;
      the second semiconductor device is face-down mounted on the first surface in a position shifted from a position of the first semiconductor device parallel to and in a second extending direction parallel to the lengthwise direction, and in a second orientation in which the second virtual straight line of the first semiconductor device and the second virtual straight line of the second semiconductor device are parallel and the first gate pad of the second semiconductor device is positioned on the first extending direction side, the second extending direction being opposite the first extending direction;
      the mounting substrate further includes third metal wiring aligned in the second extending direction relative to the second metal wiring on the first surface, the third metal wiring bonding all of the one or more second source pads of the second semiconductor device; and
      the second metal wiring further bonds all of the one or more first source pads of the second semiconductor device.

18. The semiconductor module according to claim 16, further comprising:
   a second semiconductor device configured identically to the first semiconductor device, wherein
   in the plan view of the mounting substrate:
      the first semiconductor device is face-down mounted on the first surface in a first orientation in which the first gate pad of the first semiconductor device is positioned on a first extending direction side of the first semiconductor device, the first extending direction being parallel to the lengthwise direction, the first extending direction side being a side relative to a center of the first semiconductor device;
      the second semiconductor device is face-down mounted on the first surface in a position shifted from a position of the first semiconductor device parallel to a direction orthogonal to the lengthwise direction, and in a second orientation in which the second virtual straight line of the first semiconductor device and the second virtual straight line of the second semiconductor device are at a right angle and the first gate pad of the second semiconductor device is positioned on the first extending direction side;
      the first metal wiring further bonds all of the one or more first source pads of the second semiconductor device; the second metal wiring further bonds all of the one or more second source pads of the second semiconductor device; and
      the second gate pad of the second semiconductor device is electrically connected to the second conductor.

19. The semiconductor module according to claim 16, further comprising:
   a second semiconductor device configured identically to the first semiconductor device, wherein
   in the plan view of the mounting substrate:
      the first semiconductor device is face-down mounted on the first surface in a first orientation in which the first gate pad of the first semiconductor device is positioned on a first extending direction side of the first semiconductor device, the first extending direction being parallel to the lengthwise direction, the first extending direction side being a side relative to a center of the first semiconductor device;
      the second semiconductor device is face-down mounted on the first surface in a position shifted from a position of the first semiconductor device approximately parallel to a direction in which the second virtual straight line of the first semiconductor device extends, and in a second orientation in which the second virtual straight line of the first semiconductor device and the second virtual straight line of the second semiconductor device are coincident or parallel and the first gate pad of the second semiconductor device is positioned on the first extending direction side;
      the first metal wiring further bonds all of the one or more first source pads of the second semiconductor device; and
      the second metal wiring further bonds all of the one or more second source pads of the second semiconductor device.

20. The semiconductor module according to claim 16, further comprising:
   a second semiconductor device configured identically to the first semiconductor device, wherein
   in the plan view of the mounting substrate:
      the first semiconductor device is face-down mounted on the first surface in a first orientation in which the first gate pad of the first semiconductor device is positioned on a first extending direction side of the first semiconductor device, the first extending direction being parallel to the lengthwise direction, the first extending direction side being a side relative to a center of the first semiconductor device;

the second semiconductor device is face-down mounted on a second surface of the mounting substrate opposite the first surface in a second orientation in which in the plan view of the semiconductor substrate, the first gate pad of the second semiconductor device is positioned on the first extending direction side, at a position at which the first upper surface region of the first semiconductor device and the first upper surface region of the second semiconductor device overlap more than 50% and the second upper surface region of the first semiconductor device and the second upper surface region of the second semiconductor device overlap more than 50%;

the first gate pad of the second semiconductor device is electrically connected to the first conductor; and the second gate pad of the second semiconductor device is electrically connected to the second conductor.

21. The semiconductor module according to claim 15, wherein in the plan view of the semiconductor layer, an angle between the first virtual straight line and a second virtual straight line is greater than or equal to 0 degrees and less than 45 degrees, the second virtual straight line connecting a first intersection and a second intersection, the first intersection being an intersection of the upper surface boundary line and the first side or the second side, the second intersection being an intersection of the upper surface boundary line and the third side or the fourth side, and in the plan view of the mounting substrate:
the mounting substrate is elongated in a lengthwise direction and has a constant width at least at a location where the first semiconductor device is mounted, and includes first metal wiring and second metal wiring aligned in the lengthwise direction on a first surface of the mounting substrate, the first metal wiring bonding all of the one or more first source pads of the first semiconductor device, the second metal wiring bonding all of the one or more second source pads of the first semiconductor device; and the first semiconductor device is face-down mounted on the mounting substrate in an orientation in which an angle between each side of the first semiconductor device and the lengthwise direction is 45 degrees.

22. The semiconductor module according to claim 21, further comprising:

a second semiconductor device configured identically to the first semiconductor device, wherein in the plan view of the mounting substrate:
the first semiconductor device is face-down mounted on the first surface in a first orientation in which the first gate pad of the first semiconductor device is positioned on a first extending direction side of the first semiconductor device, the first extending direction being parallel to the lengthwise direction, the first extending direction side being a side relative to a center of the first semiconductor device;

the second semiconductor device is face-down mounted on the first surface in a position shifted from a position of the first semiconductor device parallel to a direction orthogonal to the lengthwise direction, and in a second orientation in which the second virtual straight line of the first semiconductor device and the second virtual straight line of the second semiconductor device are parallel;

the first metal wiring further bonds all of the one or more first source pads of the second semiconductor device;

the second metal wiring further bonds all of the one or more second source pads of the second semiconductor device;

the mounting substrate further includes a third via that passes through a third conductor electrically connected to the first gate pad of the second semiconductor device, and a fourth via that passes through a fourth conductor electrically connected to the second gate pad of the second semiconductor device; and the first via, the second via, the third via, and the fourth via are positioned between the first metal wiring and the second metal wiring in the lengthwise direction of the mounting substrate.

\* \* \* \* \*